US008809696B2

(12) United States Patent
Yamashita et al.

(10) Patent No.: US 8,809,696 B2
(45) Date of Patent: Aug. 19, 2014

(54) METHOD FOR SURFACE TREATMENT OF COPPER AND COPPER

(75) Inventors: Tomoaki Yamashita, Oyama (JP); Sumiko Nakajima, Ibaraki (JP); Sadao Itou, Yuuki (JP); Fumio Inoue, Tsukuba (JP); Shigeharu Arike, Tochigi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 463 days.

(21) Appl. No.: 13/060,095

(22) PCT Filed: Jun. 17, 2009

(86) PCT No.: PCT/JP2009/061050
§ 371 (c)(1),
(2), (4) Date: Feb. 22, 2011

(87) PCT Pub. No.: WO2010/050266
PCT Pub. Date: May 6, 2010

(65) Prior Publication Data
US 2011/0147072 A1    Jun. 23, 2011

(30) Foreign Application Priority Data
Oct. 27, 2008   (JP) .............................. P2008-275493

(51) Int. Cl.
*H05K 1/00*    (2006.01)
(52) U.S. Cl.
USPC .............. 174/268; 29/527.2; 51/307; 156/81; 156/281; 204/192.15; 204/486; 216/13; 228/122.1; 257/690; 257/762; 428/209; 428/607; 428/655; 438/754; 438/775

(58) Field of Classification Search
USPC .............. 174/268; 29/527.2; 51/307; 52/293; 156/81, 281; 204/192.15, 486; 216/13; 228/122.1; 257/690, 762; 428/209, 428/607, 655; 438/754, 775
See application file for complete search history.

(56) References Cited

U.S. PATENT DOCUMENTS 3,372,468 A * 3/1968 Pryor et al. ................... 29/527.2
3,994,430 A * 11/1976 Cusano et al. ............. 228/122.1
(Continued)

FOREIGN PATENT DOCUMENTS

| CN | 101137768 A | 3/2008 |
|---|---|---|
| JP | 02-230794 | 9/1990 |

(Continued)

OTHER PUBLICATIONS

Chinese office action of Appln. No. 200980132110.0 dated Jan. 24, 2013 with English translation.
(Continued)

*Primary Examiner* — Xiaoling Chen
(74) *Attorney, Agent, or Firm* — Antonelli, Terry, Stout & Kraus, LLP.

(57) ABSTRACT

An object of the present invention is to provide a copper surface treatment method capable of keeping certainly a bonding strength between a copper surface and a resist, or between a copper surface and an insulating resin without forming irregularities having sizes of more than 1 μm on the copper surface, and a copper treated with the method. The surface treatment method, comprising: a first step of forming, on a copper surface, a nobler metal than the copper discretely; a second step, subsequent to the first step, of forming copper oxide on the copper surface by oxidation with an alkaline solution containing an oxidizing agent; and third step of dissolving the copper oxide so as to be removed, thereby forming irregularities on the copper surface.

20 Claims, 12 Drawing Sheets

(56) References Cited

U.S. PATENT DOCUMENTS

| | | | |
|---|---|---|---|
| 5,128,008 A * | 7/1992 | Chen et al. | 204/192.15 |
| 5,288,377 A * | 2/1994 | Johnson et al. | 204/486 |
| 5,382,333 A * | 1/1995 | Ando et al. | 156/81 |
| 5,472,563 A * | 12/1995 | Kogawa et al. | 216/13 |
| 5,827,604 A * | 10/1998 | Uno et al. | 428/209 |
| 5,861,076 A * | 1/1999 | Adlam et al. | 156/281 |
| 6,664,197 B2 * | 12/2003 | Stevens et al. | 438/754 |
| 6,713,407 B1 * | 3/2004 | Cheng et al. | 438/775 |
| 6,821,309 B2 * | 11/2004 | Singh et al. | 51/307 |
| 7,078,796 B2 * | 7/2006 | Dunn et al. | 257/690 |
| 7,588,835 B2 * | 9/2009 | Yamashita et al. | 428/607 |
| 2003/0159362 A1 * | 8/2003 | Singh et al. | 51/293 |
| 2005/0001324 A1 * | 1/2005 | Dunn et al. | 257/762 |
| 2008/0096046 A1 * | 4/2008 | Yamashita et al. | 428/655 |

FOREIGN PATENT DOCUMENTS

| | | |
|---|---|---|
| JP | 02-238942 | 9/1990 |
| JP | 07-038254 | 2/1995 |
| JP | 7-37113 | 4/1995 |
| JP | 09-246720 | 9/1997 |
| JP | 2656622 | 9/1997 |
| JP | 2000-282265 | 10/2000 |
| JP | 2006-249519 | 9/2006 |
| JP | 2008-088541 | 4/2008 |
| JP | 2008-248269 | 10/2008 |
| KR | 10-2007-0111549 | 11/2007 |
| TW | 200702494 A | 1/2007 |

OTHER PUBLICATIONS

Korean office action of Appln. No. 10-2011-7003412 dated Sep. 4, 2012 with English language translation.

Notice of Office Action of Taiwan Application No. 098120656 dated Aug. 8, 2012 with English translation.

Chinese office action of Appln. No. 200980132110.0 dated Mar. 21, 2012 with English translation.

Translation of the International Preliminary Report dated Jun. 16, 2011 in English.

JP Office Action of Appln. No. 2010-535702 dated Jul. 2, 2013 with partial English translation.

Taiwanese Official Action of Appln. No. 098120656 dated May 8, 2013 with English translation.

* cited by examiner (a1)

(a2)

(b1)

(b2) 201

(c1)

(c2) 202

(a1) (a2)

203

(b1) (b2)

204

(c1) (c2)

205

(a1)

(a2)

203

(b1)

(b2)

204

(c1)

(c2)

206

106

106

METHOD FOR SURFACE TREATMENT OF COPPER AND COPPER

TECHNICAL FIELD

The present invention relates to a method for treating a surface of copper, that is a copper surface treatment method; and copper subjected to surface treatment by the copper surface treatment method.

BACKGROUND ART

The development of information-oriented society in recent years has been dramatic, and in the field of information processing instruments, an improvement in functions of the instruments has been desired whether the instruments are large or small in size. In the field of, for example, household instruments, with regard to personal computers, portable telephones and other instruments, the size and the weight thereof are being made smaller and the performance and the function thereof are being made higher. In the field of industrial equipment, with regard to wireless base stations, optical communication devices, network-related instruments such as servers and routers, and others, the same as described above are being investigated. Moreover, with an increase in the quantity of transmitting-information, there manifests a tendency that the frequency of signals handled in information processing instruments is being made higher year by year; thus, high-speed processing and high-speed transmitting techniques are also being developed. For example, with regard to packaging- or mounting-related technique, LSIs such as CPUs, DSPs and various memories have been made higher in processing-speed and function, and further as new high-density mounting techniques, system-on-chips (SoC), system-in-packages (SiP), and others have been actively developed. In such a situation, semiconductor chip mounting boards or mother boards also need to correspond to the rise or improvement in the frequency, the wiring density and the function. In recent years, as a typical matter which constitutes each of these boards, use has been made of multi-level (or multilayered) wiring boards of a build-up type which are formed to have fine wiring (i.e., fine interconnections) wherein the line/space width (L/S) is "15 µm/15 µm", or less.

The formation of fine wiring on a substrate is usually attained with the subtractive process or the semi-additive process. In an ordinary wiring-forming step based on the subtractive process, an etching resist is first formed on a copper surface, and then the workpiece is exposed to light and developed to form a resist pattern. Next, unnecessary portions of copper are etched, and the resist is peeled to form a wiring. Meantime, in an ordinary wiring-forming step based on the semi-additive process, a plating resist is first formed on a copper (seed layer) surface, and then the workpiece is exposed to light and developed to form a resist pattern. Next, the workpiece is subjected to electroplating, resist-peeling and etching treatments to form a wiring. Whether any one of the processes is used, a solder resist or coverlay can be optionally formed on the wiring after the formation of the wiring in order to protect the wiring on regions other than regions of terminals such as external connection terminals and semiconductor chip connection terminals.

In order to use any one of the processes to make a fine wiring formation ratio corresponding to a design value of the L/S width, it is necessary to form a resist pattern as designed. However, in the formation of fine wiring wherein the L/S="15 µm/15 µm", or less, it is difficult that the precision of the resist pattern is made high since the precision is affected by the following matter: when the workpiece is exposed to light, halation is caused on its glossy copper surface by light reflection. Moreover, the adhesive force between the copper surface and the resist pattern is low so that the resist pattern is easily peeled when a wiring is formed. Furthermore, a sufficient bonding property (adhesiveness) tends not to be gained between the wiring (copper) and the solder resist or between the wiring and the coverlay. In order to solve these problems, it is important to remove the glossiness of the copper surface and heighten the adhesive force between the copper surface and the resist.

Apart from the above, a multi-level wiring board of a build-up type is produced by repeating an interlayer-dielectric-forming step and a wiring-forming step mutually. When this producing method is used, it is important to certainly keep the bonding strength between the wiring and the insulating resin, the insulation reliability between the wiring pieces, and the wiring precision. In order to improve such various properties, investigations have been hitherto made about several methods related to copper surface treatment.

A first thereof is related to a method of giving a form of roughening-irregularities in the order of micrometers to copper surface to remove the glossiness of copper surface, and further yielding a bonding force between the copper surface and a resist or between the copper surface and an insulating resin besides the resist by anchor effect. As an example thereof, Patent document 1 discloses a method of giving a form of roughening-irregularities in the order of micrometers to a copper surface by use of an aqueous solution containing a main agent composed of an inorganic acid and a copper oxidizing agent, and an auxiliary composed of at least one azole and at least one etching restrainer. As another example thereof, Patent document 2 discloses a method of forming continuous irregularities having heights of 1.5 to 5.0 µm by micro etching, and then subjecting the workpiece to chromate treatment and coupling agent treatment.

A second of the methods is related to a method of forming fine irregularities made of needle crystals of copper oxide onto the copper surface, subjecting the workpiece to reducing treatment to yield fine metallic copper needle crystals, next removing the glossiness of the copper surface, and further yielding bonding force between the copper surface and a resist or between the copper surface and an insulating resin by anchor effect. As an example thereof, Patent document 3 discloses a method of using an aqueous alkaline solution containing an oxidizing agent such as sodium chlorite, immersing metallic copper into the aqueous solution at about 80° C. to give fine needle crystals of copper oxide onto the surface, and subsequently using an acidic solution wherein at least one amine borane is mixed with a boron-based agent to subject the workpiece to reducing treatment, thereby yielding fine needle crystals of metallic copper.

A third thereof is related to a method of forming a nobler metal than copper discretely onto the copper surface, oxidizing the copper to form irregularities made of needle crystals of copper oxide, and then subjecting the workpiece to reducing treatment to give, thereto, nano-level irregularities made of metallic copper needle crystals, and further yielding bonding force between the copper surface and an insulating resin by anchor effect. Such a method is disclosed in Patent document 4.

PRIOR ART DOCUMENTS

Patent Documents

Patent document 1: JP-A No. 2000-282265
Patent document 2: JP-A No. Hei9-246720
Patent document 3: Japanese Patent No. 2656622
Patent document 4: JP-A No. 2006-249519

SUMMARY OF THE INVENTION

According to the first method, by forming irregularities having Rz (ten-point average roughness) of 1.5 to 5 μm in a copper surface, an improvement in the bonding strength based on anchor effect is recognized. However, in a case where in the formation of fine wiring, the L/S is narrow and the irregularities in the copper interface adhering closely to the resist are in the form of roughening-irregularities having sizes of more than 1 μm, it is difficult that the resist is completely removed from the copper surface when the workpiece is developed. Therefore, when the workpiece is subsequently subjected to etching treatment, a short circuit tends to be easily generated between the copper wiring pieces. Also when the resist is peeled, it is difficult in the same manner that the resist is completely removed from the copper surface. This matter gives a tendency that a subsequent sufficient adhesiveness is not obtained between the copper surface and an insulating resin or between the copper surface and a solder resist. Additionally, when external connection terminals and others are subjected to plating treatment with gold, there is shown a tendency that no plating is deposited or unevenness is generated in the plating.

In the formation of fine wiring by the semi-additive process, the film thickness of a copper seed layer is small, in particular, the film thickness of a copper seed layer formed by sputtering is from 0.1 to 1.0 μm; it is therefore difficult to form irregularities in such a copper surface. Furthermore, according to the first method, irregularities in a wiring surface have a roughening form of irregularities having sizes of more than 1 μm; thus, when a high-speed electrical signal is sent to the wiring, the electrical signal flows so as to be concentrated in the vicinity of the wiring surface by skin effect, so that transmission loss tends to become large. Furthermore, in the case of a wiring wherein the L/S="15 μm/15 μm", or less, the maintenance of the precision of the wiring tends to become difficult.

Similarly to the first method, the second method is a technique of forming irregularities having a surface roughness Rz of 0.1 to 1.5 μm in a wiring surface to keep a sure bonding strength by anchor effect. However, when the irregularities on the copper surface, which adhere closely to a resist in the formation of fine wiring, turn into a needle form, various problems as described in the following are caused in the same manner as in the first method: a short circuit is easily generated between the wiring pieces by remnants of the resist; close adhesiveness is not easily obtained between the copper surface and an insulating resin, or between the copper surface and a solder resist; and gold plating is not deposited or gold plating unevenness is easily generated. In the formation of fine wiring by the semi-additive process, irregularities can be formed on a copper seed layer formed by sputtering or the like. In the same manner as described above, however, various problems as described in the following exist: it is difficult to remove, from the copper surface, a resist thereon completely; the formation of the wiring onto the seed layer becomes difficult; a short circuit is generated between the wiring pieces; close adhesiveness is not obtained between the copper surface and an insulating resin or between the copper surface and a solder resist; and gold plating is not deposited, or gold plating unevenness is generated.

According to the second method, the heights of the irregularities formed in the surface are largely dispersed. When the Rz thereof is less than 0.5 μm, the bonding reliability onto an insulating resin at high temperature and high humidity tends to fall. On the other hand, when the Rz is more than 1.0 transmission loss tends to become large in the same manner as in the first method. Additionally, the needle crystals that form the irregularities are entangled with each other in a complicated form, so that a resin is not easily embedded into the irregularities of the needle crystals in accordance with the viscosity property of the resin or some other physical property of the resin. As a result, the bonding reliability at high temperature and high humidity tends to decline. Furthermore, needle crystals of metallic copper which have Rz of 0.1 μm or more break easily, so that the crystals cannot be subjected to any processing or treatment on a horizontal line. Thus, the method is poor in operability about thin-plate processing.

Furthermore, according to the second method, in the processing thereof, the high-temperature alkaline solution is used so that the insulating resin surface is easily invaded. Thus, the insulation reliability is easily deteriorated by ion pollution or insulation degradation. Additionally, at the time of water washing after the oxidizing treatment, the complicated irregularities based on the needle crystals of copper oxide make the water washing insufficient between irregularities of the needle crystals, so that the insulation reliability is easily deteriorated by ions remaining between the irregularities. Moreover, the needle crystals of metallic copper are again oxidized by effect of a period when the crystals are allowed to stand still after the reducing treatment. Thus, in a plating step for the connection of through holes, the copper oxide is dissolved, whereby a ring in pink color (pink ring) is easily generated around each of the through holes. The generation of the pink ring undesirably causes a fall in the insulation reliability at regions where the insulation distance between the wiring pieces is short, a peel between the copper surface and the insulating resin, or other inconveniences.

In order to solve the problems of the first and second methods, the inventors suggested a third method of forming a nobler metal than copper discretely onto the copper surface, and then subjecting the workpiece to oxidizing treatment with an alkaline solution containing an oxidizing agent to form copper oxide, thereby forming, in the surface, fine irregularities having Rz of 0.001 to 1 μm to improve the bonding strength between the copper surface and an insulating resin thereon. In this method, for the prevention of dissolution of needle crystals of the copper oxide through a plating step for the connection of through holes, it is preferred that reducing treatment using an alkaline solution containing a reducing agent is further conducted after the oxidizing treatment. However, in the same manner as in the second method, by effect of conditions for allowing the workpiece to stand still after the reducing treatment, the needle crystals of metallic copper are again oxidized so that pink rings are easily generated. Moreover, the needle crystals partially overlap with each other since the irregularities are made of the needle crystals. Thus, in accordance with the viscosity property of a resin, or some other physical property thereof, the resin tends not to be easily embedded into the irregularities made of the needle crystals. For this reason, the bonding reliability declines easily at high temperature and high humidity although this tendency is not larger than in the second method. Thus, an improvement has been desired.

Accordingly, the invention has been made to overcome the problems recognized in the methods in the prior art. An object thereof is to provide a copper surface treatment method capable of keeping certainly a bonding strength between a copper surface and a resist, or between a copper surface and an insulating resin without forming irregularities having sizes of more than 1 μm on the copper surface, so as to improve various reliabilities; and copper and a wiring board that are each subjected to this surface treatment method so as to be excellent in various reliabilities.

In order to attain the object, the invention has, as characteristics thereof, matters described in the following:

A first aspect of the invention is related to a copper surface treatment method, and is characterized by including a first step of forming, on a copper surface, a nobler metal than the copper discretely, a second step, subsequent to the first step, of forming copper oxide on the copper surface by oxidation with an alkaline solution containing an oxidizing agent, and a next third step of dissolving the copper oxide so as to be removed, thereby forming irregularities on the copper surface.

It is preferred that the surface treatment method includes a fourth step of subjecting the copper surface to a treatment for improving the bonding strength thereof after the third step and the fourth step includes at least one treatment selected from the group consisting of treatment for forming a baser metal than copper onto the copper surface, treatment with a solution containing an azole compound, and treatment with a coupling agent. The fourth step more preferably includes both of the treatment for forming a baser metal than copper onto the copper surface, and the treatment with azole-compound-containing-solution. Also, the fourth step preferably includes a heating treatment for performing heating to a temperature of 90° C. or higher after the treatment for forming the baser metal than copper onto the copper surface.

In the surface treatment method, the oxidizing agent is preferably one or more selected from the group consisting of chlorates, chlorites, hypochlorites, perchlorates, peroxodisulfates and permanganates.

The nobler metal than copper is preferably a metal selected from the group consisting of gold, silver, platinum, palladium, rhodium, rhenium, ruthenium, osmium and iridium, and alloys each containing one or more of these metals. The formation amount of the nobler metal than copper is preferably 0.001 $\mu mol/dm^2$ or more, and 5 $\mu mol/dm^2$ or less.

It is preferred that the dissolution of the copper oxide in the third step is attained by use of an acidic solution containing one or more selected from the group consisting of inorganic acids and organic acids. The roughness Rz of the copper surface after the third step is preferably 1 nm or more and 1000 nm or less.

Another aspect of the invention is related to copper having a surface treated with the above-mentioned surface treatment method. Still another aspect of the invention is related to a wiring board having a copper wiring wherein a surface of the copper wiring is treated with the above-mentioned surface treatment method.

According to the invention, it is possible to provide a copper surface treatment method in which bonding strength can be certainly kept between a copper surface and a resist or between a copper surface and an insulting resin without forming irregularities having sizes of more than 1000 nm on the copper surface, and further various reliabilities can be improved. A copper treated by the surface treatment method according to the invention can be preferably used as a wiring member for various wiring boards, for example, mother boards such as a multi-level printed wiring board and a build-up printed wiring board, and semiconductor chip mounting substrates or boards such as a rigid substrate and a build-up substrate.

The present application is an application claiming a priority based on Japanese Patent Application No. 2008-275493 filed on Oct. 27, 2008 by the same Applicant, and with reference to the specification thereof, the content thereof is incorporated into the present specification as a part thereof.

BRIEF DESCRIPTION OF THE DRAWINGS

FIGS. 9(a) to (g) are schematic sectional views corresponding to respective steps thereof.

BEST MODES FOR CARRYING OUT THE INVENTION

Figure 1:
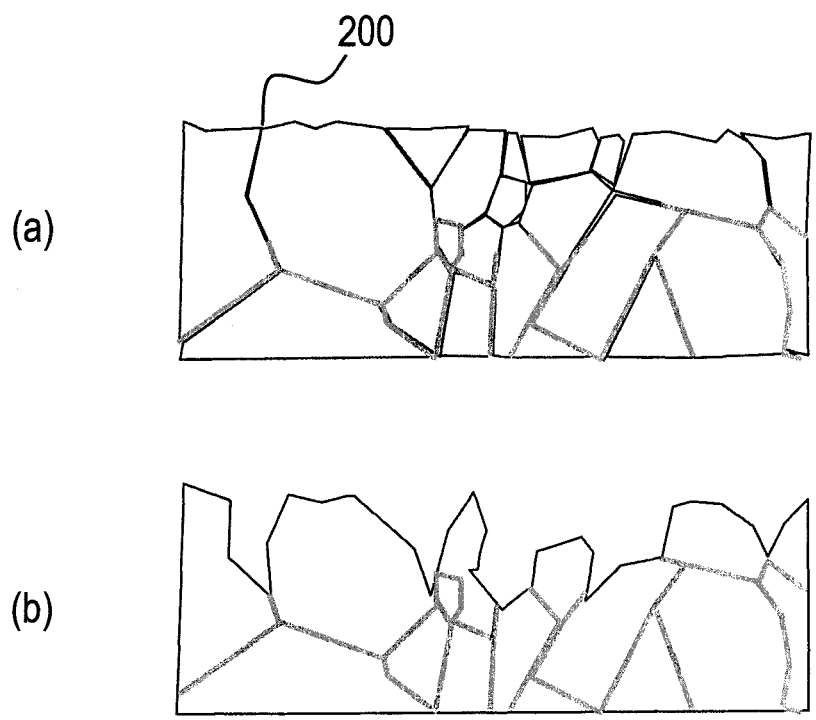
FIG. 1 is a view referred to describe a first method related to conventional surface treatment technique, and FIGS. 1(a) and (b) are schematic sectional views illustrating copper surface states in respective steps thereof.

Hereinafter, the invention will be more specifically described.

The first aspect of the invention is related to a copper surface treatment method. In the following description, with regard to the copper surface treatment method according to the invention, a case where the invention is applied to treatment of a copper wiring surface in a semiconductor chip mounting board is given as an example. However, the following description is only an embodiment of the invention; thus, the invention may be used as a copper surface treatment method used for a multi-level printed wiring board, and mother boards such as a build-up printed wiring board.

The copper surface treatment method according to the invention is characterized by including a first step of forming, on a copper surface, a nobler metal than the copper discretely, a subsequent second step of forming copper oxide on the copper surface by oxidation with an alkaline solution containing an oxidizing agent, and a next third step of dissolving the copper oxide so as to be removed, thereby forming irregularities on the copper surface. According to the treatment method of the invention, by carrying out the first step of forming, on a copper surface, the nobler metal discretely, and the subsequent second step of subjecting the copper surface to oxidizing treatment with an alkaline solution containing an oxidizing agent, fine irregularities made of dense and even needle crystals of copper oxide can be formed on the copper surface. Through the third step of treating the workpiece with an acidic solution or a solution containing a copper complexing agent after the oxidizing treatment, the needle crystals of the copper oxide are selectively removed so that fine irregularities of metallic copper, which are not in a needle form, can be formed.

The surface roughness Rz of the copper yielded after the third step in the invention is preferably 1 nm or more and 1,000 nm or less. The Rz is more preferably 1 nm or more and 300 nm or less, more preferably 1 nm or more and 100 nm or less, even more preferably 1 nm or more and 50 nm or less. If the Rz is less than 1 nm, the bonding force onto an insulating resin and others tends to decrease. By contrast, if the Rz is more than 1,000 nm, a problem that transmission loss becomes large tends to be easily caused, and further in the case of the application of the present treatment method to fine wiring, a problem that the precision of the wiring after the treatment is largely deviated tends to be caused. The Rz can be measured by use of a contact type surface roughness meter, an atomic force microscope (AFM), or some other.

The wording "dense and even" used in the present specification means the following: when the form of a copper surface is observed with a scanning electron microscope (SEM) or when a copper surface is worked by means of a focused ion beam processing and observing machine (FIB) and then a cross section thereof is observed with a scanning ion microscope (SIM), irregularities made of crystals positioned on the metallic copper surface are close to each other so as to be in the state that a scattering in the heights of the irregularities is small. Irregularities formed by the surface treatment method according to the invention are useful in that the form thereof is denser and evener as compared with that of irregularities obtained by conventional surface treatment methods. With reference to some of the drawings, this matter will be described in detail hereinafter while the present method is compared with the conventional methods.

First, a description is made about the conventional methods for subjecting a copper surface to oxidizing treatment. In a first method thereof, oxidizing treatment is conducted with an acidic solution containing an oxidizing agent. In this method, copper oxide (CuO) is generated with the oxidizing agent and simultaneously the copper is dissolved (etched) by acid as shown in the following formula (1):

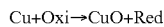

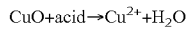 (formula 1)

FIG. 1 is a views referred to describe the first method, and FIGS. 1(a) and 1(b) are schematic sectional views illustrating copper surface states in respective steps thereof. As illustrated in FIG. 1(a), boundary regions 200 of copper are etched more promptly than the other regions, so that unique irregularities as illustrated in FIG. 1(b) are formed. Accordingly, as the reaction represented by the formula (1) advances, etching of the copper also advances so that the form of the irregularities becomes large. A problem of this method is that when fine wiring is formed thereby, it is difficult to make the bonding onto an insulating resin and the maintenance of the precision of the wiring compatible with each other.

In a second method thereof, an alkaline solution containing an oxidizing agent is used to conduct oxidizing treatment. In this method, CuO is generated by the oxidizing agent as shown in the following formula (2):

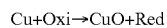

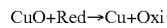 (formula 2)

Figure 2:
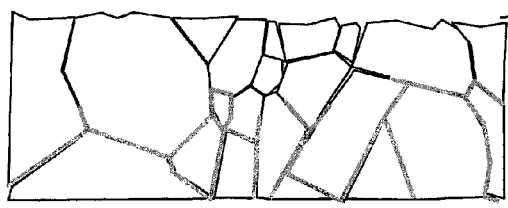
FIG. 2 is a view referred to describe a second method related to conventional surface treatment technique, and FIGS. 2(a1) to (c1) are schematic sectional views showing respective steps thereof and FIGS. 2(a2) to (c2) are partially enlarged views which schematically show copper surface states in the respective steps.
Figure 2:
Figure 2:
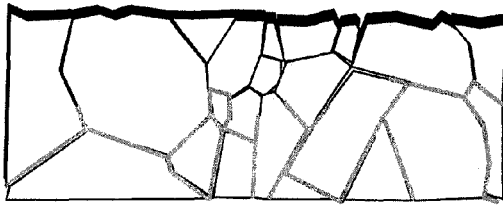
Figure 2:
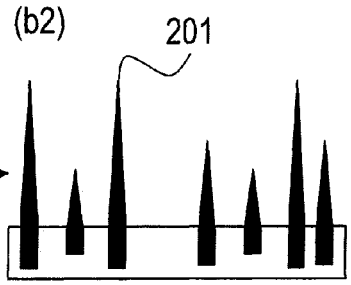
Figure 2:
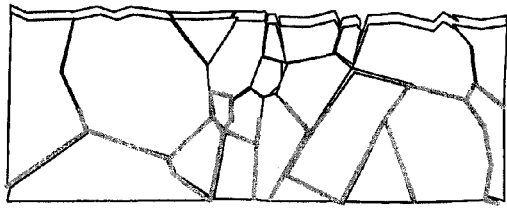
Figure 2:
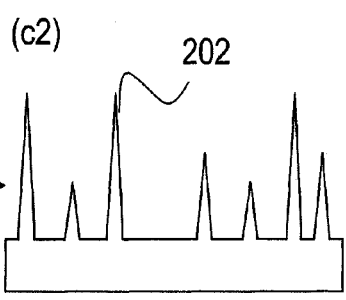

In the second method, the treatment using the alkaline solution is conducted, which is different from the manner in the first method. Thus, from the viewpoint of potential-pH relationship, the system turns into a substantially stable state of CuO. FIG. 2 is concerned with the second method. FIGS. 2(a1) to (c1) are schematic sectional views showing respective steps thereof, and FIGS. 2(a2) to (c2) are partially enlarged views which schematically show copper surface states in the respective steps. As illustrated in FIG. 2(b2), in the method, irregularities 201 made of needle crystals of CuO are first formed. Thereafter, when reducing treatment is conducted, irregularities 202 made of needle crystals of metallic copper are formed as illustrated in FIG. 2(c2).

In the oxidizing treatment according to the formula (2), reaction therefor advances until the whole of the copper surface is covered with CuO. Thus, as the copper surface is covered with CuO in a shorter time, that is, the oxidizing reaction rate becomes larger, the needle crystals of CuO are made into evener and finer irregularities. Contrarily, as the oxidizing reaction rate becomes smaller, partially long needle crystals which are less even are formed so that uneven irregularities are formed. Usually, in the second method, the oxidizing reaction rate is small; thus, as illustrated in FIGS. 2(b2) and (c2), irregularities 201 and 201 of uneven and partially long needle crystals are formed. Therefore, problems of this method are that a scattering in the heights of the irregularities is large, and further the needle crystals are entangled with each other in a complicated form so that a resin is not easily embedded therein in accordance with the viscosity of the resin or some other property thereof.

Against this second method, a third method has the step of forming a nobler metal than copper discretely on the copper surface before oxidizing treatment, thereby making the oxidizing reaction rate high. When metals different from each other in standard electrode potential are brought into electrical contact with each other as in this method, more specifically, when a nobler metal than copper is discretely formed on the copper surface, a metal that is more easily oxidized (Copper: Cu), out of the metals, takes charge of an anode, and a metal that is not easily oxidized (the nobler metal) takes charge of a cathode. By this matter, the reaction rate in the subsequently performed oxidizing treatment is increased so that the rate of the oxidization is made larger than in the case of treating copper alone.

Figure 3:
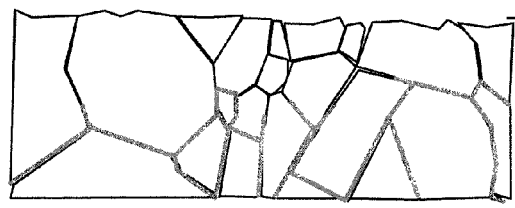
FIG. 3 is a view referred to describe a third method related to conventional surface treatment technique, and FIGS. 3(a1) to (c1) are schematic sectional views showing respective steps thereof, and FIGS. 3(a2) to (c2) are partially enlarged views which schematically show copper surface states in the respective steps.
Figure 3:
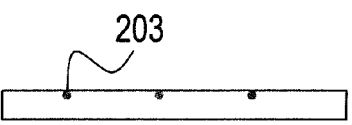
Figure 3:
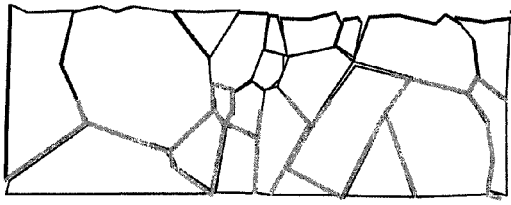
Figure 3:
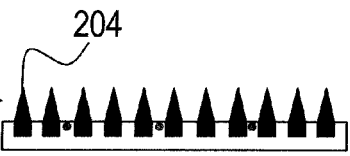
Figure 3:
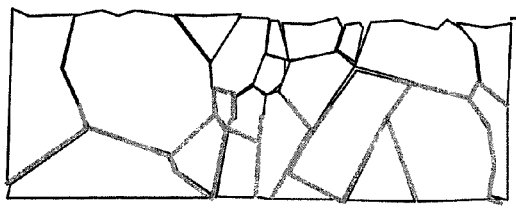
Figure 3:
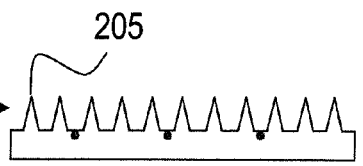

FIG. 3 is concerned with the third method. FIGS. 3(a1) to (c1) are schematic sectional views showing respective steps thereof, and FIGS. 3(a2) to (c2) are partially enlarged views which schematically show copper surface states in the respective steps. When copper is independently subjected to oxidizing treatment, irregularities made of uneven and partially long needle crystals of CuO are formed as illustrated in FIG. 2(b2). By contrast, when a noble metal 203 is discretely formed on a copper surface and subsequently the workpiece is subjected to oxidizing treatment as illustrated in FIG. 3(a1), even and fine irregularities 204 of needle crystals of CuO are formed as illustrated in FIG. 3(b2). Subsequently, when the needle crystals of CuO are subjected to reducing treatment, irregularities 205 of fine needle crystals of metallic copper are formed as illustrated in FIG. 3(c2). However, the irregularities obtained by this method are made of the needle crystals; therefore, the crystals overlap partially with each other so as to result in a problem that a resin is not easily embedded into the irregularities made of the needle crystals in accordance with the viscosity or some other property of the resin although this tendency is not larger than in the second method.

Figure 4:
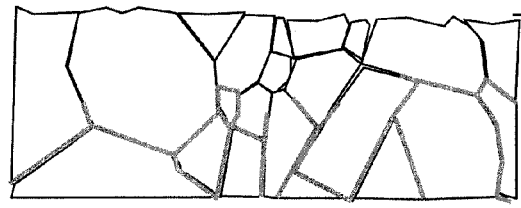
FIG. 4 is a view referred to describe the surface treatment method according to the invention, and FIGS. 4(a1) to (c1) are schematic sectional views showing respective steps thereof, and FIGS. 4(a2) to (c2) are partially enlarged views which schematically show copper surface states in the respective steps.
Figure 4:
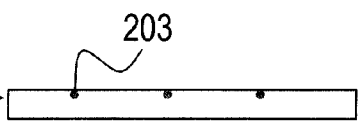
Figure 4:
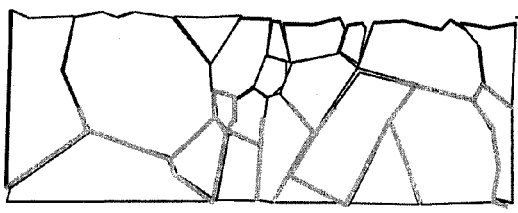
Figure 4:
Figure 4:
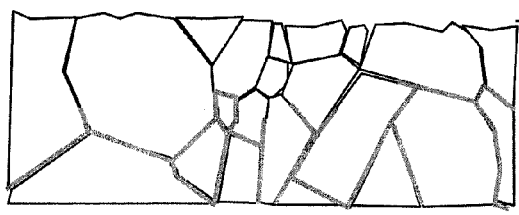
Figure 4:

Against these conventional methods, the invention is characterized by performing the following steps continuously: the step of forming a nobler metal discretely on the copper surface before oxidizing treatment, a subsequent step of using an alkaline solution containing an oxidizing agent to conduct the oxidizing treatment, and a next step of subjecting the workpiece to a treatment with an acidic solution or a solution containing a copper complexing agent. FIG. 4 is concerned with a surface treatment method according to the invention. FIGS. 4(a1) to (c1) are schematic sectional views showing respective steps thereof, and FIGS. 4(a2) to (c2) are partially enlarged views which schematically show copper surface states in the respective steps. According to the treatment method of the invention, in the same manner as in the third method, a noble metal 203 is first formed discretely onto a copper surface as illustrated in FIG. 4(a2). Next, the copper surface is subjected to oxidizing treatment to form even and fine irregularities 204 of needle crystals of CuO as illustrated in FIG. 4(b2). Thereafter, the workpiece is treated with an acidic solution or a solution containing a copper complexing agent to dissolve CuO selectively. In this way, even and fine irregularities 206 of metallic copper which are not in the form of needles are formed as shown in FIG. 4(c2).

With regard to the surface treatment method according to the invention, the following describes the steps thereof independently of each other in more detail. In the invention, it is preferred to conduct, before processing according to each of the steps, degreasing treatment for cleaning and clarifying a copper surface, acid washing treatment therefor, or a pretreatment wherein these are appropriately combined with each other.

(First Step)

The first step in the invention is related to a step of forming a nobler metal than copper discretely. The method for forming the nobler-than-copper metal discretely onto the copper surface is not particularly limited, and may be any method as far as the method makes it possible that without covering a copper surface which is to be an underlayer completely, the nobler metal is given onto the copper surface in the state that the nobler metal is evenly dispersed. Examples thereof include electroless plating, electroplating, displacement plating, spraying, painting, sputtering and vapor deposition. Of these examples, displacement plating is more preferred. Displacement plating is a method using a difference in ionization tendency between copper and the nobler metal than copper. When this method is used, the nobler metal than copper can be formed discretely onto the copper surface easily and inexpensively.

The nobler metal than copper is meant to be a metal having a higher potential than that of copper. The nobler metal is not particularly limited, and may be a metal selected from gold, silver, platinum, palladium, rhodium, rhenium, ruthenium, osmium and iridium, or any alloy containing one or more of these metals.

The formation amount of the nobler than metal copper formed discretely on the copper surface is not particularly limited. In an embodiment, however, the formation amount is preferably 0.001 µmol/dm$^2$ or more, and 40 µmol/dm$^2$ or less since the amount makes it possible to yield a desired form of dense, fine and even irregularities easily and keep a sufficient bonding strength onto an insulating resin certainly. The formation amount is more preferably 0.01 µmol/dm$^2$ or more and 10 µmol/dm$^2$ or less, even more preferably 0.1 µmol/dm$^2$ or more and 4 µmol/dm$^2$ or less. The amount of the nobler metal than copper formed actually on the copper surface can be obtained by dissolving the nobler metal on the copper surface with aqua regia, and then analyzing the solution quantitatively with an atomic absorption spectrophotometer. However, the term "discretely" described in the specification denotes a state that the nobler metal is dispersed on copper surface without covering the copper surface completely with the nobler metal, and it means not to be restricted by any specific amount of the formation.

(Second Step)

The second step in the invention is related to oxidizing treatment of the copper surface. After the nobler metal is discretely formed on the copper surface as described above, the copper surface is subjected to oxidizing treatment with an alkaline solution containing an oxidizing agent in the invention. The oxidizing-agent-containing alkaline solution is not particularly limited. The solution is preferably, for example, an alkaline solution obtained by adding, to an alkaline solution containing an alkali metal or an alkaline earth metal, an oxidizing agent such as a chlorate, a chlorite, a hypochlorite, a perchlorate, a peroxodisulfate or a permanganate. The workpiece may be subjected to desmear treatment.

The desmear treatment is conducted generally in order to remove smears generated in the step of making holes in the substrate, and attain resin-roughening for improving the adhesive strength between the copper and any resin (adjacent thereto). In a specific process thereof, the following steps are in turn conducted: a swelling step, as a pre-treatment, for making the capability of smear-removal high; a next permanganic acid step of etching the resin with an alkaline solution containing a permanganate; and a neutralizing treatment step of reducing and removing permanganic acid. The permanganate used in the permanganic acid step is an oxidizing agent. Thus, the permanganate-containing alkaline solution can form copper oxide onto the copper surface. Accordingly, the term "desmear treatment" in the specification means that the permanganic acid step is conducted, or the permanganic acid step is conducted after the swelling step is conducted.

The above-mentioned alkaline solution containing an alkali metal, an alkaline earth metal or some other is preferably, for example, a solution obtained by adding an alkali metal compound or alkaline earth metal compound, such as sodium hydroxide, potassium hydroxide or sodium carbonate, to a solvent, such as water or water treated with an ion exchange resin.

Specific examples of the oxidizing agent include sodium hypochlorite, sodium chlorite, sodium chlorate, sodium perchlorate, potassium hypochlorite, potassium chlorite, potassium chlorate, potassium perchlorate, ammonium peroxodisulfate, potassium peroxodisulfate, and sodium peroxodisulfate. From the viewpoint of, in particular, storage stability, handleabilities such as safety, costs, and others, sodium chlorite is preferred. More preferably, a phosphate is added to the alkaline solution. The phosphate usable in the invention is not particularly limited, and is preferably, for example, trisodium phosphate, tripotassium phosphate, or trilithium phosphate. More preferably, a known organic acid or chelate agent is added to the alkaline solution.

The concentration of the oxidizing agent in the oxidizing-agent-containing alkaline solution is not particularly limited, and is preferably from 1 to 100 g/L. When the phosphate is added to the solution, it is preferred to attain the addition to set the concentration thereof to a value of 1 to 40 g/L. The pH of the solution is not particularly limited as far as the pH is a value showing alkalinity, and is preferably from 9 to 13, more preferably from 11 to 13, even more preferably from 12 to 12.8. The pH can be adjusted by an appropriate use of hydrochloric acid, sulfuric acid, nitric acid, or an aqueous solution of sodium hydroxide, potassium hydroxide or the like.

The crystal amount of the copper oxide generated on the copper surface is preferably 0.001 mg/cm$^2$ or more and 0.3 mg/cm$^2$ or less, more preferably 0.01 mg/cm$^2$ or more and 0.2 mg/cm$^2$ or less, in particular preferably 0.03 mg/cm$^2$ or more and 0.1 mg/cm$^2$ or less. If the crystal amount of the copper oxide is less than 0.001 mg/cm$^2$, the bonding force to an insulating resin or the like tends to decline. If the amount is more than 0.3 mg/cm$^2$, a problem that transmission loss becomes large is easily caused. The crystal amount of the copper oxide formed on the copper surface can be examined by measuring the quantity of the electrolytic reduction. For example, copper subjected to the oxidizing treatment is used as an operating electrode (cathode) to send a constant electricity quantity of 0.5 mA/cm$^2$, and a measurement is made about the period until the surface potential of the copper changes completely from the potential of the copper oxide to the potential of metal copper, that is, until the surface potential turns to a stable potential of −1.0 V or less. From the electrolytic reduction quantity therein, the copper oxide crystal amount can be obtained.

When the oxidizing treatment is conducted with the oxidizing-agent-containing alkaline solution, the temperature of the solution is not particularly limited. Considering the realization of a sufficient oxidizing treatment, a decrease in damage onto the substrate by the alkaline solution, and others, the temperature of the solution is preferably from 20 to 95° C., more preferably from 30 to 80° C., in particular preferably from 40 to 60° C. With regard to the oxidizing treatment period, it is advisable to make an appropriate decision to generate a desired amount of the copper oxide crystals, considering the concentration and the liquid temperature of the oxidizing treatment solution, and others. In the oxidizing treatment of the copper surface with the oxidizing treatment solution, the copper surface is covered with the needle crystals of the copper oxide in a short time, so that the oxidizing reaction stops. Thus, the period for the oxidizing treatment can be made shorter than in the case of the above-mentioned second method.

(Third Step)

The third step in the invention is related to the dissolution and removal of the copper oxide. Through the third step, an acidic solution or a copper complexing agent is used to dissolve and remove the copper oxide crystals formed on the copper surface in the previous step, thereby making it possible to form dense and even irregularities.

The acidic solution is preferably an acidic solution containing one or more selected from inorganic acids and organic acids. It is preferred to treat the crystals with an acidic solution containing, for example, sulfuric acid, hydrochloric acid or nitric acid as an inorganic acid although the inorganic acid is not particularly limited. When the desmear treatment is conducted in the second step, the third step may be conducted for a neutralizing treatment after the treatment with permanganic acid in the desmear treatment. In order to remove the copper oxide selectively, it is particularly preferred to treat the copper oxide with an acidic solution containing sulfuric acid. The concentration of the inorganic acid is not particularly limited, and is preferably from 0.1 to 100 g/L.

Examples of the organic acids include lactic acid and salts thereof, oxybutyric acid and salts thereof, glyceric acid and salts thereof, tartaric acid and salts thereof, malic acid and salts thereof, citric acid and salts thereof, L-theanine and salts thereof, pyroglutaric acid and salts thereof, pyrrolidine-2,4-dicarboxylic acid and salts thereof, folic acid and salts thereof, DL-threonine and salts thereof, L-threonine and salts thereof, L-tryptophan and salts thereof, L-phenylalanine and salts thereof, quinaldic acid and salts thereof, formic acid and salts thereof, acetic acid and salts thereof, propionic acid and salts thereof, octylic acid and salts thereof, glycolic acid and salts thereof, n-butyric acid and salts thereof, isobutyric acid and salts thereof, acrylic acid and salts thereof, crotonic acid and salts thereof, isocrotonic acid and salts thereof, oxalic acid and salts thereof, malonic acid and salts thereof, succinic acid and salts thereof, adipic acid and salts thereof, maleic acid and salts thereof, acetylenedicarboxylic acid and salts thereof, monochloroacetic acid and salts thereof, trichloroacetic acid and salts thereof, monobromoacetic acid and salts thereof, ethylenediaminetetraacetic acid and salts thereof, and ethylenediamine. It is preferred to treat the copper oxide with an acidic solution containing one or more of these organic acids. It is particularly preferred to treat the copper oxide with an acidic solution containing lactic acid or a salt thereof, malic acid or a salt thereof, citric acid or a salt thereof, or tartaric acid or a salt thereof. The concentration of the above-mentioned organic salt(s) is not particularly limited, and is preferably from 0.1 to 100 g/L.

The pH of the solution is not particularly limited as far as the pH is a value showing acidity. The pH is preferably 2 or less, more preferably 1 or less. The pH of the acidic solution containing one or more selected from inorganic acid and organic acids may be adjusted by an appropriate use of an aqueous solution of sodium hydroxide, potassium hydroxide or the like besides the inorganic acid(s) and the organic acid(s).

When the treatment is conducted with the acidic solution, the temperature of the solution is not particularly limited, and is preferably from 10 to 40° C., more preferably from 15 to 35° C., in particular preferably from 20 to 30° C. for selective removal of the copper oxide crystals under the consideration of safety in the use thereof. With regard to the period for the treatment with the acidic solution, it is advisable to make an appropriate decision for making it possible to remove the copper oxide crystals selectively, considering the concentration and the liquid temperature of the acidic solution, and others. The acidic solution can easily be prepared by dissolving the above-mentioned individual components into water. The water is preferably water from which ionic materials or impurities are removed, examples thereof including ion exchange water, pure water, and ultra pure water.

In the specification, the copper complexing agent is meant to a solution containing a chemical species or compounds which forms a coordinate bond with copper, or a solution containing a chemical species or compound which is combined with copper to form a complex. For example, the treatment may be conducted with a solution containing the following: a bromide, a chloride, a cyan compound, a fluoride, an ammonium salt, a phosphate, a thiocyanic acid compound, a sulphate, a thiosulphate, adenine, 5'-adenosine triphosphate, 2-aminoethanol, 2-aminoethanethiol, imidazole, ethylamine, ethylenediamine, ethylenediaminetetraacetic acid, catechol, citric acid, malic acid, lactic acid, glycylglycine, glycine, L-glutamic acid, acetic acid, L-cystein, oxalic acid, triethylenetetramine, picolinic acid, histidine, 2,2-bipyridyl, pyridine, 1,10-phenanthroline, L-phenylalanine, o-benzenedicarboxylic acid, or malonic acid.

(Fourth Step)

In the invention, it is desired that subsequently to the treatment with the acidic solution or the copper-complexing-agent-containing solution in the third step, a post-treatment is conducted as a fourth step to improve the bonding strength onto the copper surface, examples thereof including treatment 1) for forming a baser metal than copper onto the copper surface, treatment 2) of the copper surface with a solution containing an azole compound, and treatment 3) of the copper surface with a coupling agent. In this way, the bonding strength onto an insulating resin can be improved. These treatments may be conducted in combination. In the case of conducted, in particular, the treatment 1), the adhesiveness onto a solder resist tends to be improved. In the case of conducting the treatment 2), the adhesiveness onto a build-up member tends to be improved. In the case of conducting the treatments 1) and 2) in combination, the adhesiveness onto both of a solder resist and a build-up member can be improved. These matters will be made clear by way of working examples which will be described later. In the case of conducting the treatments in combination, it is preferred that the treatment 1), out of the treatments 1), 2) and 3), is first conducted. Specifically, it is more preferred that after the treatment 1), the treatment 2) or 3) is conducted.

(1. Treatment for Forming a Base Metal on the Copper Surface)

After the third step, a baser metal than copper is given to the copper surface, thereby forming the baser metal onto the copper surface. However, a complete covering of the copper surface is not necessarily attained. The baser metal is meant to be a metal having a lower potential than the potential of copper. It is presumed that the treatment with the baser metal makes it possible to restrain re-oxidization of the copper surface, thereby improving the adhesiveness onto an insulating resin, although the invention is not intended to be restricted by any theory.

The method for forming the baser metal on the copper surface is not particularly limited. Preferably, the baser metal is formed by electroless plating, electroplating, sputtering, vapor deposition, or some other method. More preferably, the baser metal is formed by electroless plating. Even more preferably, the copper surface is completely covered with the baser metal by electroless plating.

The baser metal is not particularly limited, and is preferably a metal selected from the group consisting of Cr, Co, Ni, Zn, Sn, Mo and W, or any alloy containing one or more of these metals. Particularly preferred is Sn, Ni or Co, which can be precipitated by electroless plating. Sn is most preferred. The baser metals may be formed on the copper surface. In this case, it is preferred to form Sn onto an outermost surface.

A Sn-containing solution usable in electroless plating is preferably an acidic solution containing a tin salt and a sulfur compound. The tin salt may be any tin salt as far as the salt can be dissolved in the acidic solution. The tin salt is preferably an organic sulfonic acid, or a chloride. The sulfur compound is preferably thiourea, an organic sulfide, or some other. The acidic solution is preferably an acidic solution containing one or more selected from inorganic acids and organic acids. The acidic solution is preferably an acidic solution containing, for example, sulfuric acid, hydrochloric acid, nitric acid, tartaric acid, methanesulfonic acid or p-toluenesulfonic acid although the solution is not particularly limited. The solution may contain a phosphorus compound.

The formation amount of the baser metal formed on the copper surface is not particularly limited. It is preferred to adjust the formation amount of the baser metal, considering the Rz of the copper surface. The baser metal is formed preferably into a thickness of 1 to 500 nm when the Rz of the copper surface is from 1 to 1,000 nm or less, preferably into that of 1 to 150 nm when the Rz is from 1 to 300 nm or less, preferably into that of 1 to 50 nm when the Rz is from 1 to 100 nm or less, and preferably into that of 1 to 25 nm when the Rz is from 1 to 50 nm or less. If the formation amount of the baser metal is less than the lower limit, the effect of restraining re-oxidization tends to be small. If the formation amount of the baser metal is more than the upper limit, the anchor effect based on the fine irregularities declines so that the bonding strength onto an insulating resin tends to fall. The amount of the baser metal formed discretely on the copper surface can be obtained by dissolving the baser metal on the copper surface with aqua regia, and then analyzing the solution quantitatively with an atomic absorption spectrophotometer.

When a heating treatment is conducted after the baser metal is formed, the adhesiveness between the copper surface and an insulating resin can be made still better. The heating treatment is conducted preferably at a temperature of 90 to 200° C. The treatment is conducted at a heating temperature ranging more preferably from 110 to 170° C., even more preferably from 130 to 150° C. By the heating to a temperature of 90° C. or higher, the adhesiveness-improving effect based on the heating treatment is easily expressed. On the other hand, by controlling the heating treatment temperature to 200° C. or lower, a deterioration in any organic-material-containing substrate, that is for the copper surface can be prevented.

However, the temperature in the heating treatment may be a temperature higher than 200° C. as far as the temperature does not give a deterioration or some other effect to the substrate material, such as an organic material. The period for the heating treatment is not particularly limited as far as an expected advantageous effect is obtained and a deterioration or some other effect is not given to the material. The heating treatment period is preferably, for example, from 20 to 120 minutes, more preferably from 40 to 90 minutes. In an embodiment of the invention, after the formation of Sn, the heating treatment is conducted preferably at a temperature of 110 to 170° C. over 20 to 120 minutes, more preferably at a temperature of 130 to 150° C. over 40 to 90 minutes although the temperature and the period are not particularly limited. After such a heating treatment, it is allowable to conduct degreasing treatment for cleaning and clarifying the copper surface, acid washing treatment therefor, or a treatment wherein these are appropriately combined with each other. Also in the case of conducting treatment with a solution containing an azole compound or coupling treatment in the state that the treatment is combined with the treatment for forming the baser metal onto the copper surface, it is preferred to conduct the solution treatment or coupling treatment after the heating treatment.

(2. Treatment with a Solution Containing an Azole Compound)

When the copper surface is treated with an azole-compound-containing solution after the third step, a layer made of the azole compound is formed on the copper surface. It is presumed that this treatment makes it possible to restrain re-oxidization of the copper surface, thereby improving the adhesiveness onto an insulating resin, although the invention is not intended to be restrained by any theory. The azole compound used in the azole-compound-containing solution is a 5-membered heterocyclic compound containing one or more nitrogen atoms, and is, for example, azole, diazole, triazole or tetrazole. The azole-compound-containing solution may be any solution containing at least one of these azole compounds. From the viewpoint of an improvement in the adhesiveness, diazole is particularly preferred. Of species of diazole, pyrazole (1,2-diazole) is particularly preferred. In order to improve the adhesiveness, the nitrogen-containing 5-membered heterocyclic structure itself in the azole compound is important. It is not particularly limited whether or not the structure has a substituent.

In the case of using, in particular, pyrazole as the azole compound to conduct the above-mentioned treatment, the treatment is conducted preferably using an azole-compound-containing solution having a pH of 7 to 12, more preferably using the solution having a pH of 8 to 11, most preferably using the solution having a pH of 9 to 10.

In the case of using, in particular, imidazole as the azole compound to conduct the above-mentioned treatment, the treatment is conducted preferably using an azole-compound-containing solution having a pH of 3 to 9, more preferably using the solution having a pH of 4 to 8, most preferably using the solution having a pH of 5 to 7.

In the case of using, in particular, triazole and tetrazole as the azole compound to conduct the above-mentioned treatment, the treatment is conducted preferably using an azole-compound-containing solution having a pH of 0.1 to 3, more preferably using the solution having a pH of 0.1 to 2, most preferably using the solution having a pH of 0.1 to 1.

The pH of the azole-compound-containing solution may be adjusted by an appropriate use of a sodium hydroxide solution, a potassium hydroxide solution, hydrochloric acid, a sulfuric acid solution or some other. For the adjustment of the pH, a buffer agent may be added thereto.

The concentration of the azole compound in the azole-compound-containing solution is preferably from 0.1 to 5000 ppm, more preferably from 0.5 to 3000 ppm, in particular preferably from 1 to 1000 ppm. The period for the treatment with the azole-compound-containing solution is not particularly limited, and is appropriately adjusted preferably in accordance with the kind and the concentration of the azole compound.

(3. Coupling Treatment)

After the third step, a coupling agent is used to treat the copper surface to make it possible to improve the adhesiveness onto an insulating resin. In an embodiment of the invention, it is preferred to conduct the coupling treatment after the treatment 1) with the baser metal containing solution or after the treatment 2) with the azole-compound-containing solution. By conducting both of the treatments 1) and 2) in this way, the adhesiveness-improving effect can be made even higher.

Examples of the coupling agent used in the coupling treatment include silane coupling agents, aluminum coupling agents, titanium coupling agent, and zirconium coupling agents. These may be used alone or in combination of two or more thereof. Of these examples, silane coupling agents are preferred. The silane coupling agents are each preferably an agent having in the molecule thereof an epoxy, amino, mercapto, imidazole, vinyl or methacrylic group, or some other functional group. The coupling agents may each be used in the form of a solution containing the agent. The solvent used to prepare the coupling agent solution is not particularly limited, and may be water, an alcohol, a ketone or some other. In order to promote the hydrolysis of the coupling agent, a small amount of an acid such as acetic acid or hydrochloric acid may be added thereto. The content by percentage of the coupling agent in the whole of the coupling agent solution is preferably from 0.01 to 5% by mass, more preferably from 0.1 to 1.0% by mass.

The treatment with the coupling agent may be conducted by a method of immersing the copper, which is a treatment target, in the coupling agent solution prepared as described above, a method of spraying or painting the coupling agent solution onto the copper, or some other method. The copper treated with the silane coupling agent is dried by natural drying, heating drying or vacuum drying. In accordance with the kind of the used coupling agent, the copper may be washed with water or washed by ultrasonic waves before the drying.

According to the above-mentioned copper surface treatment method of the invention, dense and even irregularities can be formed in a copper surface. Thus, it is possible to supply copper suitable for various articles, for example, mother boards such as a multi-level printed wiring board and a build-up printed wiring board, and semiconductor chip mounting substrates or boards such as a rigid substrate and a build-up substrate. When the copper surface treatment method of the invention is applied to the step of forming a copper wiring in a wiring board which may be of various types, a highly reliable wiring board can be provided (as the board) although a target to which the invention is applicable is not particularly limited. Hereinafter, examples will be given about embodiments each using the copper surface treatment method of the invention.

(Semiconductor Chip Mounting Board)

Figure 5:
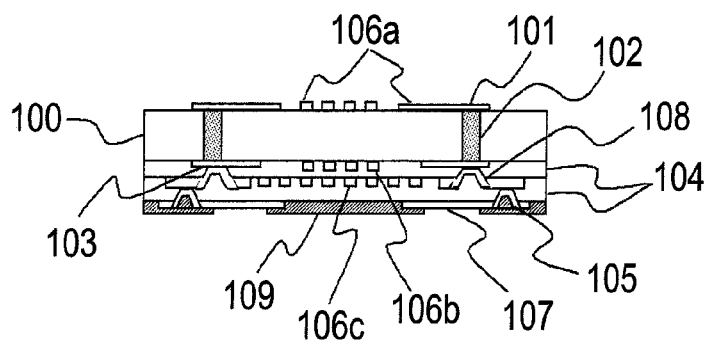
FIG. 5 is a schematic sectional view illustrating an example of semiconductor chip mounting boards according to the invention.
Figure 6:
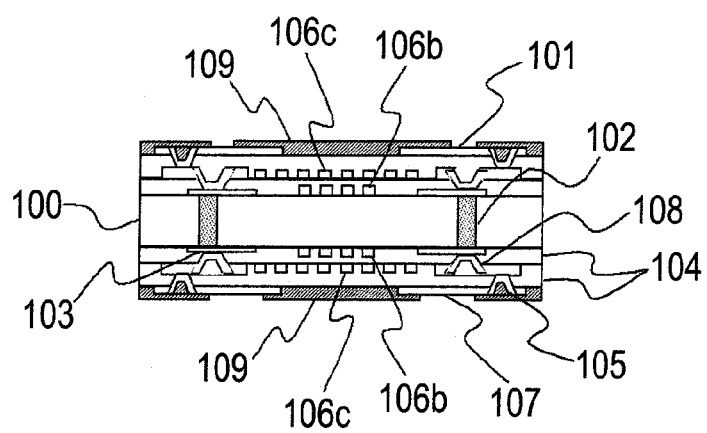
FIG. 6 is a schematic sectional view illustrating an example of the semiconductor chip mounting boards according to the invention.

FIG. 5 is a schematic sectional view illustrating an example of semiconductor chip mounting boards of an embodiment of the invention. In FIG. 5, a case where two build-up layers (interlayer dielectrics) are formed on only one surface of a core substrate 100 is given as an example. However, one or more build-up layers are not limited into the structure illustrated in FIG. 5. Thus, as the need arises, build-up layers may be formed on both surfaces of a core substrate 100 as illustrated in FIG. 6.

As illustrated in FIG. 5, in the semiconductor chip mounting board of the invention, a first wiring 106a containing semiconductor chip connection terminals (not illustrated) and first interlayer-connection terminals 101 is formed on the core substrate 100, which is an insulating layer at the side (of the board) on which semiconductor chips are to be mounted. On the opposite side of the core substrate, a second wiring 106b containing second interlayer-connection terminals 103 is formed. Each of the first interlayer-connection terminals is electrically connected, through a first IVH (interstitial via hole) 102 for interlayer-connection in the core substrate, to the corresponding the second interlayer-connection terminal. On the second wiring side of the core substrate, a build-up layer 104 is formed. A third wiring 106c containing third interlayer-connection terminals is formed on the build-up layer. Each of the second interlayer-connection terminals is electrically connected, through a second IVH 108 for interlayer-connection, to the corresponding third interlayer-connection terminal.

When plural build-up layers are formed, substantially the same structures are laminated onto each other, and external connection terminals 107 which are to be connected to a mother board are formed on the outmost one of the build-up layers. Furthermore, each of the external connection terminals is electrically connected, through a third IVH 105 for interlayer-connection, to the corresponding third interlayer-connection terminal. The shapes of the wirings, and the arrangements of the individual connection terminals are not particularly limited, and may be appropriately designed to produce the semiconductor chips to be mounted or a target semiconductor package. The semiconductor chip connection terminals, and the first interlayer-connection terminals or the like may be made common. Furthermore, an insulating cover 109 such as a solder resist may be laid on the outermost build-up layer as the need arises. Hereinafter, typical examples of the constituting members of the semiconductor chip mounting board and physical properties thereof will be described although the members and the properties are not particularly limited into the scope of the description.

(Core Substrate)

The material of the core substrate is not particularly limited. Thus, the substrate may be an organic substrate, a ceramic substrate, a silicon substrate, a glass substrate or some other. Considering the thermal expansion coefficient and the electric non-conductance thereof, it is preferred to use a ceramic material, or a glass. Examples of a non-photosensitive glass out of species of the glass include sodium lime glass (component example: $SiO_2$: 65-75% by weight; $Al_2O_3$: 0.5 to 4% by weight; CaO: 5 to 15% by weight; MgO: 0.5 to 4% by weight; and $Na_2O$: 10 to 20% by weight), and borosilicate glass (component example: $SiO_2$: 65-80% by weight; $B_2O_3$: 5 to 25% by weight; $Al_2O_3$: 1 to 5% by weight; CaO: 5 to 8% by weight; MgO: 0.5 to 2% by weight; $Na_2O$: 6 to 14% by weight; and $K_2O$: 1 to 6% by weight). Examples of a photosensitive glass include glass wherein $Li_2O$—$SiO_2$ based crystallized glass contains gold ions and silver ions as photosensitizers.

The organic substrate may be a substrate on which a material obtained by impregnating a glass cloth with a resin is laminated, or a resin film. The used resin may be a thermosetting resin, a thermoplastic resin, or a mixed resin of these resins, and is preferably a thermosetting organic insulating material. The thermosetting resin may be phenol resin, urea resin, melamine resin, alkyd resin, acrylic resin, unsaturated polyester resin, diallyl phthalate resin, epoxy resin, polybenzoimidazole resin, polyamide resin, polyamideimide resin, silicone resin, a resin synthesized from cyclopentadiene, a resin containing tris(2-hydroxyethyl)isocyanurate, a resin synthesized from an aromatic nitrile, a trimerized aromatic dicyanamide resin, a resin containing triallyl trimethacrylate, furan resin, ketone resin, xylene resin, a thermosetting resin containing an aromatic condensed polycycle, benzocyclobutene resin, or some other. Examples of the thermoplastic resin include polyimide resin, polyphenylene oxide resin, polyphenylene sulfide resin, aramide resin, and liquid crystal polymer. A filler may be added to these resins. Examples of the filler include silica, talc, aluminum hydroxide, aluminum borate, aluminum nitride, and alumina. The thickness of the core substrate is preferably from 100 to 800 μm, more preferably from 150 to 500 μm from the viewpoint of the forming performance of the IVHs.

(Build-Up Layer)

The interlayer dielectric (build-up layer) 104 is made of an insulating material, and the insulating material may be a thermosetting resin, a thermoplastic resin, or a mixed resin of these resins. The build-up layer is preferably made mainly of a thermosetting organic insulating material. The thermosetting resin may be phenol resin, urea resin, melamine resin, alkyd resin, acrylic resin, unsaturated polyester resin, diallyl phthalate resin, epoxy resin, polybenzoimidazole resin, polyamide resin, polyamideimide resin, silicone resin, a resin synthesized from cyclopentadiene, a resin containing tris(2-hydroxyethyl)isocyanurate, a resin synthesized from an aromatic nitrile, a trimerized aromatic dicyanamide resin, a resin containing triallyl trimethacrylate, furan resin, ketone resin, xylene resin, a thermosetting resin containing an aromatic condensed polycycle, benzocyclobutene resin, or some other. Examples of the thermoplastic resin include polyimide resin, polyphenylene oxide resin, polyphenylene sulfide resin, aramide resin, and liquid crystal polymer. A filler may be added to the insulating material. Examples of the filler include silica, talc, aluminum hydroxide, aluminum borate, aluminum nitride, and alumina.

(Thermal Expansion Coefficients)

It is preferred that the thermal expansion coefficient of the semiconductor chips is close to that of the core substrate and further the thermal expansion coefficient of the core substrate is close to that of the build-up layer. However, the thermal expansion coefficients of these members are not limited to this manner. Furthermore, when the thermal expansion coefficients of the semiconductor chips, the core substrate and the build-up layer are represented by $\alpha 1$, $\alpha 2$ and $\alpha 3$ (ppm/° C.), respectively, it is preferred to satisfy $\alpha 1 \leq \alpha 2 \leq \alpha 3$. Specifically, the thermal expansion coefficient $\alpha 2$ of the core substrate is preferably from 7 to 13 ppm/° C., more preferably from 9 to 11 ppm/° C. The thermal expansion coefficient $\alpha 3$ of the build-up layer is preferably from 10 to 40 ppm/° C., more preferably from 10 to 20 ppm/° C., in particular preferably from 11 to 17 ppm/° C.

(Young' Modulus)

The Young's modulus of the build-up layer is preferably from 1 to 5 GPa from the viewpoint of stress relaxation against thermal stress. With regard to the filler in the build-up layer, it is preferred to add the filler to adjust the addition amount thereof appropriately to set the thermal expansion coefficient and the Young's modulus of the layer into the range of 10 to 40 ppm/° C. and that of 1 to 5 GPa, respectively.

(Resist)

One or more resists used in the invention may each be an etching resist, a plating resist, a solder resist, a coverlay or some other. The etching resist and the plating resist are each used to form a wiring; thus, after the formation of the wiring, the resists are peeled not to remain on the board nor the other. The solder resist or the coverlay is for protecting any wiring other than the external connection terminals, the semiconductor chip connection terminals and the like; thus, these are formed as insulating covers on the board surface. These resists may be liquid-form or film-form resists, and are preferably photosensitive resists.

(Process for Producing the Semiconductor Chip Mounting Boards)

Any one of the above-mentioned semiconductor chip mounting boards may be produced by an appropriate combination of methods described below. The order of steps for the production is not particularly limited within the scope of the objects of the invention.

(Wiring-Forming Method)

The method for forming its wiring or any one of its wirings may a method of forming a metal foil piece onto one of the surfaces of its core substrate, or its build-up layer(s) and then removing unnecessary portions of the metal foil piece (the subtractive method), a method of forming the wiring only on necessary regions of the surface of the core substrate or the build-up layer by plating (the additive method), or a method of forming a thin metal layer (seed layer) on the surface of the core substrate or the build-up layer, forming a required wiring thereon by electroplating, and then removing the thin metal layer by etching (the semi-additive method).

(Formation of the Wiring by the Subtractive Method)

An etching is formed on a metal foil piece region which is to be the wiring, and then a chemical etching solution is sprayed onto any region uncovered with the etching resist to etch and remove unnecessary portions of the metal foil piece, thereby making it possible to form the wiring. When a copper foil piece is used as the metal foil piece, the etching resist may be an etching resist matter that can be used for ordinary wiring boards. For example, a resist ink is made into an etching resist by silk screen printing. In another method, a negative photosensitive dry film for an etching resist is laminated onto the copper foil piece, a photomask which transmits light into the form of the wiring is put thereon, the workpiece is exposed to ultraviolet rays, and unexposed regions thereof are removed with a developing solution to form an etching resist. The chemical etching solution may be a chemical etching solution used for ordinary wiring boards, such as a solution of cupric chloride and hydrochloric acid, a ferric chloride solution, a solution of sulfuric acid and hydrogen peroxide, or an ammonium persulfate solution.

(Formation of the Wiring by the Additive Method)

The wiring may also be formed by plating only necessary regions of the upper of the core substrate or the build-up layer. Wiring forming technique based on ordinary plating may be used. For example, the wiring is formed by causing an electroless plating catalyst to adhere onto the core substrate, forming a plating resist in regions of the surface where no plating is to be conducted, and immersing the workpiece in an electroless plating solution to apply electroless plating only to the regions uncovered with the plating resist.

(Formation of the Wiring by the Semi-Additive Method)

The method for forming a seed layer used in the semi-additive method on the core substrate surface or the build-up layer is classified into a method based on vapor deposition or plating, and a method of bonding a metal foil piece thereon. By the same methods, a metal foil piece in the subtractive method may be formed.

(Formation of the Seed Layer by Vapor Deposition or Plating)

The seed layer may be formed on the core substrate surface or the build-up layer by plating or vapor deposition. In the case of forming, for example, an underlying metal and a thin copper layer as a seed layer by sputtering, a sputtering machine for forming the thin copper layer may be a dipolar sputter, triode sputter, tetrode sputter, magnetron sputter or Mirror Tron sputter, or some other sputtering machine. With regard to a target used for the sputtering, for example, one or more metals such as Cr, Ni, Co, Pd, Zr, Ni/Cr or Ni/Cu are used as an underlying metal, and are sputtered into a thickness of 5 to 50 nm in order to keep a close adhesiveness certainly. Thereafter, copper as a target is sputtered into a thickness of 200 to 500 nm, so that the seed layer can be formed. It is allowable to form a plating copper having a thickness of 0.2 to 3 µm on the core substrate surface or the build-up layer by electroless copper plating.

(Formation of the Seed Layer by the Bonding of a Metal Foil Piece)

When the core substrate or the build-up layer has a bonding function, the seed layer may be formed by bonding a metal foil piece by pressing or laminating. However, it is very difficult to bond a thin metal layer directly; thus, the following is usable: a method of bonding a thick metal foil piece, and then etching the piece to make the piece thin; a method of bonding a carrier-attached metal foil piece, and then peeling the carrier layer; or some other method. For example, in the former, a tri-layered copper foil piece of carrier copper/nickel/thin-film-form copper is usable, and the carrier copper and nickel can be removed with an alkaline etching solution and a nickel etching solution, respectively. In the latter, use may be made of a peelable copper foil piece using aluminum, copper, an insulating material or the like as a carrier, or some other foil piece, and a seed layer having a thickness of 5 µm or less can be formed. It is also allowable to bond a copper foil piece having a thickness of 9 to 18 µm, and make the piece into an evenly small thickness of 5 µm or less by etching, thereby forming a seed layer. On the seed layer formed by any one of the methods, a plating resist is formed into a required pattern form, and then copper electroplating is used to form the wiring by aid of the seed layer. Thereafter, the plating resist is peeled. Finally, the seed layer is removed by etching or the like, so that the formation of the wiring can be attained.

(Wiring Form)

Figure 7:
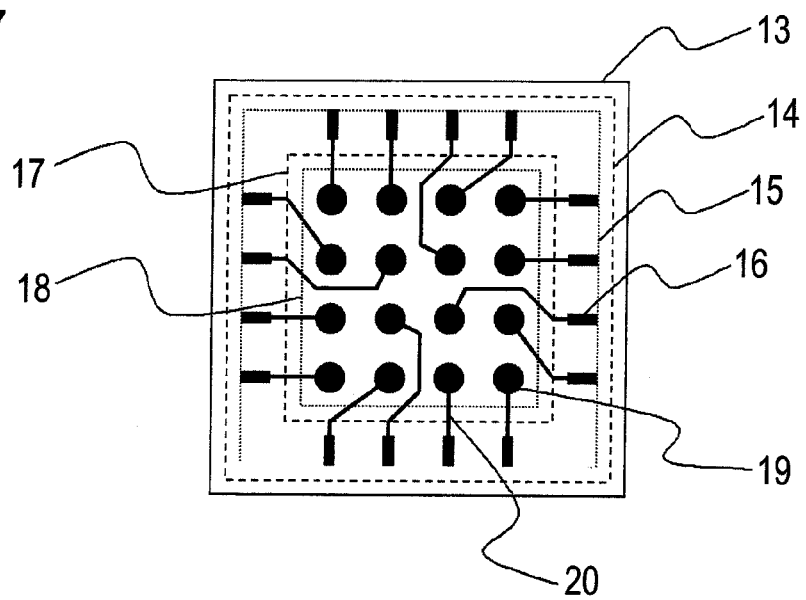
FIG. 7 is a plan view illustrating an example of fan-in type semiconductor chip mounting boards according to the invention.
Figure 8:
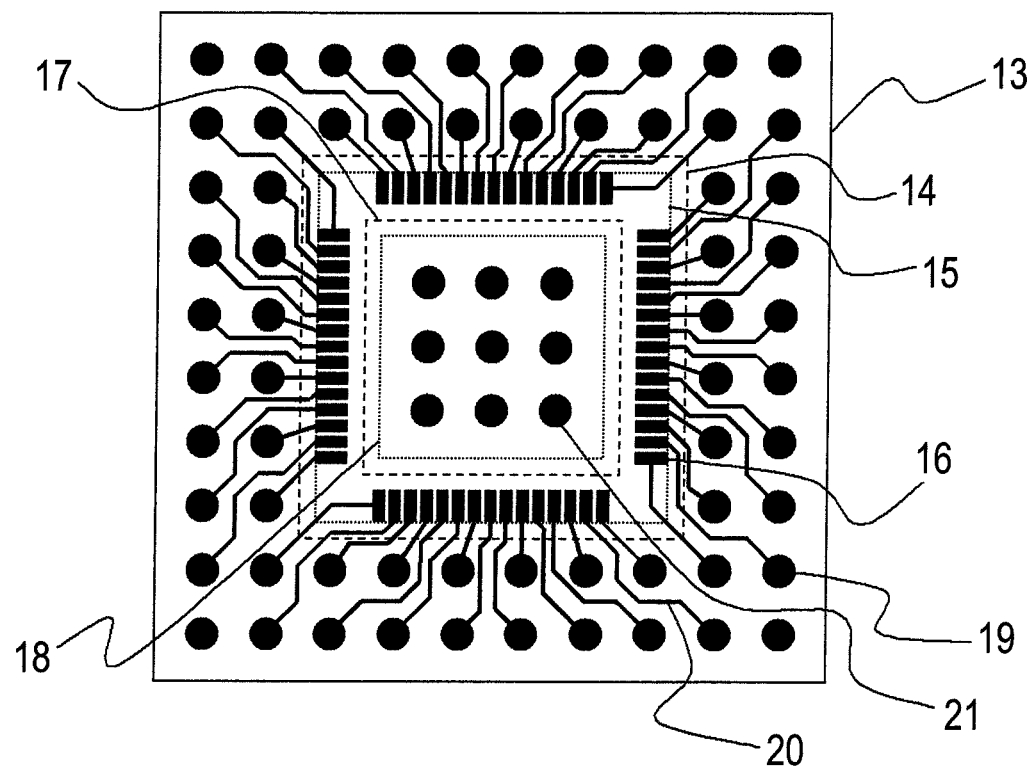
FIG. 8 is a plan view illustrating an example of fan-out type semiconductor chip mounting boards according to the invention.

The form or shape of the (entire) wirings is not particularly limited, and is composed of at least the following: semiconductor chip connection terminals 16 (such as wire bonding terminals) on the semiconductor-chip-mounting side (of the board); and external connection terminals (regions where solder balls and/or others are mounted), which are electrically connected to a mother board, developed interconnections for linking them to each other, interlayer-connection terminals, and others on the opposite side. The arrangement of the wirings is not particularly limited. Thus, the semiconductor chip mounting board may be a fan-in type semiconductor chip mounting board as illustrated in FIG. 7 (inner layer wirings and interlayer-connection terminals, and others are omitted), wherein external connection terminals 19 are formed inside semiconductor chip connection terminals 16, a fan-out type semiconductor chip mounting board as illustrated in FIG. 8, wherein external connection terminals 19 are formed outside semiconductor chip connection terminals 16, or a type wherein these are combined with each other. In FIGS. 7 and 8, reference number 13 represents a semiconductor package region; 14 represents a die bonding film bonding region (flip chip type); 15 represents a semiconductor chip mounting region (flip chip type); 17 represents a die bonding film bonding region (wire bonding type); 18 represents a semiconductor chip mounting region (wire bonding type); and 20 represents developed interconnections. The form of the semiconductor chip connection terminals is not particularly limited as far as the terminals can undergo wire bonding connection, flip chip connection, or the like. Whether the semiconductor chip mounting board is of a fan-in type or of a fan-out type, the board can undergo wire bonding connection, flip chip connection, or the like. As the need arises, dummy patterns 21 (see FIG. 8), which are not electrically connected to any semiconductor chip, may be formed. The shape or arrangement of the dummy patterns is not particularly limited. Preferably, the dummy patterns are evenly arranged in the semiconductor chip mounting region. In this manner, at the time of mounting semiconductor chips with a die bonding adhesive, voids are not easily generated so that the reliability can be improved.

(Via Holes)

Since any multi-level one of the above-mentioned semiconductor chip mounting boards has plural wiring layers, via holes may be made to connect the wirings in the individual layers electrically to each other. Any one of the via holes can be made by making a hole in its core substrate or its build-up layer, and filling this hole with a conductive paste, plating or the like. The method for working into the hole may be machine processing such as punching or drilling, laser processing, chemical etching processing with a chemical agent, dry etching using plasma, or some other method. The method for forming the via hole in the build-up layer may also be a method of forming a conductive layer beforehand on the build-up layer by use of a conductive paste, plating or the like, and then laminating this onto the core substrate by pressing or the like.

(Formation of an Insulating Cover)

An insulating cover may be formed on the external connection terminal side of any one of the above-mentioned semiconductor chip mounting boards. A pattern thereof may be formed by printing when the raw material thereof is a material in a vanish form. In order to keep the precision thereof with a higher certainty, it is preferred to use a photosensitive solder resist, an overlay film or a film-form resist. The raw material may be an epoxy-, polyimide-, epoxy acrylate-, or fluorene-based material. Since this insulating cover shows shrinkage when cured, the board is largely warped when the cover is formed on only one of both the surfaces. Thus, the insulating cover may also be formed on each of the surfaces of the semiconductor chip mounting board as the need arises. The warp is varied in accordance with the thickness of the insulating cover; thus, it is more preferred to adjust the thickness of the insulating cover on each of the surfaces not to generate any warp. In this case, it is preferred to make a preliminary investigation to decide the thickness of the insulating cover on each of the surfaces. In order to produce a thin semiconductor package, the thickness of the insulating cover is preferably 50 μm or less, more preferably 30 μm or less.

(Plating on the Wiring)

Required regions of the wiring may be successively plated with nickel and gold. As the need arises, the regions may be plated with nickel, palladium and/or gold. These plating treatments are applied to the external connection terminals for connecting the semiconductor chip connection terminals of the wiring electrically to a mother board or a different semiconductor package. The plating treatments may each be electroless plating or electroplating.

Figure 9:
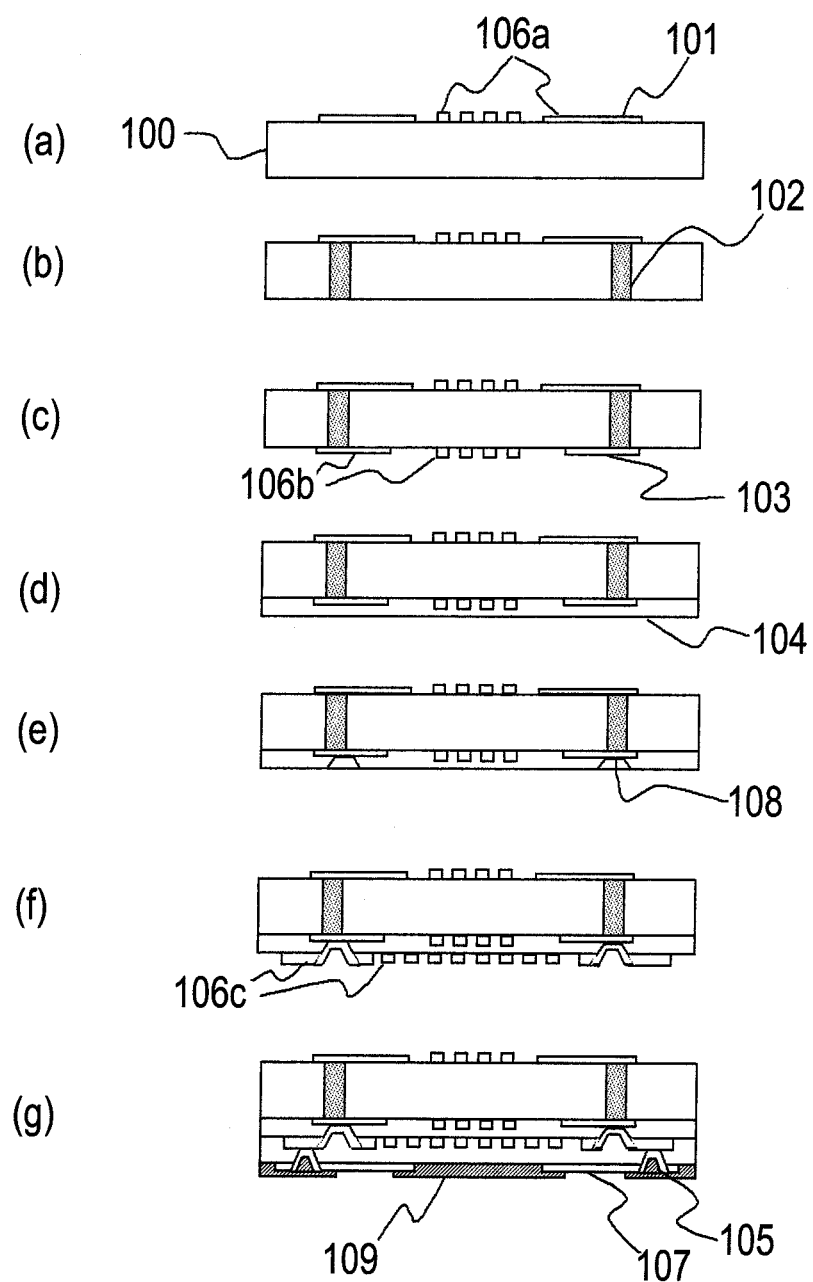
FIG. 9 is a view illustrating an example of semiconductor chip mounting board producing processes according to the invention.

Hereinafter, a process for producing a semiconductor chip mounting board will be described as an embodiment of the invention. FIG. 9 is a view illustrating an example of the semiconductor chip mounting board producing process in the invention. FIGS. 9(a) to 9(g) are schematic sectional views corresponding to respective steps thereof. However, the order of the steps illustrated in the figures is not particularly limited with the scope of the objects of the invention.

<Step a>

As illustrated in FIG. 9(a), the step <a> is a step of forming a first wiring 106a on a core substrate 100. In the formation of the first wiring 106a, for example, a core substrate having, on a single surface thereof, a copper layer is prepared, and the copper layer is subjected to degreasing treatment and then washed with hydrochloric acid or sulfuric acid. Next, one or more nobler metals than copper or an alloy containing the nobler metal(s) is discretely formed, the nobler metal(s) being selected from gold, silver, platinum, palladium, rhodium, rhenium, ruthenium, osmium and iridium, and then the workpiece is immersed in an aqueous alkaline solution containing an oxidizing agent to conduct oxidizing treatment. Thereafter, the workpiece is treated with an acidic solution or a solution containing a copper complexing agent. Thereafter, the workpiece is further subjected to at least one of coupling treatment and treatment with a solution containing an azole compound. Alternatively, the workpiece may be treated with a solution containing a baser metal than copper, and further subjected to at least one of coupling treatment and treatment with a solution containing an azole compound. In any one of these cases, the treatments are conducted to set the Rz of the wiring surface to 1 nm or more and 1,000 nm or less. Thereafter, an etching resist is formed into the form of the first wiring on the treated copper layer. The copper layer is etched with an etching solution, examples of which include copper chloride, iron chloride, sulfuric acid/hydrogen peroxide, and nitric acid/hydrogen peroxide, and then the etching resist is removed. In this way, the first wiring can be formed. The formation of the copper layer on the core substrate 100 can be attained by forming a copper thin film thereon by sputtering, vapor deposition, plating or the like, and then subjecting the film to copper electroplating to give a desired thickness. The first wiring 106a includes first interlayer-connection terminals 101 and semiconductor chip connection terminals (regions which are to be electrically connected to semiconductor chips). The method for forming the fine wiring may be the semi-additive method.

<Step b>

As illustrated in FIG. 9(b), the step <b> is a step of making first IVHs 102 (via holes) for interlayer-connection in order to connect the first interlayer-connection terminals 101 to a second wiring that will be described later. When the core substrate 100 is a non-photosensitive substrate, holes that are to be the via holes may be made by irradiating regions that are to be via holes with a laser ray such as $CO_2$ laser, YAG laser, or excimer laser. From the viewpoint of productivity, and the quality of the holes, it is preferred to use $CO_2$ laser. When the diameter of the IVHs is less than 30 μm, YAG laser, the laser ray of which can be narrowed, is suitable. The non-photosensitive substrate may be the above-mentioned non-photosensitive glass, or some other. However, the substrate is not limited thereto. When the core substrate 100 is a photosensitive substrate, the regions except the regions which are to be the via holes are masked, irradiated with ultraviolet rays and then subjected to thermal treatment and etching to make holes which are to be the via holes. The photosensitive substrate may be the above-mentioned photosensitive glass or some other. However, the substrate is not limited thereto. When the core substrate 100 is a substrate which can be chemically etched with an organic solvent or some other chemical liquid, the holes which are to be the via holes can be made by chemical etching. After the holes which are to be the via holes are made as described above, the workpiece is subjected to desmear treatment as the need arises in order to connect the layers electrically to each other. Thereafter, the holes are made conductive by use of a conductive paste, plating or some other. In this way, the via holes are made.

<Step c>

As illustrated in FIG. 9(c), the step <c> is a step of forming a second wiring 106b on the surface of the core substrate 100 opposite to the first wiring. The second wiring 106b can be formed on the surface of the core substrate 100 opposite to the first wiring in the same manner as in the formation of the first wiring in the step <a>. In the same manner as in the step <a>, the copper layer may be formed by forming a copper thin film by sputtering, vapor deposition, plating or some other, and then subjecting the film to copper electroplating to give a desired thickness. The second wiring 106b includes second interlayer-connection terminals 103. The method for forming the fine wiring may be the semi-additive method.

<Step d>

As illustrated in FIG. 9(d), the step <d> is a step of forming a build-up (interlayer dielectric) 104 on the surface on which the second wiring 106b is formed. In this step, it is desired to subject the second wiring 106b surface first to degreasing treatment and washed with hydrochloric acid or sulfuric acid. Next, one or more nobler metal than copper or an alloy containing the nobler metal(s) is discretely formed on the copper siring surface (on the second wiring 106b), the nobler metal(s) being selected from gold, silver, platinum, palladium, rhodium, rhenium, ruthenium, osmium and iridium, and then the workpiece is immersed in an alkaline solution containing an oxidizing agent to conduct oxidizing treatment. Thereafter, the workpiece is further treated with an acidic solution or a solution containing a copper complexing agent. Thereafter, the workpiece is further subjected to at least one of coupling treatment and treatment with a solution containing an azole compound. Alternatively, the workpiece may be treated with a solution containing a baser metal than copper, and further subjected to at least one of coupling treatment and treatment with a solution containing an azole compound. In this way, the roughness Rz of the copper wiring surface is set to 1 nm or more and 1,000 nm or less.

Next, the build-up layer 104 is formed on the core substrate 100 surface and the second wiring 106b surface. The insulating material of the build-up layer 104 may be a thermosetting resin, a thermoplastic resin, or a mixed resin of these resins, as described above, and is preferably made mainly of a thermosetting material. In a case where the insulating material is in a varnish form, the formation of the build-up layer 104 can be attained by printing, spin coating or some other. In a case where the insulating material is in a film form, the formation can be attained by laminating, pressing or some other. In a case where the formation is attained by laminating, it is allowable that the workpiece is, from the upper and lower thereof, sandwiched between mirror plates in the same way as in the case of pressing. When the insulating material contains a thermosetting material, it is desired that the workpiece is further heated to be set.

<Step e>

As illustrated in FIG. 9(*e*), the step <e> is a step of making second IVHs (via holes) 108 for interlayer-connection in the build-up layer 104. The making may be attained in the same manner as in the case of the first IVHs 102 for interlayer-connection.

<Step f>

As illustrated in FIG. 9(*f*), the step <f> is a step of forming a third wiring 106c on the build-up layer in which the second IVHs 108 are made. The third wiring 106c may be formed in the same way as in the formation of the first wiring 106a in the <step a>. A process for forming the wiring which is a fine wiring wherein the L/S is "15 μm/15 μm" or less is preferably the semi-additive method. It is preferred to form a seed layer as described above on the build-up layer 104 by a method using vapor deposition or plating, a method of bonding a metal foil piece, or some other method. In this case, the fine wiring can be formed as follows: a plating resist is formed into a required pattern onto the seed layer; copper electroplating is used to form a wiring by aid of the seed layer; and thereafter the plating resist is peeled, and finally the seed layer is removed by etching or the like. By repeating the <step d> to the <step f>, two or more build-up layers 104 may be formed as illustrated in FIG. 9(*g*). In this case, interlayer-connection terminals formed on the outermost build-up layer act as external connection terminals 107.

<Step g>

As illustrated in FIG. 9(*g*), the <step g> is a step of forming an insulating cover 109 for protecting the wirings and so on except the external connection terminals 107. The material of the insulating cover may be a solder resist. The resist may be of a thermosetting type or of an ultraviolet curing type. The resist is preferably an ultraviolet curing type resist, which makes it possible to finish the shape of the resist precisely. The external connection terminals 107, the other wirings, and so on are first subjected to degreasing treatment, and then washed with hydrochloric acid or sulfuric acid. Next, one or more nobler metals than copper or an alloy containing the nobler metal(s) is discretely formed, the nobler metal(s) being selected from gold, silver, platinum, palladium, rhodium, rhenium, ruthenium, osmium and iridium, and then the workpiece is immersed in an aqueous alkaline solution containing an oxidizing agent to conduct oxidizing treatment. Thereafter, the workpiece is further treated with an acidic solution or a solution containing a copper complexing agent. Thereafter, the workpiece is further subjected to at least one of coupling treatment and treatment with a solution containing an azole compound. Alternatively, the workpiece may be treated with a solution containing a baser metal than copper, and further subjected to at least one of coupling treatment and treatment with a solution containing an azole compound. In any one of these cases, the treatments are conducted to set the Rz of the wiring surface to 1 nm or more and 1,000 nm or less. Thereafter, a solder resist is formed in the regions other than the external connection terminals 107 to make the external connection terminals 107 naked. The external connection terminals are electrically connected through the third IVHs 105 for interlayer-connection to the third wiring.

Figure 10:
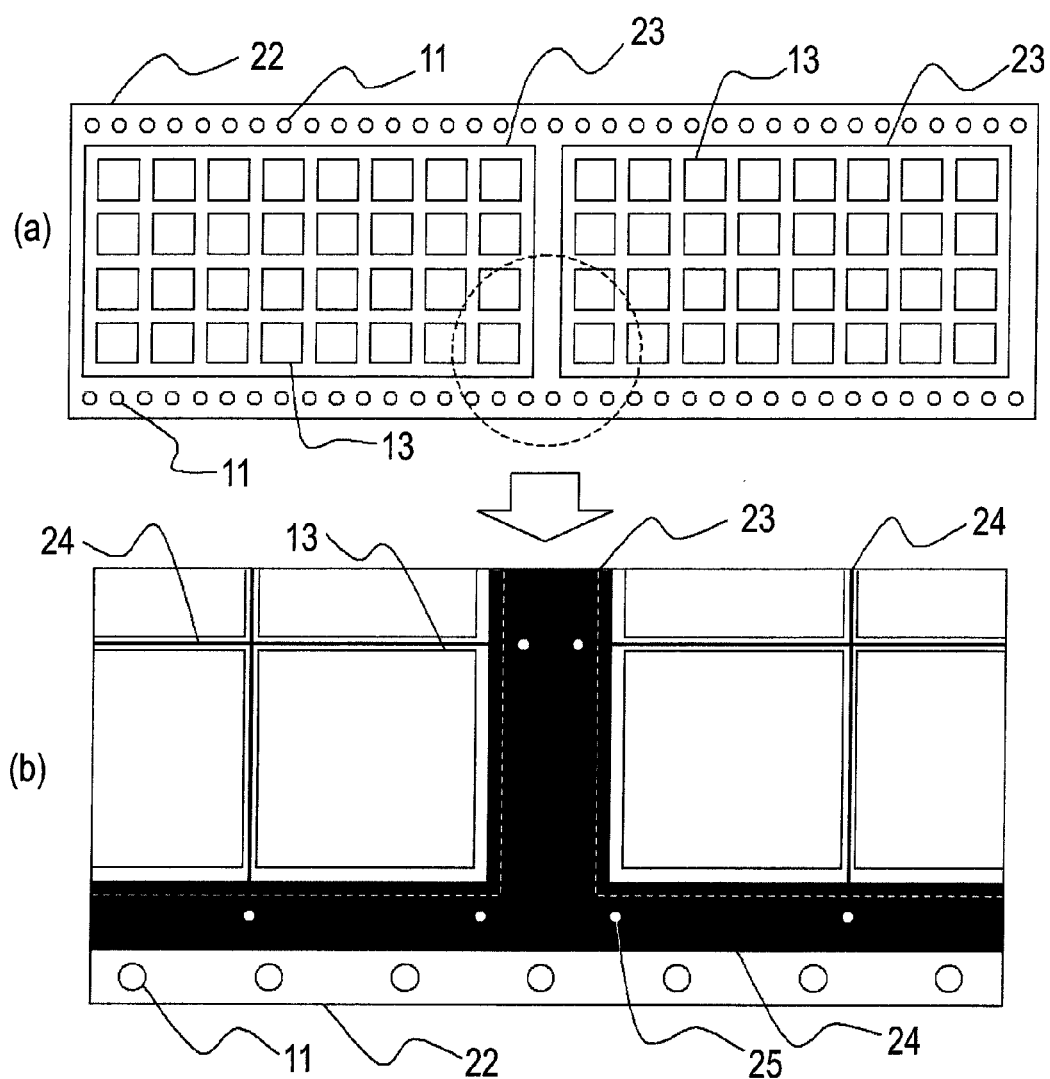
FIG. 10 is a view illustrating an example of semiconductor chip mounting boards in a frame form according to the invention, and FIGS. 10(a) and (b) are a plan view thereof and a partially enlarged view thereof, respectively.

The example of the semiconductor chip mounting board producing process has been described as an embodiment of the invention along FIG. 9. However, the shape of the semiconductor chip mounting board is not particularly limited. In an embodiment of the invention, the board is preferably made into a frame form as illustrated in FIG. 10. When the shape of a semiconductor chip mounting board 22 is made into a frame form, semiconductor packages can be effectively fabricated therefrom. Hereinafter, a detailed description will be made about a production of a semiconductor chip mounting board in a frame form.

As illustrated in FIG. 10, blocks 23 are first formed in each of which semiconductor package regions 13, which are each to be a single semiconductor package, are arranged into the form of rows and columns at regular intervals, so as to be made into a lattice form. In FIG. 10, only the two blocks are illustrated. However, as the need arises, the same blocks may be arranged into a lattice form. The width of any space region between the semiconductor package regions is preferably from 50 to 500 μm, more preferably from 100 to 300 μm. Most preferably, the width is made equal to the blade width of a dicer used when the regions will be afterwards cut into semiconductor packages.

By arranging the semiconductor package regions in this manner, the semiconductor chip mounting board can be effectively used. It is preferred to make positioning marks 11 or the like at ends of the semiconductor chip mounting board. It is more preferred that the marks are pin holes that are through holes. It is advisable to select the shape and the arrangement of the pin holes so as to match with the forming method thereof and the semiconductor-package-fabricating apparatus.

It is preferred to form a reinforcing pattern 24 in the spaces region between the semiconductor package regions and outside the blocks. The reinforcing pattern may be separately formed and bonded to the semiconductor chip mounting board; preferably, the pattern is a metallic pattern formed at the same time when wirings are formed in the semiconductor package regions. More preferably, the surface is subjected to plating with nickel, gold, or some other that is equivalent to the wirings, or is covered with an insulating cover. When the reinforcing pattern is made of such a metal, a plating lead may be used when the workpiece is electroplated. It is preferred that outside the blocks, positioning marks 25 used at the time of the cutting with the dicer are formed. In this way, a frame-form semiconductor chip mounting board can be produced.

(Semiconductor Package)

Figure 11:
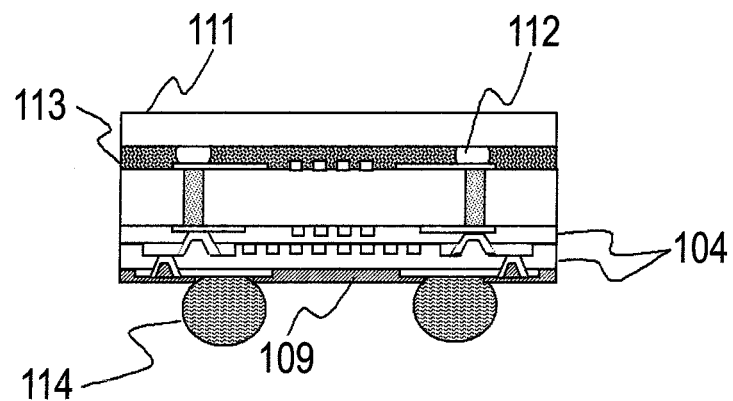
FIG. 11 is a schematic sectional view illustrating an example of flip chip type semiconductor packages according to the invention.

FIG. 11 is a schematic sectional view illustrating an example of a flip chip type semiconductor package according to the invention. As illustrated in FIG. 11, in the semiconductor package of the invention, semiconductor chips 111 are further mounted on one of the above-mentioned semiconductor chip mounting boards of the invention. Connection bumps 112 are used to attain flip chip connection, thereby connecting the semiconductor chips electrically to the semiconductor chip connection terminals. Furthermore, as illustrated in the figure, it is preferred in this semiconductor package that gaps between the semiconductor chips and the semiconductor chip mounting board are sealed with an under filler material 113. The thermal expansion coefficient of the under filler material is preferably close to those of the semiconductor chips 111 and the core substrate 100. However, these thermal expansion coefficients are not limited to this manner. More preferably, the "thermal expansion coefficient of the semiconductor chips"≤the "thermal expansion coefficient of the under filler material"≤the "thermal expansion coefficient of the core substrate". Furthermore, the mounting of the semiconductor chips may be attained by use of an anisotropic conductive film (ACF), or a bonding film containing no conductive particles (NCF). This case is more preferred since it is unnecessary to seal the gaps with the under filler material. It is particularly preferred to use ultrasonic waves together when the semiconductor chips are mounted since the electrical connection can be attained at low temperature in a short period.

Figure 12:
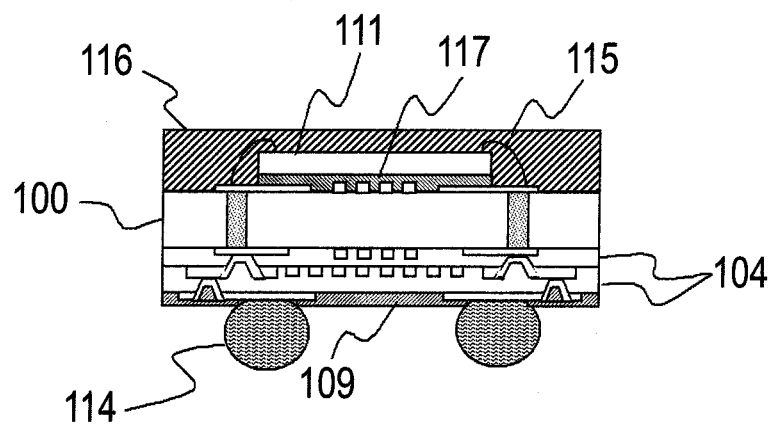
FIG. 12 is a schematic sectional view illustrating an example of wire bonding type semiconductor packages according to the invention.

FIG. 12 is a schematic sectional view illustrating an example of a wire bonding type semiconductor package according to the invention. For semiconductor-chip-mounting, an ordinary die bonding paste may be used. More preferably, a die bonding film 117 is used. Semiconductor chips are electrically connected to semiconductor chip connection terminals by wire bonding using gold wires 115. The semiconductor chips may be sealed by transfer molding using a semiconductor-sealing resin 116. In this case, it is sufficient for regions to be sealed that only their necessary portions, for example, only face planes of the semiconductor chips are sealed. It is however more preferred to seal the whole of a semiconductor package region as illustrated in FIG. 12. This is a particularly effective method in a case where in a semiconductor chip mounting board wherein semiconductor package regions are arranged into the form of rows and columns, the board and the sealing resin 116 are simultaneously cut with a dicer or the like.

In order to connect the board electrically to a mother board, for example, solder balls 114 may be mounted on the external connection terminals 107. For the solder balls, eutectic solder or Pb-free solder is used. The method for bonding and fixing the solder balls to the external connection terminals 107 is, for example, the use of a $N_2$ reflow machine. However, the method is not limited thereto. In the case of producing semiconductor packages wherein semiconductor chips are mounted on a semiconductor chip mounting board as described above, a dicer or the like is finally used to cut the board into the individual semiconductor packages.

EXAMPLES

Hereinafter, the invention will be described on the basis of examples. However, the invention is not limited thereto.

Example 1

The copper surface treatment method according to the invention was used to produce semiconductor packages, and the reliability of the semiconductor packages was evaluated. Hereinafter, with reference to the individual step views illustrated as FIG. 9, a description will be made about the method of producing samples for evaluating the semiconductor packages.

<Step a>

As a core substrate 100, a soda glass substrate (thermal expansion coefficient: 11 ppm/° C.) of 0.4 mm thickness was prepared. By sputtering, a copper thin film of 200 nm thickness was formed on one surface thereof. Thereafter, the workpiece was plated by copper electroplating, so as to give a thickness of 10 μm. The sputtering was performed by using a machine manufactured by ULVAC, Inc., having a model number of MLH-6315, under the following conditions 1:

Conditions 1
 electric current: 3.5 A,
 voltage: 500 V,
 argon flow rate: 35 SCCM (0.059 Pa·m³/s)
 pressure: $5×10^{-3}$ Torr ($6.6×10^{-1}$ Pa), and
 film-forming rate: 5 nm/s Thereafter, an etching resist was formed in a region which was to be a first wiring 106a. A ferric chloride etching solution was used to etch the workpiece, and the etching resist was removed to form the first wiring 106a (including first interlayer-connection terminals 101 and semiconductor chip connection terminals).

<Step b>

Holes which were to be IVHs having a hole diameter of 50 μm were made in the surface of the first-wiring-106a-formed glass substrate opposite to the first wiring 106a by means of a laser until the hole reached the first interlayer-connection terminals 101. The used laser was a YAG laser, LAVIA-UV2000 (trade name) manufactured by Sumitomo Heavy Industries, Ltd. Under the following conditions, the holes, which were to be the IVHs, were made: frequency: 4 kHz, the number of shots: 50, and mask diameter: 0.4 mm Next, the insides of the holes were subjected to dismear treatment. Thereafter, a conductive paste, MP-200V (trade name) manufactured by Hitachi Chemical Co., Ltd., was filled into the holes, and then the paste was cured at 160° C. for 30 minutes to connect the holes electrically to the first interlayer-connection terminals 111 on the glass substrate. In this way, first IVHs 102 (via holes) for interlayer-connection were formed.

<Step c>

A copper thin film of 200 nm thickness was formed on the surface of the glass substrate opposite to the first wiring 106a by sputtering in order to connect the film electrically to the first IVHs 102 (first via holes) for interlayer-connection formed in the <step b>. Thereafter, the workpiece was plated by copper electroplating to give a thickness of 10 μm. The sputtering was performed in the same way as in the <step a>. Thereafter, in the same way as in the <step a>, an etching resist was formed into the form of a second wiring 106b, and a ferric chloride etching solution was used to etch the workpiece, and then the etching resist was removed to form the second wiring 106b (including second interlayer-connection terminals 103).

<Step d>
<Step d-1>

The wiring surface side of the second wiring 106 formed in the <step c> was immersed in an acidic degreasing solution, Z-200 (trade name) manufactured by World Metal Co., Ltd., the concentration of which was adjusted to 200 mL/L, at a liquid temperature of 50° C. for 2 minutes, then immersed in water having a liquid temperature of 50° C. for 2 minutes to wash the surface with the hot water, and further washed with water for 1 minute. Next, the surface was immersed in an aqueous 3.6 N sulfuric acid solution for 1 minute, and washed with water for 1 minute.

<Step d-2>

The second wiring 106*b* which underwent the pre-treatment step was immersed in a palladium displacement plating solution, SA-100 (trade name) manufactured by Hitachi Chemical Co., Ltd., at 30° C. for 3 minutes to apply plating of palladium, which is a nobler metal than copper, thereto in an amount of 1.0 μmol/dm$^2$, washed with water for 1 minute, and further immersed at 50° C. for 3 minutes in an oxidizing treatment solution wherein 15 g/L of sodium hypochlorite was added to an alkaline solution containing 10 g/L of trisodium phosphate and 25 g/L of potassium hydroxide, so as to form copper oxide crystals 0.07 mg/cm$^2$ in density on the second wiring 106*b* surface. Thereafter, the surface was washed with water for 1 minute, and then immersed in an acidic 20 g/L sulfuric acid solution at 25° C. for 30 seconds to remove the formed copper oxide crystals selectively to form fine irregularities on the copper surface. Thereafter, the workpiece was washed with water for 5 minutes, and dried at 85° C. for 30 minutes.

<Step d-3>

Next, an interlayer dielectric (build-up layer) 104 was on the second wiring 106 side surface as follows: a build-up member, AS-ZII (trade name) Hitachi Chemical Co., Ltd., was used to laminate a build-up layer onto the second wiring 106*b* side surface by vacuum laminating under conditions that the vacuum drawing period was 30 seconds, the pressure was 0.5 MPa and the pressuring period was 40 seconds. In this way, a resin layer of 45 μm thickness was formed, and then the workpiece was kept at 180° C. for 90 minutes in an oven drier to set the resin layer thermally. In this way, the build-up layer was formed.

<Step e>

Holes which were to be IVHs having a hole diameter of 50 μm were made in the surface of the build-up layer 104 formed in the step <d-3> by means of a laser until the hole reached the second terminals 103 for interlayer-connection. The used laser was a YAG laser, LAVIA-UV2000 (trade name) manufactured by Sumitomo Heavy Industries, Ltd. Under the following conditions, the holes, which were to be the IVHs, were made: frequency: 4 kHz, the number of shots: 50, and mask diameter: 0.4 mm. Thereafter, the workpiece was subjected to dismear treatment. In the process of the desmear treatment, the workpiece was immersed in a swelling solution, CIRCUPOSIT PRIP 4125 (trade name) manufactured by Rohm and Haas in Japan Electronic Materials K.K., at 80° C. for 3 minutes, and then washed with water for 3 minutes. Thereafter, the workpiece was immersed in a desmear solution, CIRCUPOSIT MLB PROMOTER 213 (trade name) manufactured by Rohm and Haas in Japan Electronic Materials K.K., at 80° C. for 5 minutes, and then washed with water for 3 minutes. Next, the workpiece was immersed in a reducing solution, CIRCUPOSIT MLB216-4 (trade name) manufactured by Rohm and Haas in Japan Electronic Materials K.K., at 40° C. for 3 minutes, washed with water for 3 minutes, and then dried at 85° C. for 30 minutes.

<Step f>

In order to form a third wiring 106*c* and second IVHs 108 on the build-up layer 104 formed in the <step d-3>, a Ni layer (underlying metal) of 20 nm thickness was formed on the build-up layer 104 by sputtering, and further a thin copper layer of 200 nm thickness was formed on the Ni layer to form a seed layer. The sputtering was performed, using a machine manufactured by ULVAC, Inc., MLH-6315, under the following conditions 2:

Conditions 2
(Ni Layer)
electric current: 5.0 A,
electric current: 350 V,
voltage, argon flow rate: 35 SCCM (0.059 Pa·m$^3$/s)
pressure: 5×10$^{-3}$ Torr (6.6×10$^{-1}$ Pa), and
film-forming rate: 0.3 nm/s
(Thin Copper Layer)
electric current: 3.5 A,
voltage: 500 V,
argon flow rate: 35 SCCM (0.059 Pa·m$^3$/s)
pressure: 5×10$^{-3}$ Torr (6.6×10$^{-1}$ Pa), and
film-forming rate: 5 nm/s Next, a plating resist, PMER P-LA900PM (trade name) manufactured by Tokyo Ohka Kogyo Co., Ltd., was painted on the seed layer (thin copper layer) by spin coating to form a plating resist layer of 10 μm thickness. Next, the plating resist layer was exposed to light at 1000 mJ/cm$^2$, and then immersed in a PMER developing solution, P-7G at 23° C. for 6 minutes to form a resist pattern wherein the L/S was 10 μm/10 μm. Thereafter, a copper sulfate plating solution was used to conduct copper electroplating to form a third wiring 106*c* of about 5 μm thickness. The plating resist was peeled by immersing the workpiece in methyl ethyl ketone at room temperature (25° C.) for 1 minute. The seed layer was quick-etched with a solution wherein a product, CPE-700 (trade name) manufactured by Mitsubishi Gas Chemical Company, Inc., was diluted 5 times by immersing and swinging the workpiece therein at 30° C. for 30 seconds, so as to etch and remove this layer to attain the formation of the wiring.

<Step g>

The <step d> to the <step f> were again repeated to form another wiring as an outermost wiring including a build-up layer and external connection terminals 107. Finally, a solder resist 109 was formed and then the external connection terminals 107 and the semiconductor chip connection terminals were subjected to gold plating treatment to produce a fan-in type semiconductor chip mounting board for BGA.

<Step h>

A flip chip bonder was used to mount semiconductor chips 111 wherein connection bumps 112 were formed, the number of the chips being a desired number, onto a semiconductor chip mounting region of the semiconductor chip mounting board produced in the <step a> to the <step g> while ultrasonic waves were applied thereto (see FIG. 10). An under filler material 113 was injected into gaps between the semiconductor chip mounting board and the semiconductor chips from an end of each of the semiconductor chips, and then an oven was used to subject the workpiece to primary curing at 80° C. for 1 hour and secondary curing at 150° C. for 4 hours. Next, a N$_2$ reflow machine was used to melt-bond lead/tin eutectic solder balls 114 each having a diameter of 0.45 mm onto the external connection terminals 107. Finally, a dicer into which a blade having a width of 200 μm was fitted was used to cut the semiconductor chip mounted board. In this way and the same ways, semiconductor packages were produced, each of which is illustrated in FIG. 11.

Example 2

Fan-in type semiconductor chip mounting boards for GBA and semiconductor packages were each produced in the same way as in Example 1 except the following: after the crystals of the copper oxide formed on the second wiring 106*b* surface by immersing the surface into the acidic 20 g/L sulfuric acid solution in the <step d-2> were selectively removed to form the irregularities on the copper surface, and before the build-up layer 104 was formed in the <step d-3>, a coupling treatment step was conducted in which the second wiring 106*b* surface was washed with water for 1 minute, immersed in an aqueous 0.5% by mass solution of γ-aminopropyltriethoxysilane at 30° C. for 1 minute, further washed with water for 1 minute, and dried at 85° C. for 30 minutes.

Example 3

Fan-in type semiconductor chip mounting boards for BGA and semiconductor packages were each produced in the same way as in Example 1 except the following: after the crystals of the copper oxide formed on the second wiring 106*b* surface by immersing the surface into the acidic solution of the 20 g/L sulfuric acid in the <step d-2> were selectively removed to form the irregularities on the copper surface, and before the build-up layer 104 was formed in the <step d-3>, an azole treatment step was conducted in which the second wiring 106*b* surface was washed with water for 1 minute, immersed in an aqueous 0.5% by mass solution of 2-methylimidazole, the pH of which was adjusted to 6.5 with a sulfuric acid solution, at 30° C. for 1 minute, further washed with water for 1 minute, and dried at 85° C. for 30 minutes.

Example 4

Fan-in type semiconductor chip mounting boards for BGA and semiconductor packages were each produced in the same way as in Example 1 except the following: after the crystals of the copper oxide formed on the second wiring 106*b* surface by immersing the surface into the acidic solution of the 20 g/L sulfuric acid in the <step d-2> were selectively removed to form the irregularities on the copper surface, and before the build-up layer 104 was formed in the <step d-3>, an azole treatment step was conducted in which the second wiring 106*b* surface was washed with water for 1 minute, immersed in an aqueous 0.5% by mass solution of 3,5-dimethylpyrazole, the pH of which was adjusted to 9.5, at 30° C. for 1 minute, further washed with water for 1 minute, and dried at 85° C. for 30 minutes.

Example 5

Fan-in type semiconductor chip mounting boards for BGA and semiconductor packages were each produced in the same way as in Example 1 except the following: after the crystals of the copper oxide formed on the second wiring 106*b* surface by immersing the surface into the acidic solution of the 20 g/L sulfuric acid in the <step d-2> were selectively removed to form the irregularities on the copper surface, and before the build-up layer 104 was formed in the <step d-3>, a treatment step for forming a baser metal than copper was conducted in which the second wiring 106*b* surface was washed with water for 1 minute, immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes.

Example 6

Fan-in type semiconductor chip mounting boards for BGA and semiconductor packages were each produced in the same way as in Example 1 except the following: after the crystals of the copper oxide formed on the second wiring 106*b* surface by immersing the surface into the acidic solution of the 20 g/L sulfuric acid in the <step d-2> were selectively removed to form the irregularities on the copper surface, and before the build-up layer 104 was formed in the <step d-3>, a treatment step for forming a baser metal than copper was conducted in which the second wiring 106*b* surface was washed with water for 1 minute, immersed in an electroless nickel plating solution containing 0.2 g/L of nickel sulfate hexahydrate, 3 g/L of sodium citrate, 3 g/L of boric acid and 10 g/L of sodium hypochlorite, and showing a pH of 9 at 50° C. for 120 seconds, then washed with water for 1 minute, immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes.

Example 7

Fan-in type semiconductor chip mounting boards for BGA and semiconductor packages were each produced in the same way as in Example 1 except the following: after the crystals of the copper oxide formed on the second wiring 106*b* surface by immersing the surface into the acidic solution of the 20 g/L sulfuric acid in the <step d-2> were selectively removed to form the irregularities on the copper surface, and before the build-up layer 104 was formed in the <step d-3>, a treatment step for forming a baser metal than copper was conducted in which the second wiring 106*b* surface was washed with water for 1 minute, immersed in an electroless cobalt plating solution containing 0.2 g/L of cobalt sulfate heptahydrate, 3 g/L of sodium citrate, 3 g/L of boric acid and 10 g/L of sodium hypochlorite, and showing a pH of 8 at 50° C. for 120 seconds, then washed with water for 1 minute, immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes.

Example 8

Fan-in type semiconductor chip mounting boards for BGA and semiconductor packages were each produced in the same way as in Example 1 except the following: after the crystals of the copper oxide formed on the second wiring 106*b* surface by immersing the surface into the acidic solution of the 20 g/L sulfuric acid in the <step d-2> were selectively removed to form the irregularities on the copper surface, and before the build-up layer 104 was formed in the <step d-3>, a treatment step for forming a baser metal than copper was conducted in which the second wiring 106*b* surface was washed with water for 1 minute, immersed in an electroless tin plating solution containing 3 g/L of stannous chloride, 25 g/L of thiourea and 25 g/L of tartaric acid at 30° C. for 15 seconds and further washed with water for 1 minute, and further a coupling treatment step was conducted wherein the surface was immersed in an aqueous 0.5% by mass solution of γ-aminopropyltriethoxysilane at 30° C. for 3 minutes, further washed with water for 1 minute, and then dried at 85° C. for 30 minutes.

Example 9

Fan-in type semiconductor chip mounting boards for BGA and semiconductor packages were each produced in the same way as in Example 1 except the following: after the crystals of the copper oxide formed on the second wiring 106*b* surface by immersing the surface into the acidic solution of the 20 g/L sulfuric acid in the <step d-2> were selectively removed to form the irregularities on the copper surface, and before the build-up layer 104 was formed in the <step d-3>, a treatment step for forming a baser metal than copper was conducted in which the second wiring 106b surface was washed with water for 1 minute, immersed in an electroless tin plating solution containing 3 g/L of stannous chloride, 25 g/L of thiourea and 25 g/L of tartaric acid at 30° C. for 15 seconds and further washed with water for 1 minute, and further an azole treatment step was conducted wherein the surface was immersed in an aqueous 0.5% by mass solution of 3,5-dimethylpyrazole, the pH of which was adjusted to 9.5 with a sodium hydroxide solution, at 30° C. for 1 minute, further washed with water for 1 minute, and then dried at 85° C. for 30 minutes.

Example 10

Fan-in type semiconductor chip mounting boards for BGA and semiconductor packages were each produced in the same way as in Example 1 except the following: after the crystals of the copper oxide formed on the second wiring 106b surface by immersing the surface into the acidic solution of the 20 g/L sulfuric acid in the <step d-2> were selectively removed to form the irregularities on the copper surface, and before the build-up layer 104 was formed in the <step d-3>, a treatment step for forming a baser metal than copper was conducted in which the second wiring 106b surface was washed with water for 1 minute, immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes.

Comparative Example 1

Fan-in type semiconductor chip mounting boards for BGA and semiconductor packages were each produced in the same way as in Example 1 except the following: after the pretreatment in the <step d-1> of the <step d> was conducted, irregularities were formed in the second wiring 106b surface without conducting the displacement palladium plating in the <step d-2>.

Comparative Example 2

Fan-in type semiconductor chip mounting boards for BGA and semiconductor packages were each produced in the same way as in Example 1 except the following: after the pretreatment in the <step d-1> of the <step d> was conducted, the second wiring 106 surface was immersed in an oxidizing treatment solution at 85° C. for 3 minutes without conducting the displacement palladium plating in the <step d-2>, thereby forming copper oxide crystals 0.50 mg/cm² in density on the wiring 106 surface; thereafter, a step was conducted wherein the surface was washed with water for 1 minute, and then immersed in an acidic 20 g/L sulfuric acid solution at 25° C. for 30 seconds, thereby removing the formed copper oxide crystals selectively to form irregularities; and then the surface was washed with water for 5 minutes, and dried at 85° C. for 30 minutes.

Comparative Example 3

Fan-in type semiconductor chip mounting boards for BGA and semiconductor packages were each produced in the same way as in Example 1 except the following: after the pretreatment in the <step d-1> of the <step d> was conducted, the second wiring 106 surface was immersed in an oxidizing treatment solution at 85° C. for 3 minutes without conducting the displacement palladium plating in the <step d-2>, thereby forming copper oxide crystals 0.50 mg/cm² in density on the wiring 106 surface; and thereafter a reducing treatment step was conducted wherein the surface was washed with water for 5 minutes, immersed in a reducing treatment solution, HIST-100D (trade name) manufactured by Hitachi Chemical Co., Ltd., at 40° C. for 3 minutes, further washed with water for 10 minutes, and dried at 85° C. for 30 minutes.

Comparative Example 4

Fan-in type semiconductor chip mounting boards for BGA and semiconductor packages were each produced in the same way as in Example 1 except the following: after the pretreatment in the <step d-1> of the <step d> was conducted, the second wiring 106 surface was immersed in a micro etching agent, MEC ETCH BOND (trade name) manufactured by MEC Co., Ltd., at 40° C. for 1 minute and 30 seconds without conducting the displacement palladium plating, the oxidizing treatment, nor the treatment with the acidic solution in the <step d-2>, and then the surface was washed, immersed in an aqueous 3.6 N sulfuric acid solution at normal temperature for 60 seconds, further washed with water for 5 minutes, and dried at 85° C. for 30 minutes.

Comparative Example 5

Fan-in type semiconductor chip mounting boards for BGA and semiconductor packages were each produced in the same way as in Example 1 except the following: after the pretreatment in the <step d-1> of the <step d> was conducted, the step of the <step d-2> was not conducted, that is, no irregularity-forming-processing was conducted.

Comparative Example 6

Fan-in type semiconductor chip mounting boards for BGA and semiconductor packages were each produced in the same way as in Example 1 except the following: after the pretreatment in the <step d-1> of the <step d> was conducted, in the step of the <step d-2>, only a treatment step for forming a baser metal than copper was conducted wherein the treatment-receiving surface was immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes.

Comparative Example 7

Fan-in type semiconductor chip mounting boards for BGA and semiconductor packages were each produced in the same way as in Example 1 except the following: after the pretreatment in the <step d-1> of the <step d> was conducted, in the step of the <step d-2>, a treatment step for forming a baser metal than copper was conducted wherein the treatment-receiving surface was immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes; and subsequently a coupling treatment step was further conducted wherein the treatment-receiving surface was immersed in an aqueous 0.5% by mass solution of γ-aminopropyltriethoxysilane at 30° C. for 3 minutes, further washed with water for 1 minute, and dried at 85° C. for 30 minutes.

Comparative Example 8

Fan-in type semiconductor chip mounting boards for BGA and semiconductor packages were each produced in the same way as in Example 1 except the following: after the pretreatment in the <step d-1> of the <step d> was conducted, in the step of the <step d-2>, a treatment step for forming a baser metal than copper was conducted wherein the treatment-receiving surface was immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes; and subsequently an azole treatment step was further conducted wherein the treatment-receiving surface was immersed in an aqueous 0.5% by mass solution of 3,5-dimethylpyrazole at 30° C. for 3 minutes, further washed with water for 1 minute, and dried at 85° C. for 30 minutes.

Comparative Example 9

Fan-in type semiconductor chip mounting boards for BGA and semiconductor packages were each produced in the same way as in Example 1 except the following: after the pretreatment in the <step d-1> of the <step d> was conducted, in the step of the <step d-2>, a coupling treatment step was conducted wherein the treatment-receiving surface was immersed in an aqueous 0.5% by mass solution of γ-aminopropyltriethoxysilane at 30° C. for 3 minutes, further washed with water for 1 minute, and dried at 85° C. for 30 minutes.

Comparative Example 10

Fan-in type semiconductor chip mounting boards for BGA and semiconductor packages were each produced in the same way as in Example 1 except the following: after the pretreatment in the <step d-1> of the <step d> was conducted, in the step of the <step d-2>, an azole treatment step was conducted wherein the treatment-receiving surface was immersed in an aqueous 0.5% by mass solution of 3,5-dimethylpyrazole, the pH of which was adjusted with a sodium hydroxide solution, at 30° C. for 3 minutes, further washed with water for 1 minute, and dried at 85° C. for 30 minutes.

Comparative Example 11

Fan-in type semiconductor chip mounting boards for BGA and semiconductor packages were each produced in the same way as in Example 1 except the following: after the pretreatment in the <step d-1> of the <step d> was conducted, a treatment step for forming a baser metal than copper was conducted wherein the second wiring 106 surface was immersed in a micro etching agent, MEC ETCH BOND (trade name) manufactured by MEC Co., Ltd., at 40° C. for 1 minute and 30 seconds without conducting the displacement palladium plating, the oxidizing treatment, nor the treatment with the acidic solution in the <step d-2>, and then the surface was washed with water, immersed in a 50 g/L solution of sodium hydroxide at 50° C. for 60 seconds, further washed with water, then immersed in an aqueous 3.6 N solution of sulfuric acid at normal temperature for 60 seconds, further washed with water for 1 minute, then immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes.

Comparative Example 12

Fan-in type semiconductor chip mounting boards for BGA and semiconductor packages were each produced in the same way as in Example 1 except the following: after the pretreatment in the <step d-1> of the <step d> was conducted, a treatment step for forming a baser metal than copper was conducted wherein the second wiring 106 surface was immersed in a micro etching agent, MEC ETCH BOND (trade name) manufactured by MEC Co., Ltd., at 40° C. for 1 minute and 30 seconds without conducting the displacement palladium plating, the oxidizing treatment, nor the treatment with the acidic solution in the <step d-2>, and then the surface was washed with water, immersed in a 50 g/L solution of sodium hydroxide at 50° C. for 60 seconds, further washed with water, then immersed in an aqueous 3.6 N solution of sulfuric acid at normal temperature for 60 seconds, further washed with water for 1 minute, then immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes; and subsequently a coupling treatment step was further conducted wherein the treatment-receiving surface was immersed in an aqueous 0.5% by mass solution of γ-aminopropyltriethoxysilane at 30° C. for 3 minutes, further washed with water for 1 minute, and dried at 85° C. for 30 minutes.

Comparative Example 13

Fan-in type semiconductor chip mounting boards for BGA and semiconductor packages were each produced in the same way as in Example 1 except the following: after the pretreatment in the <step d-1> of the <step d> was conducted, a treatment step for forming a baser metal than copper was conducted wherein the second wiring 106 surface was immersed in a micro etching agent, MEC ETCH BOND (trade name) manufactured by MEC Co., Ltd., at 40° C. for 1 minute and 30 seconds without conducting the displacement palladium plating, the oxidizing treatment, nor the treatment with the acidic solution in the <step d-2>, and then the surface was washed with water, immersed in a 50 g/L solution of sodium hydroxide at 50° C. for 60 seconds, further washed with water for 1 minute, then immersed in an aqueous 3.6 N solution of sulfuric acid at normal temperature for 60 seconds, further washed with water, then immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes; and subsequently an azole treatment step was further conducted wherein the treatment-receiving surface was immersed in an aqueous 0.5% by mass solution of 3,5-dimethylpyrazole at 30° C. for 3 minutes, further washed with water for 1 minute, and dried at 85° C. for 30 minutes.

Comparative Example 14

Fan-in type semiconductor chip mounting boards for BGA and semiconductor packages were each produced in the same way as in Example 1 except the following: after the pretreatment in the <step d-1> of the <step d> was conducted, in the step of the <step d-2>, only a treatment step for forming a baser metal than copper was conducted wherein the treatment-receiving surface was immersed in an electroless tin plating solution containing 3 g/L of stannous chloride, 25 g/L of thiourea and 25 g/L of tartaric acid at 30° C. for 15 seconds, further washed with water for 1 minute, dried at 85° C. for 30 minutes, and further subjected to heating treatment at 150° C. for 60 minutes.

Comparative Example 15

Fan-in type semiconductor chip mounting boards for BGA and semiconductor packages were each produced in the same way as in Example 1 except the following: after the pretreatment in the <step d-1> of the <step d> was conducted, in the <step d-2>, the second wiring 106b was immersed in a displacement palladium plating solution, SA-100 (trade name) manufactured by Hitachi Chemical Co., Ltd., at 30° C. for 3 minutes to apply plating of palladium, which is a nobler metal than copper, thereto in an amount of 1.0 µmol/dm$^2$, washed with water for 1 minute, and further immersed at 50° C. for 3 minutes in an oxidizing treatment solution wherein 15 g/L of sodium hypochlorite was added to an alkaline solution containing 10 g/L of trisodium phosphate and 25 g/L of potassium hydroxide, so as to form copper oxide crystals 0.07 mg/cm$^2$ in density on the second wiring 106b surface; and subsequently a reducing treatment was conducted wherein the surface was washed with water for 1 minute, then immersed in a reducing treatment solution, HIST-100D (trade name) manufactured by Hitachi Chemical Co., Ltd., at 40° C. for 3 minutes without conducting any treatment with an acidic 20 g/L sulfuric acid solution, further washed with water for 10 minutes, and dried at 85° C. for 30 minutes.

Comparative Example 16

Fan-in type semiconductor chip mounting boards for BGA and semiconductor packages were each produced in the same way as in Example 1 except the following: after the pretreatment in the <step d-1> of the <step d> was conducted, in the <step d-2>, the second wiring 106b was immersed in a displacement palladium plating solution, SA-100 (trade name) manufactured by Hitachi Chemical Co., Ltd., at 30° C. for 3 minutes to apply plating of palladium, which is a nobler metal than copper, thereto in an amount of 1.0 mmol/dm$^2$, washed with water for 1 minute, and further immersed at 50° C. for 3 minutes in an oxidizing treatment solution wherein 15 g/L of sodium hypochlorite was added to an alkaline solution containing 10 g/L of trisodium phosphate and 25 g/L of potassium hydroxide, so as to form copper oxide crystals 0.07 mg/cm$^2$ in density on the second wiring 106b surface; subsequently a reducing treatment was conducted wherein the surface was washed with water for 1 minute, and then immersed in a reducing treatment solution, HIST-100D (trade name) manufactured by Hitachi Chemical Co., Ltd., at 40° C. for 3 minutes without conducting any treatment with an acidic 20 g/L sulfuric acid solution; and subsequently an azole treatment step was conducted wherein the surface was washed with water for 1 minute, immersed in an aqueous 0.5% by mass solution of 3,5-dimethylpyrazole, the pH of which was adjusted to 9.5 with an aqueous sodium hydroxide solution, at 30° C. for 3 minutes, further washed with water for 1 minute, and then dried at 85° C. for 30 minutes.

Comparative Example 17

Fan-in type semiconductor chip mounting boards for BGA and semiconductor packages were each produced in the same way as in Example 1 except the following: after the pretreatment in the <step d-1> of the <step d> was conducted, in the <step d-2>, the second wiring 106b was immersed in a displacement palladium plating solution, SA-100 (trade name) manufactured by Hitachi Chemical Co., Ltd., at 30° C. for 3 minutes to apply plating of palladium, which is a nobler metal than copper, thereto in an amount of 1.0 mmol/dm$^2$, washed with water for 1 minute, and further immersed at 50° C. for 3 minutes in an oxidizing treatment solution wherein 15 g/L of sodium hypochlorite was added to an alkaline solution containing 10 g/L of trisodium phosphate and 25 g/L of potassium hydroxide, so as to form copper oxide crystals 0.07 mg/cm$^2$ in density on the second wiring 106b surface; subsequently a reducing treatment was conducted wherein the surface was washed with water for 1 minute, and then immersed in a reducing treatment solution, HIST-100D (trade name) manufactured by Hitachi Chemical Co., Ltd., at 40° C. for 3 minutes without conducting any treatment with an acidic 20 g/L sulfuric acid solution; and subsequently a treatment step for forming a baser metal than copper was conducted in which the surface was washed with water for 1 minute, immersed in an electroless tin plating solution containing 3 g/L of stannous chloride, 25 g/L of thiourea and 25 g/L of tartaric acid at 30° C. for 15 seconds, further washed with water for 1 minute, and then dried at 85° C. for 30 minutes.

Comparative Example 18

Fan-in type semiconductor chip mounting boards for BGA and semiconductor packages were each produced in the same way as in Example 1 except the following: after the pretreatment in the <step d-1> of the <step d> was conducted, in the <step d-2>, the second wiring 106b was immersed in a displacement palladium plating solution, SA-100 (trade name) manufactured by Hitachi Chemical Co., Ltd., at 30° C. for 3 minutes to apply plating of palladium, which is a nobler metal than copper, thereto in an amount of 1.0 µmol/dm$^2$, washed with water for 1 minute, and further immersed at 50° C. for 3 minutes in an oxidizing treatment solution wherein 15 g/L of sodium hypochlorite was added to an alkaline solution containing 10 g/L of trisodium phosphate and 25 g/L of potassium hydroxide, so as to form copper oxide crystals 0.07 mg/cm$^2$ in density on the second wiring 106b surface; subsequently a reducing treatment was conducted wherein the surface was washed with water for 1 minute, and then immersed in a reducing treatment solution, HIST-100D (trade name) manufactured by Hitachi Chemical Co., Ltd., at 40° C. for 3 minutes without conducting any treatment with an acidic 20 g/L sulfuric acid solution, and the surface was further washed with water for 10 minutes, and dried at 85° C. for 30 minutes; and subsequently a treatment step for forming a baser metal than copper was conducted in which the surface was washed with water for 1 minute, immersed in an electroless tin plating solution containing 3 g/L of stannous chloride, 25 g/L of thiourea and 25 g/L of tartaric acid at 30° C. for 15 seconds, further washed with water for 1 minute, dried at 85° C. for 30 minutes, and further subjected to heating treatment at 150° C. for 60 minutes.

Example 11

In order to evaluate the adhesiveness between a copper surface subjected to the copper surface treatment of the invention and a build-up resin, the bonding property between the copper surface and a solder resist, and the cleanliness, the smoothness, the glossiness and the form of the surface, a shiny surface of an electrolytic copper foil piece, GTS-18 (trade name) manufactured by Furukawa Circuit Foil Co., Ltd., 18 µm in thickness was subjected to electroplating to form an electrolytic copper foil piece 50 µm in thickness. Thereafter, the foil piece was cut into sub-pieces each having a size of 5 cm×8 cm (for a bonding test, for evaluating the cleanliness of the copper surface, for evaluating the smoothness of the copper surface, for evaluating the form of the copper surface, and for evaluating the glossiness of the copper surface). In accordance with the <step d> of Example 1, the electroplating surface of each of the electrolytic copper foil sub-pieces was subjected to the individual wiring-surface-applied surface treatments (the pre-treatment, the nobler-metal-formation, the oxidizing treatment, and the acidic solution treatment) described in the <step d-1> and the <step d-2>. In this way, test pieces of the electrolytic copper foil were formed.

Example 12

Test pieces of electrolytic copper foil were formed in the same way as in Example 11 except the following: as surface treatments applied to the electrolytic copper foil, surface treatments equivalent to the individual wiring-surface-applied surface treatments described in Example 2 (the pre-treatment, the nobler-metal-formation, the oxidizing treatment, the acidic solution treatment, and the coupling treatment) were conducted.

Example 13

Test pieces of electrolytic copper foil were formed in the same way as in Example 11 except the following: as surface treatments applied to the electrolytic copper foil, surface treatments equivalent to the individual wiring-surface-applied surface treatments described in Example 3 (the pre-treatment, the nobler-metal-formation, the oxidizing treatment, the acidic solution treatment, and the azole treatment with imidazole) were conducted.

Example 14

Test pieces of electrolytic copper foil were formed in the same way as in Example 11 except the following: as surface treatments applied to the electrolytic copper foil, surface treatments equivalent to the individual wiring-surface-applied surface treatments described in Example 4 (the pre-treatment, the nobler-metal-formation, the oxidizing treatment, the acidic solution treatment, and the azole treatment with pyrazole) were conducted.

Example 15

Test pieces of electrolytic copper foil were formed in the same way as in Example 11 except the following: as surface treatments applied to the electrolytic copper foil, surface treatments equivalent to the individual wiring-surface-applied surface treatments described in Example 5 (the pre-treatment, the nobler-metal-formation, the oxidizing treatment, the acidic solution treatment, and the electroless tin plating treatment) were conducted.

Example 16

Test pieces of electrolytic copper foil were formed in the same way as in Example 11 except the following: as surface treatments applied to the electrolytic copper foil, surface treatments equivalent to the individual wiring-surface-applied surface treatments described in Example 6 (the pre-treatment, the nobler-metal-formation, the oxidizing treatment, the acidic solution treatment, the electroless nickel plating treatment and the electroless tin plating treatment) were conducted.

Example 17

Test pieces of electrolytic copper foil were formed in the same way as in Example 11 except the following: as surface treatments applied to the electrolytic copper foil, surface treatments equivalent to the individual wiring-surface-applied surface treatments described in Example 7 (the pre-treatment, the nobler-metal-formation, the oxidizing treatment, the electroless cobalt plating treatment and the electroless tin plating treatment) were conducted.

Example 18

Test pieces of electrolytic copper foil were formed in the same way as in Example 11 except the following: as surface treatments applied to the electrolytic copper foil, surface treatments equivalent to the individual wiring-surface-applied surface treatments described in Example 8 (the pre-treatment, the nobler-metal-formation, the oxidizing treatment, the acidic solution treatment, the electroless tin plating treatment and the coupling treatment) were conducted.

Example 19

Test pieces of electrolytic copper foil were formed in the same way as in Example 11 except the following: as surface treatments applied to the electrolytic copper foil, surface treatments equivalent to the individual wiring-surface-applied surface treatments described in Example 9 (the pre-treatment, the nobler-metal-formation, the oxidizing treatment, the acidic solution treatment, the electroless tin plating treatment and the azole treatment with pyrazole) were conducted.

Example 20

Test pieces of electrolytic copper foil were formed in the same way as in Example 11 except the following: as surface treatments applied to the electrolytic copper foil, surface treatments equivalent to the individual wiring-surface-applied surface treatments described in Example 10 (the pre-treatment, the nobler-metal-formation, the oxidizing treatment, the acidic solution treatment, the electroless tin plating treatment and the 150° C. heating treatment) were conducted.

Comparative Example 19

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 1 (the pre-treatment, the oxidizing treatment, and the acidic solution treatment) were conducted.

Comparative Example 20

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 2 (the pre-treatment, the oxidizing treatment at 85° C., and the acidic solution treatment) were conducted.

Comparative Example 21

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 3 (the pre-treatment, the oxidizing treatment at 85° C., and the reducing treatment) were conducted.

Comparative Example 22

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 4 (the pre-treatment, and the etching treatment) were conducted.

Comparative Example 23

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 5 (the pre-treatment and none-irregularities-forming treatment) were conducted.

Comparative Example 24

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 6 (the pre-treatment, and the electroless tin plating treatment) were conducted.

Comparative Example 25

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 7 (the pre-treatment, the electroless tin plating treatment, and the coupling treatment) were conducted.

Comparative Example 26

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 8 (the pre-treatment, the electroless tin plating treatment, and the azole treatment with pyrazole) were conducted.

Comparative Example 27

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 9 (the pre-treatment, and the coupling treatment) were conducted.

Comparative Example 28

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 10 (the pre-treatment, and the azole treatment with pyrazole) were conducted.

Comparative Example 29

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 11 (the pre-treatment, the etching treatment, and the electroless tin plating) were conducted.

Comparative Example 30

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 12 (the pre-treatment, the etching treatment, the electroless tin plating, and the coupling treatment) were conducted.

Comparative Example 31

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 13 (the pre-treatment, the etching treatment, the electroless tin plating, and the azole treatment with pyrazole) were conducted.

Comparative Example 32

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 14 (the pre-treatment, the electroless tin plating treatment, and the 150° C. heating treatment) were conducted.

Comparative Example 33

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 15 (the pre-treatment, the nobler-metal treatment, the oxidizing treatment, and the reducing treatment) were conducted.

Comparative Example 34

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 16 (the pre-treatment, the nobler-metal treatment, the oxidizing treatment, the reducing treatment, and the azole treatment with pyrazole) were conducted.

Comparative Example 35

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 17 (the pre-treatment, the nobler-metal treatment, the oxidizing treatment, the reducing treatment, and the electroless tin plating treatment) were conducted.

Comparative Example 36

Test pieces of electrolytic copper foil were formed in the same way as in Example 11 except the following: as surface treatments applied to the electrolytic copper foil, surface treatments equivalent to the individual wiring-surface-applied surface treatments described in Comparative Example 18 (the pre-treatment, the nobler-metal treatment, the oxidizing treatment, the reducing treatment, the electroless tin plating treatment, and the 150° C. heating treatment) were conducted.

Example 21

Figure 13:
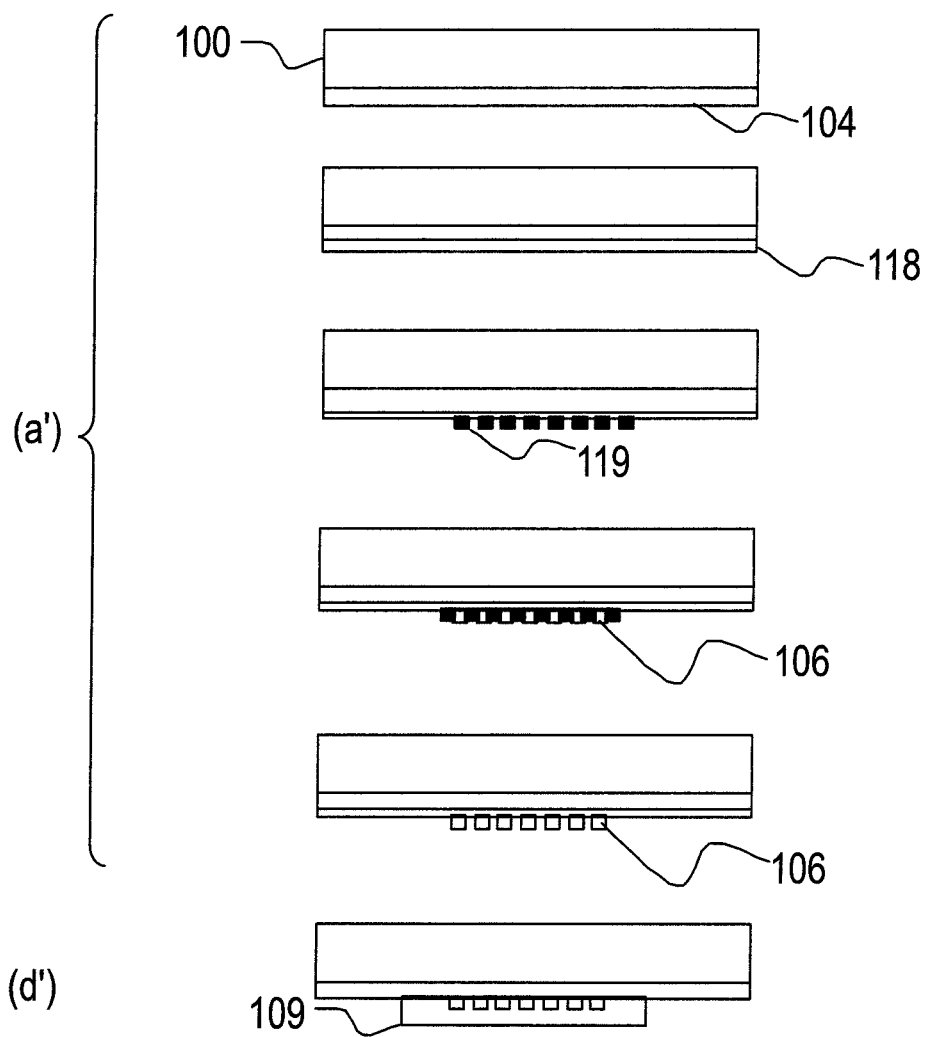
FIG. 13 is a process chart illustrating an example of a process according to the invention for producing each evaluating board for a test.
Figure 14:
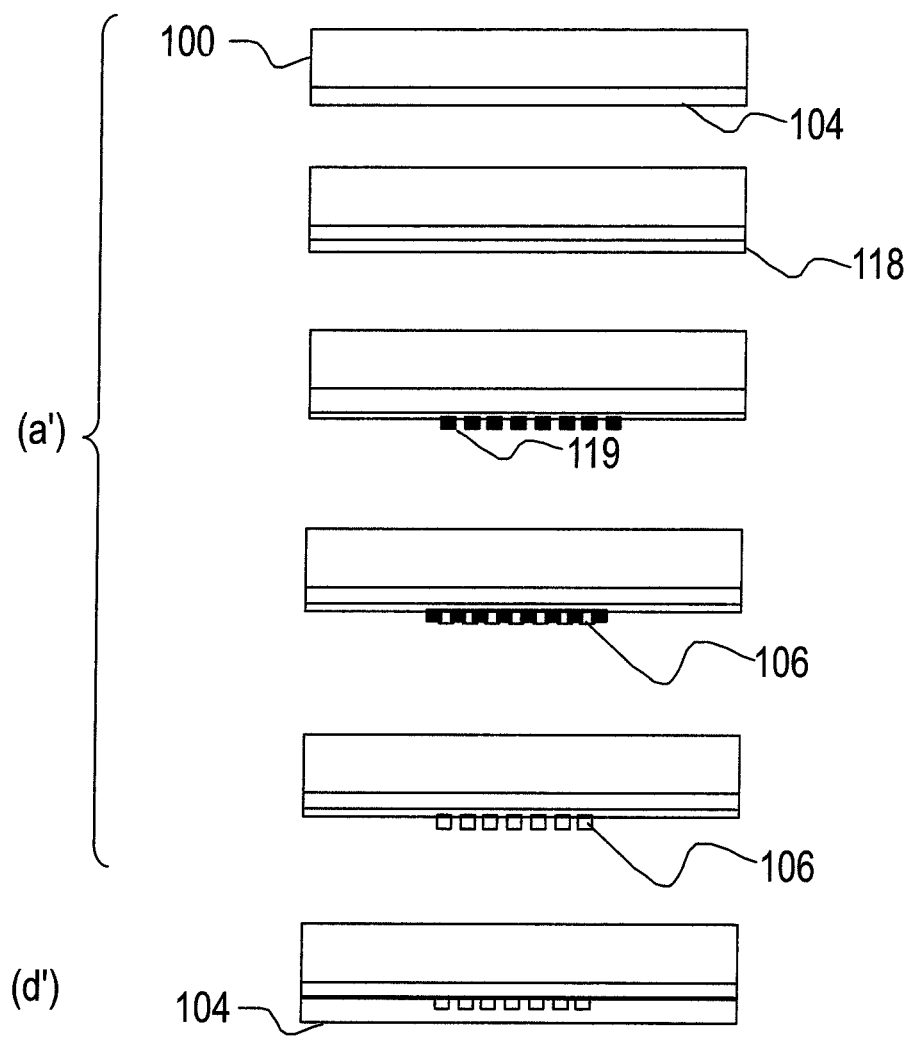
FIG. 14 is a process chart illustrating an example of a process according to the invention for producing each evaluating board for a test.

In order to evaluate advantageous effects based on the copper surface treatment of the invention in the <step d>, each evaluating board was formed as described below, and the insulation resistance between its wiring pieces, and the PCT resistance were evaluated. FIGS. 13 and 14 are process charts which schematically illustrate the process for producing the evaluating board. The <step a'> and the <step d'> therein correspond to the <step a> and the <step d> described with reference to FIG. 9, respectively.
<Step a'>
As a core substrate 100 illustrated in FIGS. 13 and 14, prepared was a sodium glass substrate (thermal expansion coefficient: 11 ppm/° C.) of 0.4 mm thickness. An interlayer dielectric 104 was formed on a single surface thereof as follows: by spin coating, an insulating varnish of a cyanate ester resin composition was painted onto the glass substrate at 1500 rpm to form a resin layer of 20 µm thickness; and the workpiece was then heated from normal temperature (25° C.) to 230° C. at a temperature-raising rate of 6° C./min., and kept at 230° C. for 80 minutes to set the resin thermally, thereby forming the interlayer dielectric 104. Thereafter, through the <step a> of Example 1, only a copper thin film 118 of 200 nm thickness was formed.

Figure 15:
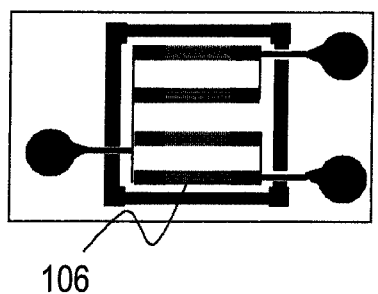
FIG. 15 is a plan view illustrating an evaluating board, for an electrolytic corrosion test, that was formed in a working example.
Figure 16:
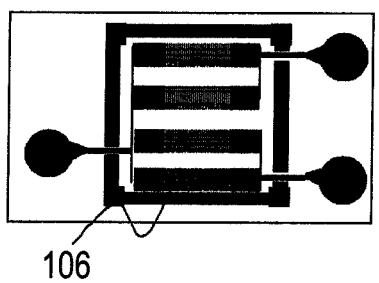
FIG. 16 is a plan view illustrating an evaluating board, for an electrolytic corrosion test, that was formed in the working example.

Next, by spin coating, a plating resist, PMER P-LA900PM (trade name) manufactured by Tokyo Ohka Kogyo Co., Ltd., was painted on the copper foil film to form a plating resist layer of 10 µm thickness. Next, the plating resist layer was exposed to light at 1000 ml/cm², and then immersed in a PMER developing solution, P-7G at 23° C. for 6 minutes to form a resist pattern 119. Thereafter, a copper sulfate plating solution was used to conduct copper electroplating to form a wiring 106 of about 5 µm thickness. The plating resist was peeled by immersing the workpiece in methyl ethyl ketone at room temperature (25° C.) for 1 minute. The seed layer was quick-etched with a solution wherein a product, CPE-700 (trade name) manufactured by Mitsubishi Gas Chemical Company, Inc., was diluted 5 times by immersing and swinging the workpiece therein at 30° C. for 30 seconds, so as to etch and remove this layer to attain the formation of the wiring.
<Step d'>
In accordance with the <step d> of Example 1, the wiring 106 formed in the <step a'> was subjected to the individual surface treatments described in the <step d-1> and the <step d-2> (the pre-treatment, the nobler-metal-formation, the oxidizing treatment, and the acidic solution treatment). Thereafter, an interlayer dielectric (build-up layer) 104 illustrated in FIG. 13 and a solder resist 109 illustrated in FIG. 14 were each formed. In this way and the same ways, thirty two evaluation boards illustrated in FIG. 15 wherein the L/S=5 µm/5 µm were produced, as well as thirty two evaluation boards illustrated in FIG. 16 wherein the L/S was 10 µm/10 µm.

Example 22

Evaluation boards were produced in the same way as in Example 21 except the following: as the individual surface treatments in the <step d'>, surface treatments equivalent to the individual wiring-surface-applied surface treatments described in Example 2 (the pre-treatment, the nobler-metal-formation, the oxidizing treatment, the acidic solution treatment, and the coupling treatment) were conducted.

Example 23

Evaluation boards were produced in the same way as in Example 21 except the following: as the individual surface treatments in the <step d'>, surface treatments equivalent to the individual wiring-surface-applied surface treatments described in Example 3 (the pre-treatment, the nobler-metal-formation, the oxidizing treatment, the acidic solution treatment, and the azole treatment with imidazole) were conducted.

Example 24

Evaluation boards were produced in the same way as in Example 21 except the following: as the individual surface treatments in the <step d'>, surface treatments equivalent to the individual wiring-surface-applied surface treatments described in Example 4 (the pre-treatment, the nobler-metal-formation, the oxidizing treatment, the acidic solution treatment, and the azole treatment with pyrazole) were conducted.

Example 25

Evaluation boards were produced in the same way as in Example 21 except the following: as the individual surface treatments in the <step d'>, surface treatments equivalent to the individual wiring-surface-applied surface treatments described in Example 5 (the pre-treatment, the nobler-metal-formation, the oxidizing treatment, the acidic solution treatment, and the electroless tin plating treatment) were conducted.

Example 26

Evaluation boards were produced in the same way as in Example 21 except the following: as the individual surface treatments in the <step d'>, surface treatments equivalent to the individual wiring-surface-applied surface treatments described in Example 6 (the pre-treatment, the nobler-metal-formation, the oxidizing treatment, the acidic solution treatment, the electroless nickel plating treatment, and the electroless tin plating treatment) were conducted.

Example 27

Evaluation boards were produced in the same way as in Example 21 except the following: as the individual surface treatments in the <step d'>, surface treatments equivalent to the individual wiring-surface-applied surface treatments described in Example 7 (the pre-treatment, the nobler-metal-formation, the oxidizing treatment, the acidic solution treatment, the electroless cobalt plating treatment, and the electroless tin plating treatment) were conducted.

Example 28

Evaluation boards were produced in the same way as in Example 21 except the following: as the individual surface treatments in the <step d'>, surface treatments equivalent to the individual wiring-surface-applied surface treatments described in Example 8 (the pre-treatment, the nobler-metal-formation, the oxidizing treatment, the acidic solution treatment, the electroless tin plating treatment, and the coupling treatment) were conducted.

Example 29

Evaluation boards were produced in the same way as in Example 21 except the following: as the individual surface treatments in the <step d'>, surface treatments equivalent to the individual wiring-surface-applied surface treatments described in Example 9 (the pre-treatment, the nobler-metal-formation, the oxidizing treatment, the acidic solution treatment, the electroless tin plating treatment, and the azole treatment with pyrazole) were conducted.

Example 30

Evaluation boards were produced in the same way as in Example 21 except the following: as the individual surface treatments in the <step d'>, surface treatments equivalent to the individual wiring-surface-applied surface treatments described in Example 10 (the pre-treatment, the nobler-metal-formation, the oxidizing treatment, the acidic solution treatment, the electroless tin plating treatment, and the 150° C. heating treatment) were conducted.

Comparative Example 37

Evaluation boards were produced in the same way as in Example 21 except the following: as the individual surface treatments in the <step d'>, surface treatments equivalent to the individual wiring-surface-applied surface treatments described in Comparative Example 1 (the pre-treatment, the oxidizing treatment, and the acidic solution treatment) were conducted.

Comparative Example 38

Evaluation boards were produced in the same way as in Example 21 except the following: as the individual surface treatments in the <step d'>, surface treatments equivalent to the individual wiring-surface-applied surface treatments described in Comparative Example 2 (the pre-treatment, the oxidizing treatment at 85° C., and the acidic solution treatment) were conducted.

Comparative Example 39

Evaluation boards were produced in the same way as in Example 21 except the following: as the individual surface treatments in the <step d'>, surface treatments equivalent to the individual wiring-surface-applied surface treatments described in Comparative Example 3 (the pre-treatment, the oxidizing treatment at 85° C., and the reducing treatment) were conducted.

Comparative Example 40

Evaluation boards were produced in the same way as in Example 21 except the following: as the individual surface treatments in the <step d'>, surface treatments equivalent to the individual wiring-surface-applied surface treatments described in Comparative Example 4 (the pre-treatment, and the etching treatment) were conducted.

Comparative Example 41

Evaluation boards were produced in the same way as in Example 21 except the following: as the individual surface treatments in the <step d'>, surface treatments equivalent to the individual wiring-surface-applied surface treatments described in Comparative Example 5 (the pre-treatment, and none-irregularity-forming treatment) were conducted.

Comparative Example 42

Evaluation boards were produced in the same way as in Example 21 except the following: as the individual surface treatments in the <step d'>, surface treatments equivalent to the individual wiring-surface-applied surface treatments described in Comparative Example 6 (the pre-treatment, and the electroless tin plating treatment) were conducted.

Comparative Example 43

Evaluation boards were produced in the same way as in Example 21 except the following: as the individual surface treatments in the <step d'>, surface treatments equivalent to the individual wiring-surface-applied surface treatments described in Comparative Example 7 (the pre-treatment, the electroless tin plating treatment, and the coupling treatment) were conducted.

Comparative Example 44

Evaluation boards were produced in the same way as in Example 21 except the following: as the individual surface treatments in the <step d'>, surface treatments equivalent to the individual wiring-surface-applied surface treatments described in Comparative Example 8 (the pre-treatment, the electroless tin plating treatment, and the azole treatment with pyrazole) were conducted.

Comparative Example 45

Evaluation boards were produced in the same way as in Example 21 except the following: as the individual surface treatments in the <step d'>, surface treatments equivalent to the individual wiring-surface-applied surface treatments described in Comparative Example 9 (the pre-treatment, and the coupling treatment) were conducted.

Comparative Example 46

Evaluation boards were produced in the same way as in Example 21 except the following: as the individual surface treatments in the <step d'>, surface treatments equivalent to the individual wiring-surface-applied surface treatments described in Comparative Example 10 (the pre-treatment, and the azole treatment with pyrazole) were conducted.

Comparative Example 47

Evaluation boards were produced in the same way as in Example 21 except the following: as the individual surface treatments in the <step d'>, surface treatments equivalent to the individual wiring-surface-applied surface treatments described in Comparative Example 11 (the pre-treatment, the etching treatment, and the electroless tin plating treatment) were conducted.

Comparative Example 48

Evaluation boards were produced in the same way as in Example 21 except the following: as the individual surface treatments in the <step d'>, surface treatments equivalent to the individual wiring-surface-applied surface treatments described in Comparative Example 12 (the pre-treatment, the etching treatment, the electroless tin plating treatment, and the coupling treatment) were conducted.

Comparative Example 49

Evaluation boards were produced in the same way as in Example 21 except the following: as the individual surface treatments in the <step d'>, surface treatments equivalent to the individual wiring-surface-applied surface treatments described in Comparative Example 13 (the pre-treatment, the etching treatment, the electroless tin plating treatment, and the azole treatment with pyrazole) were conducted.

Comparative Example 50

Evaluation boards were produced in the same way as in Example 21 except the following: as the individual surface treatments in the <step d'>, surface treatments equivalent to the individual wiring-surface-applied surface treatments described in Comparative Example 14 (the pre-treatment, the electroless tin plating treatment, and the 150° C. heating treatment) were conducted.

Comparative Example 51

Evaluation boards were produced in the same way as in Example 21 except the following: as the individual surface treatments in the <step d'>, surface treatments equivalent to the individual wiring-surface-applied surface treatments described in Comparative Example 15 (the pre-treatment, the nobler metal treatment, the oxidizing treatment, and the reducing treatment) were conducted.

Comparative Example 52

Evaluation boards were produced in the same way as in Example 21 except the following: as the individual surface treatments in the <step d'>, surface treatments equivalent to the individual wiring-surface-applied surface treatments described in Comparative Example 16 (the pre-treatment, the nobler metal treatment, the oxidizing treatment, the reducing treatment, and the azole treatment with pyrazole) were conducted.

Comparative Example 53

Evaluation boards were produced in the same way as in Example 21 except the following: as the individual surface treatments in the <step d'>, surface treatments equivalent to the individual wiring-surface-applied surface treatments described in Comparative Example 17 (the pre-treatment, the nobler metal treatment, the oxidizing treatment, the reducing treatment, and the electroless tin plating treatment) were conducted.

Comparative Example 54

Evaluation boards were produced in the same way as in Example 21 except the following: as the individual surface treatments in the <step d'>, surface treatments equivalent to the individual wiring-surface-applied surface treatments described in Comparative Example 18 (the pre-treatment, the nobler metal treatment, the oxidizing treatment, the reducing treatment, the electroless tin plating treatment, and the 150° C. heating treatment) were conducted.

Example 31

In order to evaluate, at the time of using the copper surface treatment of the invention as a pre-treatment for the formation of a resist pattern, the resist-pattern forming performance and the wiring forming performance thereof, each evaluating board was produced as described below. FIGS. 13 and 14 are process charts which schematically illustrate the process for producing the evaluating board. The <step a'> and the <step d'> therein correspond to the <step a> and the <step d> described with reference to FIG. 9, respectively.
<Step a'>
As a core substrate 100 illustrated in FIGS. 13 and 14, prepared was a sodium glass substrate (thermal expansion coefficient: 11 ppm/° C.) of 0.4 mm thickness. An interlayer dielectric 104 was formed on a single surface thereof as follows: an insulating varnish of a cyanate ester resin composition was painted by spin coating, onto the glass substrate at 1500 rpm, to form a resin layer of 20 μm thickness; and the workpiece was then heated from normal temperature (25° C.) to 230° C. at a temperature-raising rate of 6° C./min., and kept at 230° C. for 80 minutes to set the resin thermally, thereby forming the interlayer dielectric 104. Thereafter, through the <step a> of Example 1, only a copper thin film 118 was formed.

Furthermore, in accordance with the <step d> in Example 1, the workpiece was subjected to the individual surface treatments described in the <step d-1> and the <step d-2> (the pre-treatment, the nobler-metal-formation, the oxidizing treatment, and the acidic solution treatment).

Next, a plating resist, PMER P-LA900PM (trade name) manufactured by Tokyo Ohka Kogyo Co., Ltd., was painted by spin coating, on the copper-surface-treated copper foil film, to form a plating resist layer of 10 μm thickness. Next, the plating resist layer was exposed to light at 1000 mJ/cm², and then immersed in a PMER developing solution, P-7G; at 23° C. for 6 minutes to form a resist pattern 119. Thereafter, a copper sulfate plating solution was used to conduct copper electroplating to form a wiring 106 of about 5 μm thickness. The plating resist was peeled by immersing the workpiece in methyl ethyl ketone at room temperature (25° C.) for 1 minute. The seed layer was quick-etched with a solution wherein a product, CPE-700 (trade name) manufactured by Mitsubishi Gas Chemical Company, Inc., was diluted 5 times by immersing and swinging the workpiece therein at 30° C. for 30 seconds, so as to etch and remove this layer to attain the formation of the wiring 106. In this way and the same ways, thirty two Evaluation boards illustrated in FIG. 15 wherein the L/S=5 μm/5 μm were produced, as well as thirty two evaluation boards illustrated in FIG. 16 wherein the L/S was 10 μm/10 μm.

Example 32

Evaluation boards were produced in the same way as in Example 31 except the following: as the individual surface treatments in the <step a'>, surface treatments equivalent to the individual wiring-surface-applied surface treatments described in Example 2 (the pre-treatment, the nobler-metal-formation, the oxidizing treatment, the acidic solution treatment, and the coupling treatment) were conducted.

Example 33

Evaluation boards were produced in the same way as in Example 31 except the following: as the individual surface treatments in the <step a'>, surface treatments equivalent to the individual wiring-surface-applied surface treatments described in Example 3 (the pre-treatment, the nobler-metal-formation, the oxidizing treatment, the acidic solution treatment, and the azole treatment with imidazole) were conducted.

Example 34

Evaluation boards were produced in the same way as in Example 31 except the following: as the individual surface treatments in the <step a'>, surface treatments equivalent to the individual wiring-surface-applied surface treatments described in Example 4 (the pre-treatment, the nobler-metal-formation, the oxidizing treatment, the acidic solution treatment, and the azole treatment with pyrazole) were conducted.

Example 35

Evaluation boards were produced in the same way as in Example 31 except the following: as the individual surface treatments in the <step a'>, surface treatments equivalent to the individual wiring-surface-applied surface treatments described in Example 5 (the pre-treatment, the nobler-metal-formation, the oxidizing treatment, the acidic solution treatment, and the electroless tin plating treatment) were conducted.

Example 36

Evaluation boards were produced in the same way as in Example 31 except the following: as the individual surface treatments in the <step a'>, surface treatments equivalent to the individual wiring-surface-applied surface treatments described in Example 6 (the pre-treatment, the nobler-metal-formation, the oxidizing treatment, the acidic solution treatment, the electroless nickel plating treatment, and the electroless tin plating treatment) were conducted.

Example 37

Evaluation boards were produced in the same way as in Example 31 except the following: as the individual surface treatments in the <step a'>, surface treatments equivalent to the individual wiring-surface-applied surface treatments described in Example 7 (the pre-treatment, the nobler-metal-formation, the oxidizing treatment, the acidic solution treatment, the electroless cobalt plating treatment, and the electroless tin plating treatment) were conducted.

Example 38

Evaluation boards were produced in the same way as in Example 31 except the following: as the individual surface treatments in the <step a'>, surface treatments equivalent to the individual wiring-surface-applied surface treatments described in Example 8 (the pre-treatment, the nobler-metal-formation, the oxidizing treatment, the acidic solution treatment, the electroless tin plating treatment, and the coupling treatment) were conducted.

Example 39

Evaluation boards were produced in the same way as in Example 31 except the following: as the individual surface treatments in the <step a'>, surface treatments equivalent to the individual wiring-surface-applied surface treatments described in Example 9 (the pre-treatment, the nobler-metal-formation, the oxidizing treatment, the acidic solution treatment, the electroless tin plating treatment, and the azole treatment with pyrazole) were conducted.

Example 40

Evaluation boards were produced in the same way as in Example 31 except the following: as the individual surface treatments in the <step a'>, surface treatments equivalent to the individual wiring-surface-applied surface treatments described in Example 10 (the pre-treatment, the nobler-metal-formation, the oxidizing treatment, the acidic solution treatment, the electroless tin plating treatment, and the 150° C. heating treatment) were conducted.

Comparative Example 55

Evaluation boards were produced in the same way as in Example 31 except the following: as the individual surface treatments in the <step a'>, surface treatments equivalent to the individual wiring-surface-applied surface treatments described in Comparative Example 1 (the pre-treatment, the oxidizing treatment, and the acidic solution treatment) were conducted.

Comparative Example 56

Evaluation boards were produced in the same way as in Example 31 except the following: as the individual surface treatments in the <step a'>, surface treatments equivalent to the individual wiring-surface-applied surface treatments described in Comparative Example 2 (the pre-treatment, the oxidizing treatment at 85° C., and the acidic solution treatment) were conducted.

Comparative Example 57

Evaluation boards were produced in the same way as in Example 31 except the following: as the individual surface treatments in the <step a'>, surface treatments equivalent to the individual wiring-surface-applied surface treatments described in Comparative Example 3 (the pre-treatment, the oxidizing treatment at 85° C., and the reducing treatment) were conducted.

Comparative Example 58

Evaluation boards were produced in the same way as in Example 31 except the following: as the individual surface treatments in the <step a'>, surface treatments equivalent to the individual wiring-surface-applied surface treatments described in Comparative Example 4 (the pre-treatment, and the etching treatment) were conducted.

Comparative Example 59

Evaluation boards were produced in the same way as in Example 31 except the following: as the individual surface treatments in the <step a'>, surface treatments equivalent to the individual wiring-surface-applied surface treatments described in Comparative Example 5 (the pre-treatment, and none-irregularity-forming treatment) were conducted.

Comparative Example 60

Evaluation boards were produced in the same way as in Example 31 except the following: as the individual surface treatments in the <step a'>, surface treatments equivalent to the individual wiring-surface-applied surface treatments described in Comparative Example 6 (the pre-treatment, and the electroless tin plating treatment) were conducted.

Comparative Example 61

Evaluation boards were produced in the same way as in Example 31 except the following: as the individual surface treatments in the <step a'>, surface treatments equivalent to the individual wiring-surface-applied surface treatments described in Comparative Example 7 (the pre-treatment, the electroless tin plating treatment, and the coupling treatment) were conducted.

Comparative Example 62

Evaluation boards were produced in the same way as in Example 31 except the following: as the individual surface treatments in the <step a'>, surface treatments equivalent to the individual wiring-surface-applied surface treatments described in Comparative Example 8 (the pre-treatment, the electroless tin plating treatment, and the azole treatment with pyrazole) were conducted.

Comparative Example 63

Evaluation boards were produced in the same way as in Example 31 except the following: as the individual surface treatments in the <step a'>, surface treatments equivalent to the individual wiring-surface-applied surface treatments described in Comparative Example 9 (the pre-treatment, and the coupling treatment) were conducted.

Comparative Example 64

Evaluation boards were produced in the same way as in Example 31 except the following: as the individual surface treatments in the <step a'>, surface treatments equivalent to the individual wiring-surface-applied surface treatments described in Comparative Example 10 (the pre-treatment, and the azole treatment with pyrazole) were conducted.

Comparative Example 65

Evaluation boards were produced in the same way as in Example 31 except the following: as the individual surface treatments in the <step a'>, surface treatments equivalent to the individual wiring-surface-applied surface treatments described in Comparative Example 11 (the pre-treatment, the etching treatment, and the electroless tin plating treatment) were conducted.

Comparative Example 66

Evaluation boards were produced in the same way as in Example 31 except the following: as the individual surface treatments in the <step a'>, surface treatments equivalent to the individual wiring-surface-applied surface treatments described in Comparative Example 12 (the pre-treatment, the etching treatment, the electroless tin plating treatment, and the etching treatment) were conducted.

Comparative Example 67

Evaluation boards were produced in the same way as in Example 31 except the following: as the individual surface treatments in the <step a'>, surface treatments equivalent to the individual wiring-surface-applied surface treatments described in Comparative Example 13 (the pre-treatment, the etching treatment, the electroless tin plating treatment, and the azole treatment with pyrazole) were conducted.

Comparative Example 68

Evaluation boards were produced in the same way as in Example 31 except the following: as the individual surface treatments in the <step a'>, surface treatments equivalent to the individual wiring-surface-applied surface treatments described in Comparative Example 14 (the pre-treatment, the electroless tin plating treatment, and the 150° C. heating treatment) were conducted.

Comparative Example 69

Evaluation boards were produced in the same way as in Example 31 except the following: as the individual surface treatments in the <step a'>, surface treatments equivalent to the individual wiring-surface-applied surface treatments described in Comparative Example 15 (the pre-treatment, the nobler metal treatment, the oxidizing treatment, and the reducing treatment) were conducted.

Comparative Example 70

Evaluation boards were produced in the same way as in Example 31 except the following: as the individual surface treatments in the <step a'>, surface treatments equivalent to the individual wiring-surface-applied surface treatments described in Comparative Example 16 (the pre-treatment, the nobler metal treatment, the oxidizing treatment, the reducing treatment, and the azole treatment with pyrazole) were conducted.

Comparative Example 71

Evaluation boards were produced in the same way as in Example 31 except the following: as the individual surface treatments in the <step a'>, surface treatments equivalent to the individual wiring-surface-applied surface treatments described in Comparative Example 17 (the pre-treatment, the nobler metal treatment, the oxidizing treatment, the reducing treatment, and the electroless tin plating treatment) were conducted.

Comparative Example 72

Evaluation boards were produced in the same way as in Example 31 except the following: as the individual surface treatments in the <step a'>, surface treatments equivalent to the individual wiring-surface-applied surface treatments described in Comparative Example 18 (the pre-treatment, the nobler metal treatment, the oxidizing treatment, the reducing treatment, the electroless tin plating treatment, and the 150° C. heating treatment) were conducted.

Example 41

In order to make an evaluation as to whether or not pink rings were generated according to the copper surface treatment of the invention, the following evaluation boards were formed.

In the step <a'> described in Example 31, the copper thin film 118 was electroplated. Thereafter, the workpiece was subjected to the individual surface treatments in the <step a'> (the pre-treatment, the nobler-metal-formation, the oxidizing treatment, and the acidic solution treatment). Thereafter, the workpiece was allowed to stand still at room temperature for 2 hours, 76 hours and 168 hours, and at 150° C. for 1 hour, and then a prepreg, GXA-67N (trade name) manufactured by Hitachi Chemical Co., Ltd., wherein a glass cloth was impregnated with a cyanate ester based resin composition, was laminated onto the copper surface, without conducting any wiring forming step (resist-painting, exposure to light, development, electroplating, resist-peeling, nor etching). The workpiece was heated from normal temperature (25° C.) to 230° C. at a temperature-raising rate of 6° C./min., and was then kept at 230° C. for 1 hour to bond the members of the laminate.

Thereafter, 20 holes each having a hole diameter of 0.1 mm were made in the workpiece by laser processing. In this way and the same ways, twenty boards for making an evaluation as to whether or not pink rings were generated were produced.

Example 42

Evaluation boards were produced in the same way as in Example 41 except the following: as the individual surface treatments in the <step a'>, surface treatments equivalent to the individual wiring-surface-applied surface treatments described in Example 2 (the pre-treatment, the nobler-metal-formation, the oxidizing treatment, the acidic solution treatment, and the coupling treatment) were conducted.

Example 43

Evaluation boards were produced in the same way as in Example 41 except the following: as the individual surface treatments in the <step a'>, surface treatments equivalent to the individual wiring-surface-applied surface treatments described in Example 3 (the pre-treatment, the nobler-metal-formation, the oxidizing treatment, the acidic solution treatment, and the azole treatment with pyrazole) were conducted.

Example 44

Evaluation boards were produced in the same way as in Example 41 except the following: as the individual surface treatments in the <step a'>, surface treatments equivalent to the individual wiring-surface-applied surface treatments described in Example 4 (the pre-treatment, the nobler-metal-formation, the oxidizing treatment, the acidic solution treatment, and the azole treatment with pyrazole) were conducted.

Example 45

Evaluation boards were produced in the same way as in Example 41 except the following: as the individual surface treatments in the <step a'>, surface treatments equivalent to the individual wiring-surface-applied surface treatments described in Example 5 (the pre-treatment, the nobler-metal-formation, the oxidizing treatment, the acidic solution treatment, and the electroless tin plating treatment) were conducted.

Example 46

Evaluation boards were produced in the same way as in Example 41 except the following: as the individual surface treatments in the <step a'>, surface treatments equivalent to the individual wiring-surface-applied surface treatments described in Example 6 (the pre-treatment, the nobler-metal-formation, the oxidizing treatment, the acidic solution treatment, the electroless nickel plating treatment, and the electroless tin plating treatment) were conducted.

Example 47

Evaluation boards were produced in the same way as in Example 41 except the following: as the individual surface treatments in the <step a'>, surface treatments equivalent to the individual wiring-surface-applied surface treatments described in Example 7 (the pre-treatment, the nobler-metal-formation, the oxidizing treatment, the acidic solution treatment, the electroless cobalt plating treatment, and the electroless tin plating treatment) were conducted.

Example 48

Evaluation boards were produced in the same way as in Example 41 except the following: as the individual surface treatments in the <step a'>, surface treatments equivalent to the individual wiring-surface-applied surface treatments described in Example 8 (the pre-treatment, the nobler-metal-formation, the oxidizing treatment, the acidic solution treatment, the electroless tin plating treatment, and the coupling treatment) were conducted.

Example 49

Evaluation boards were produced in the same way as in Example 41 except the following: as the individual surface treatments in the <step a'>, surface treatments equivalent to the individual wiring-surface-applied surface treatments described in Example 9 (the pre-treatment, the nobler-metal-formation, the oxidizing treatment, the acidic solution treatment, the electroless tin plating treatment, and the azole treatment with pyrazole) were conducted.

Example 50

Evaluation boards were produced in the same way as in Example 41 except the following: as the individual surface treatments in the <step a'>, surface treatments equivalent to the individual wiring-surface-applied surface treatments described in Example 10 (the pre-treatment, the nobler-metal-formation, the oxidizing treatment, the acidic solution treatment, the electroless tin plating treatment, and the 150° C. heating treatment) were conducted.

Comparative Example 73

Evaluation boards were produced in the same way as in Example 41 except the following: as the individual surface treatments in the <step a'>, surface treatments equivalent to the individual wiring-surface-applied surface treatments described in Comparative Example 1 (the pre-treatment, the oxidizing treatment, and the acidic solution treatment) were conducted.

Comparative Example 74

Evaluation boards were produced in the same way as in Example 41 except the following: as the individual surface treatments in the <step a'>, surface treatments equivalent to the individual wiring-surface-applied surface treatments described in Comparative Example 2 (the pre-treatment, the oxidizing treatment at 85° C., and the acidic solution treatment) were conducted.

Comparative Example 75

Evaluation boards were produced in the same way as in Example 41 except the following: as the individual surface treatments in the <step a'>, surface treatments equivalent to the individual wiring-surface-applied surface treatments described in Comparative Example 3 (the pre-treatment, the oxidizing treatment at 85° C., and the reducing treatment) were conducted.

Comparative Example 76

Evaluation boards were produced in the same way as in Example 41 except the following: as the individual surface treatments in the <step a'>, surface treatments equivalent to the individual wiring-surface-applied surface treatments described in Comparative Example 4 (the pre-treatment, and the etching treatment) were conducted.

Comparative Example 77

Evaluation boards were produced in the same way as in Example 41 except the following: as the individual surface treatments in the <step a'>, surface treatments equivalent to the individual wiring-surface-applied surface treatments described in Comparative Example 5 (the pre-treatment, and none-irregularity-forming treatment) were conducted.

Comparative Example 78

Evaluation boards were produced in the same way as in Example 41 except the following: as the individual surface treatments in the <step a'>, surface treatments equivalent to the individual wiring-surface-applied surface treatments described in Comparative Example 6 (the pre-treatment, and the electroless tin plating treatment) were conducted.

Comparative Example 79

Evaluation boards were produced in the same way as in Example 41 except the following: as the individual surface treatments in the <step a'>, surface treatments equivalent to the individual wiring-surface-applied surface treatments described in Comparative Example 7 (the pre-treatment, the electroless tin plating treatment, and the coupling treatment) were conducted.

Comparative Example 80

Evaluation boards were produced in the same way as in Example 41 except the following: as the individual surface treatments in the <step a'>, surface treatments equivalent to the individual wiring-surface-applied surface treatments described in Comparative Example 8 (the pre-treatment, the electroless tin plating treatment, and the azole treatment with pyrazole) were conducted.

Comparative Example 81

Evaluation boards were produced in the same way as in Example 41 except the following: as the individual surface treatments in the <step a'>, surface treatments equivalent to the individual wiring-surface-applied surface treatments described in Comparative Example 9 (the pre-treatment, and the coupling treatment) were conducted.

Comparative Example 82

Evaluation boards were produced in the same way as in Example 41 except the following: as the individual surface treatments in the <step a'>, surface treatments equivalent to the individual wiring-surface-applied surface treatments described in Comparative Example 10 (the pre-treatment, and the azole treatment with pyrazole) were conducted.

Comparative Example 83

Evaluation boards were produced in the same way as in Example 41 except the following: as the individual surface treatments in the <step a'>, surface treatments equivalent to the individual wiring-surface-applied surface treatments described in Comparative Example 11 (the pre-treatment, the etching treatment, and the electroless tin plating treatment) were conducted.

Comparative Example 84

Evaluation boards were produced in the same way as in Example 41 except the following: as the individual surface treatments in the <step a'>, surface treatments equivalent to the individual wiring-surface-applied surface treatments described in Comparative Example 12 (the pre-treatment, the etching treatment, the electroless tin plating treatment, and the etching treatment) were conducted.

Comparative Example 85

Evaluation boards were produced in the same way as in Example 41 except the following: as the individual surface treatments in the <step a'>, surface treatments equivalent to the individual wiring-surface-applied surface treatments described in Comparative Example 13 (the pre-treatment, the etching treatment, the electroless tin plating treatment, and the azole treatment with pyrazole) were conducted.

Comparative Example 86

Evaluation boards were produced in the same way as in Example 41 except the following: as the individual surface treatments in the <step a'>, surface treatments equivalent to the individual wiring-surface-applied surface treatments described in Comparative Example 14 (the pre-treatment, the electroless tin plating treatment, and the 150° C. heating treatment) were conducted.

Comparative Example 87

Evaluation boards were produced in the same way as in Example 41 except the following: as the individual surface treatments in the <step a'>, surface treatments equivalent to the individual wiring-surface-applied surface treatments described in Comparative Example 15 (the pre-treatment, the nobler metal treatment, the oxidizing treatment, and the reducing treatment) were conducted.

Comparative Example 88

Evaluation boards were produced in the same way as in Example 41 except the following: as the individual surface treatments in the <step a'>, surface treatments equivalent to the individual wiring-surface-applied surface treatments described in Comparative Example 16 (the pre-treatment, the nobler metal treatment, the oxidizing treatment, the reducing treatment, and the azole treatment with pyrazole) were conducted.

Comparative Example 89

Evaluation boards were produced in the same way as in Example 41 except the following: as the individual surface treatments in the <step a'>, surface treatments equivalent to the individual wiring-surface-applied surface treatments described in Comparative Example 17 (the pre-treatment, the nobler metal treatment, the oxidizing treatment, the reducing treatment, and the electroless tin plating treatment) were conducted.

Comparative Example 90

Evaluation boards were produced in the same way as in Example 41 except the following: as the individual surface treatments in the <step a'>, surface treatments equivalent to the individual wiring-surface-applied surface treatments described in Comparative Example 18 (the pre-treatment, the nobler metal treatment, the oxidizing treatment, the reducing treatment, the electroless tin plating treatment, and the 150° C. heating treatment) were conducted.

(Reliability Tests of the Semiconductor Packages)

With regard to each of Examples 1 to 10 and Comparative Examples 1 to 18, the semiconductor package samples thereof, the number of which was 22, were subjected to moisture absorption treatment, and then caused to flow into a reflow furnace giving an arrival temperature of 240° C. and having a length of 2 m at 0.5 m/minute to conduct reflow. Thereafter, it was examined whether or not each of the samples was cracked. In a case where the sample was cracked, the sample was determined to be NG. The results are shown in Table 1.

Each of the twenty two semiconductor package samples was mounted on a mother board of 0.8 mm thickness, and then caused to undergo a temperature cycle test of carrying out cycles of a temperature of −55° C. for 30 minutes followed by a temperature of 125° C. for 30 minutes. A multimeter, 3457A manufactured by Hewlett-Packard Development Co., was used to measure the electric resistance values of the wirings at the $500^{th}$ cycle, $1000^{th}$ cycle, and $1500^{th}$ cycle, respectively. In a case where the measured resistance values were each changed by 10% or more from the initial resistance value, the case was determined to be NG. The results are shown in Table 1. However, with regard to Comparative Examples 4, 11, 12 and 13, the precision of the wirings was unable to be kept, so that no test board was able to be produced.

(Test 1 of Bonding Properties onto a Build-Up Member)

A build-up member, AS-ZII (trade name) manufactured by Hitachi Chemical Co., Ltd., which had a film thickness of 45 μm, was laminated on each of some of the electrolytic copper foil pieces formed in each of Examples 11 to 20 and Comparative Examples 19 and 36, and then the two members were temporarily bonded onto each other at a temperature of 110° C. and a pressure of 0.5 MPa for 40 seconds by means of a vacuum pressuring type laminator (manufactured by Meiki Co., Ltd.). Thereafter, a drying machine was used to keep the workpiece at 180° C. for 90 minutes to bond the copper and the build-up resin onto each other to form a board for a bonding test. On the individual-surface-treatment-applied side of the electrolytic copper foil piece, the piece was bonded onto the insulating layer (build-up resin).

Next, with regard to the individual bonding test boards (of each of Examples and Comparative Examples) yielded as described above, the following were measured: the adhesiveness at the initial (lapse time: 0); the bonding properties after some of the boards were allowed to stand still at 150° C. for 120 hours and for 240 hours, respectively; and the bonding properties after some of the boards were allowed to stand still under PCT conditions of 121° C. temperature and 0.2 MPa pressure for 48 hours and 96 hours, respectively. The peel strength (N/m) which was a barometer of each of the bonding properties was measured by peeling one of the individual electrolytic copper foil pieces, perpendicularly to the board, therefrom at a rate of 50 mm/min, using a rheometer, NRM-3002D-H (trade name) manufactured by Fudou Kougyou Inc. The results are shown in Table 2-1.

(Test 2 of Bonding Properties onto a Build-Up Member)

A build-up member, AS-ZII (trade name) manufactured by Hitachi Chemical Co., Ltd., which had a film thickness of 45 μm, was laminated on each of some of the electrolytic copper foil pieces formed in each of Examples 11 to 20 and Comparative Examples 19 and 36, and then the two members were temporarily bonded onto each other at a temperature of 110° C. and a pressure of 2.0 MPa for 300 seconds by means of a vacuum press machine (manufactured by Meiki Co., Ltd.). Thereafter, a drying machine was used to keep the workpiece at 180° C. for 90 minutes to bond the copper and the build-up resin onto each other to form a board for a bonding test. On the individual-surface-treatment-applied side of the electrolytic copper foil piece, the piece was bonded onto the insulating layer (build-up resin).

Next, with regard to the individual bonding test boards yielded as described above, the following were measured: the adhesiveness at the initial (lapse time: 0); and the bonding properties after some of the boards were allowed to stand still at 150° C. for 120 hours and for 240 hours, respectively. The peel strength (N/m) which was a barometer of each of the bonding properties was measured by peeling one of the individual electrolytic copper foil pieces, perpendicularly to the board, therefrom at a rate of 50 mm/min., using a rheometer, NRM-3002D-H (trade name) manufactured by Fudou Kougyou Inc. The results are shown in Table 2-2.

(Test 3 of Bonding Properties onto a Build-Up Member)

A build-up member, ABF-GX-13 (trade name) manufactured by Ajinomoto Co., Inc., which had a film thickness of 45 μm, was laminated on each of some of the electrolytic copper foil pieces formed in each of Examples 11 to 20 and Comparative Examples 19 and 36, and then the two members were temporarily bonded onto each other at a temperature of 110° C. and a pressure of 0.5 MPa for 40 seconds by means of a vacuum pressuring type laminator (manufactured by Meiki Co., Ltd.). Thereafter, a drying machine was used to keep the workpiece at 170° C. for 90 minutes to bond the copper and the build-up resin onto each other to form a board for a bonding test. On the individual-surface-treatment-applied side of the electrolytic copper foil piece, the piece was bonded onto the insulating layer (build-up resin).

Next, with regard to the individual bonding test boards yielded as described above, the following were measured: the adhesiveness at the initial (lapse time: 0); the bonding properties after some of the boards were allowed to stand still at 150° C. for 120 hours and for 240 hours, respectively; and the bonding properties after some of the boards were allowed to stand still under PCT conditions of 121° C. temperature and 0.2 MPa pressure for 48 hours and 96 hours, respectively. The peel strength (N/m) which was a barometer of each of the bonding properties was measured by peeling one of the individual electrolytic copper foil pieces, perpendicularly to the board, therefrom at a rate of 50 mm/min., using a rheometer, NRM-3002D-H (trade name) manufactured by Fudou Kougyou Inc. The results are shown in Table 2-3.

(Test of Bonding Properties onto a Solder Resist)

A solder resist, SR-7200 (trade name) manufactured by Hitachi Chemical Co., Ltd., which had a film thickness of 30 µm, was applied onto each of some of the electrolytic copper foil pieces formed in each of Examples 11 to 20 and Comparative Examples 19 and 36, and then cured to bond the copper and the solder resist onto each other, thereby forming a board for a bonding test. On the individual-surface-treatment-applied side of the electrolytic copper foil piece, the piece was bonded onto the insulating layer (solder resin).

Next, with regard to the individual bonding test boards yielded as described above, the following were measured: the adhesiveness at the initial (lapse time: 0); the bonding properties after some of the boards were allowed to stand still at 150° C. for 120 hours and for 240 hours, respectively; and the bonding properties after some of the boards were allowed to stand still under PCT conditions of 121° C. temperature and 0.2 MPa pressure for 48 hours and 96 hours, respectively. The peel strength (N/m) which was a barometer of each of the bonding properties was measured by peeling one of the individual electrolytic copper foil pieces, perpendicularly to the board, therefrom at a rate of 50 mm/min., using a rheometer, NRM-3002D-H (trade name) manufactured by Fudou Kougyou Inc. The results are shown in Table 2-4.

(Copper Surface Cleanliness Evaluating Test)

The surface-treatment-applied surface of one (or each of some) of the electrolytic copper foil pieces produced in each of Examples 11 to 20 and Comparative Examples 19 to 36 was extracted with 20 mL of pure water at 85° C. for 1 hour, and then cations and anions in the extract were qualitatively analyzed by ion chromatography. The ion chromatography was performed using an apparatus, DX-500 (trade name) manufactured by Dionex Co., under the following conditions 3:

Conditions 3:
  Cation measuring conditions
    eluent: 8 mmol/L methanesulfonic acid,
    injection amount: 100 µL,
    separating column: Ion Pac CS14 of 2 mm diameter and 250 mm (length), and
    detector: electric conductivity meter; and
  Anion measuring conditions
    eluent: mixed solution of 2.7 mmol/L sodium carbonate and 0.3 mmol/L sodium hydrogencarbonate,
    injection amount: 500 µL,
    separating column: Ion Pac AS12A of 4 mm diameter and 200 mm (length), and
    detector: electric conductivity meter.

Furthermore, nitric acid was added to the extract, and metallic ions were quantitatively analyzed by ICP emission spectrometry. The ICP emission spectrometry was performed using an apparatus, SPS 3000 (trade name) manufactured by SII Nano Technology Inc. In a case where the detection amounts of each cation, each anion, and each metallic ion were each a value of 1 µg/piece or more, the case is represented by "+++"; 0.1 µg/piece or more and less than 1 µg/piece, "++"; 0.04 µg/piece or more and less than 0.1 µg/piece, "+"; and less than 0.04 µg/piece, "−". The results are shown in Tables 3-1 to Table 3-3.

(Copper Surface Smoothness Evaluating Test)

A simple atomic force microscope (AFM), Nanopics 2100, was used to measure the surface roughness (Rz) of the surface-treatment-applied surface of one (or each of some) of the electrolytic copper foil pieces formed in each of Examples 11 to 20 and Comparative Examples 19 to 36 under conditions 4 described below. The results are shown in Table 4.

Conditions 4
  measurement length: 1 µm,
  scan speed: 1.35 µm/sec, and
  force reference: 160.

(Copper Surface Shape Evaluating Test)

An examination was made about the surface shape of the surface-treatment-applied surface of one (or each of some) of the electrolytic copper foil pieces formed in each of Examples 11 to 20 and Comparative Examples 19 to 36. The form was observed with a magnification of 10,000 through a scanning electron microscope, S-4700 (trade name) manufactured by Hitachi Ltd. In a case where the copper surface shape was a dense and even irregularity-form and was not any needle form, the case was determined to be "Pass (P)". Any other case was determined to be "Fail (F)". The results are shown in Table 4. However, with regard to Comparative Example 23, the <step d-2> was not performed so that no irregularities were able to be formed on the copper surface. With regard to Comparative Examples 27 and 28, only the coupling treatment and only the azole treatment were conducted, respectively, so that no irregularities were able to be formed on the copper surface.

(Copper Surface Glossiness Test)

With regard to the surface-treatment-applied surface of one (or each of some) of the electrolytic copper foil pieces formed in each of Examples 11 to 20 and Comparative Examples 19 to 36, it was examined with the naked eye whether or not the copper surface had glossiness. In a case where no glossiness was observed, the case was determined to be "Pass (P)". In a case where glossiness was observed, the case was determined to be "Fail (F)". The results are shown in Table 4.

(Test of the Electric Non-Conductance Between Wiring Pieces)

With regard to the evaluation boards described in each of Examples 21 to 30 and Comparative Examples 37 to 54, the following were selected therefrom: four evaluation boards wherein the L/S="5/5" µm, no short circuit was caused between pieces of the wirings, and the wirings were not broken; and four evaluation boards wherein the L/S="10/10" µm, no short circuit was caused between pieces of the wirings, and the wirings were not broken. Each of the boards was measured about the isolation resistance value between the wiring pieces. However, with regard to the evaluation boards of Comparative Example 40 and Comparative Examples 47 to 49, the precision of the wirings was unable to be maintained; thus, no measurement was made.

First, a digital superhigh resistance microammeter, R-8340A (trade name) manufactured by Advantest Corp., was used to apply a DC voltage of 5 V to the L/S wiring pieces (each of the boards) across the wiring pieces at room temperature for 30 seconds, and then the insulation resistance value between the L/S wiring pieces was measured. In order to measure an insulation resistance value of 1 GΩ or less, a digital multi-meter, 3457A (trade name) manufactured by Hewlett-Packard Development Co., was used.

Next, a DC voltage of 5 V was continuously applied to the L/S wiring pieces across the wiring pieces in a thermostat wherein the temperature and the relative humidity were kept at 85° C. and 85%, respectively. After 24, 48, 96, 200, 500 and 1,000 hours, the insulation resistance value between the L/S wiring pieces was measured in the same manner as described above. The used thermostat was a thermostat manufactured by Hitachi Ltd., EC-10HHPS (trade name). The measurement was made up to 1000 hours after the application of the voltage.

In a case where about the four evaluation boards measured as described above, the minimum value of the insulating resistance values was less than 1 GΩ, the case was determined to be Fail (F). In a case where the minimum value was $1.0 \times 10^9 \Omega$ or more, the case was determined to be Pass (P). The results are shown in Tables 5 and 6.

(Resist Pattern Formation Evaluating Test)

In the <step a'> described in each of Examples 31 to 40 and Comparative Examples 55 to 72, the success ratio of the formation of the resist pattern 119 was evaluated. The method for the evaluation is as follows: one or more good samples were selected out of the samples, the good sample(s) being (each) a sample wherein no resist residues were in the regions where the wirings were formed or the formed resists were not peeled, and the resist width of the resist having each of the L/S values was measured so that the ratio of any error to the designed value of each of the L/S resist widths was ±10% or less; and the number of the good samples was examined. The results are shown in Table 6. However, with regard to each of the evaluation boards of Comparative Examples 56, 58 and 65 to 67, the copper thin film 118 was lost by conducting the copper surface treatment. Thus, no measurement was made.

(Wiring Formation Evaluating Test)

In the <step a'> described in each of Examples 31 to 40 and Comparative Examples 55 to 72, the success ratio of the formation of the wiring 106 was evaluated. The method for the evaluation is as follows: one or more good samples were selected out of the samples, the good sample(s) being (each) a sample wherein no short circuit was caused between the wiring pieces, the wirings were not broken, and further the ratio of any error to the designed value, 5 µm, of the copper plating thickness was ±10% or less; and the number of the good samples was examined. The results are shown in Table 7. However, with regard to each of the evaluation boards of Comparative Examples 56, 58 and 65 to 67, the copper thin film 118 was lost by conducting the copper surface treatment. Thus, no measurement was made.

(PCT Resistance Evaluating Test)

The treatments up to the <step d'> described in each of Examples 21 to 30 and Comparative Examples 37 to 54 were conducted, and then the resultant workpieces were each caused to undergo a PCT resistance test (at 121° C. and 0.2 MPa for 200 hours). The method for the evaluation is as follows: one or more good samples were selected out of the samples, the good sample(s) being (each) a sample wherein swelling and peeling were not observed between the wiring 106 and one of the insulating layers (build-up layers) 104, between the insulating layer 104 and the other insulating layer (build-up layer) 104, between the wiring 106 and the solder resist 109, nor between one of the insulating layers 104 and the solder resist 109 after the test; and the number of the good samples was examined. The results are shown in Table 8. However, with regard to each of the Evaluation boards of Comparative Examples 40 and 47 to 49, the formed wirings were lost; thus, no test board was able to be produced.

(Pink Ring Evaluating Test)

With regard to one (or each of some) of the Evaluation boards of each of Examples 41 to 50 and Comparative Examples 73 to 90, the board was immersed in 18% hydrochloric acid for 3 hours and the number of rings in pink color (pink rings) generated around the holes was examined. The results are shown in Table 9. However, with regard to Comparative Examples 73, 77 to 82, and 86, the copper and the resin were not satisfactorily bonded to each other, so that the resin was peeled by laser processing. Thus, no test was able to be made.

TABLE 1

| | No. | The number of NGs after reflow test | The number of NGs after temperature cycle test | | |
|---|---|---|---|---|---|
| | | | $500^{th}$ | $1,000^{th}$ | $1,500^{th}$ |
| Examples | 1 | 0/22 | 0/22 | 0/22 | 0/22 |
| | 2 | 0/22 | 0/22 | 0/22 | 0/22 |
| | 3 | 0/22 | 0/22 | 0/22 | 0/22 |
| | 4 | 0/22 | 0/22 | 0/22 | 0/22 |
| | 5 | 0/22 | 0/22 | 0/22 | 0/22 |
| | 6 | 0/22 | 0/22 | 0/22 | 0/22 |
| | 7 | 0/22 | 0/22 | 0/22 | 0/22 |
| | 8 | 0/22 | 0/22 | 0/22 | 0/22 |
| | 9 | 0/22 | 0/22 | 0/22 | 0/22 |
| | 10 | 0/22 | 0/22 | 0/22 | 0/22 |
| Comparative Examples | 1 | 22/22 | 22/22 | 22/22 | 22/22 |
| | 2 | 0/22 | 0/22 | 10/22 | 22/22 |
| | 3 | 0/22 | 0/22 | 5/22 | 22/22 |
| | 4 | — | — | — | — |
| | 5 | 22/22 | 22/22 | 22/22 | 22/22 |
| | 6 | 22/22 | 22/22 | 22/22 | 22/22 |
| | 7 | 22/22 | 22/22 | 22/22 | 22/22 |
| | 8 | 22/22 | 22/22 | 22/22 | 22/22 |
| | 9 | 22/22 | 22/22 | 22/22 | 22/22 |
| | 10 | 22/22 | 22/22 | 22/22 | 22/22 |
| | 11 | — | — | — | — |
| | 12 | — | — | — | — |
| | 13 | — | — | — | — |
| | 14 | 22/22 | 22/22 | 22/22 | 22/22 |
| | 15 | 0/22 | 0/22 | 0/22 | 10/22 |
| | 16 | 0/22 | 0/22 | 0/22 | 10/22 |
| | 17 | 0/22 | 0/22 | 0/22 | 10/22 |
| | 18 | 0/22 | 0/22 | 0/22 | 10/22 |

TABLE 2-1

| | No. | Initial adhesiveness (N/m) | Adhesiveness after 150° C. treatment (N/m) | | Adhesiveness after PCT treatment (N/m) | |
|---|---|---|---|---|---|---|
| | | 0 h | 120 h | 240 h | 48 h | 96 h |
| Examples | 11 | 1,000 | 800 | 400 | 900 | 800 |
| | 12 | 1,100 | 850 | 450 | 950 | 900 |
| | 13 | 1,100 | 850 | 450 | 950 | 900 |
| | 14 | 1,100 | 900 | 600 | 950 | 900 |
| | 15 | 900 | 250 | 250 | 850 | 800 |
| | 16 | 900 | 250 | 250 | 850 | 800 |
| | 17 | 900 | 250 | 250 | 850 | 800 |
| | 18 | 950 | 700 | 250 | 900 | 850 |
| | 19 | 950 | 700 | 500 | 900 | 850 |
| | 20 | 1100 | 850 | 700 | 950 | 900 |
| Comparative Examples | 19 | 300 | 150 | 100 | 200 | 100 |
| | 20 | 600 | 300 | 250 | 400 | 300 |
| | 21 | 1,650 | 200 | 100 | 800 | 700 |
| | 22 | 1,100 | 800 | 500 | 1,050 | 800 |
| | 23 | 200 | 50 | 20 | 50 | 20 |
| | 24 | 250 | 50 | 20 | 100 | 50 |
| | 25 | 300 | 50 | 20 | 100 | 50 |
| | 26 | 300 | 50 | 20 | 100 | 50 |

TABLE 2-1-continued

| No. | Initial adhesiveness (N/m) 0 h | Adhesiveness after 150° C. treatment (N/m) 120 h | 240 h | Adhesiveness after PCT treatment (N/m) 48 h | 96 h |
|---|---|---|---|---|---|
| 27 | 250 | 50 | 20 | 100 | 50 |
| 28 | 250 | 50 | 20 | 100 | 50 |
| 29 | 1,200 | 900 | 400 | 1,100 | 800 |
| 30 | 1,300 | 950 | 450 | 1,150 | 850 |
| 31 | 1,300 | 950 | 500 | 1,150 | 850 |
| 32 | 250 | 50 | 20 | 100 | 50 |
| 33 | 1,200 | 600 | 150 | 1,000 | 900 |
| 34 | 1,200 | 600 | 150 | 1,000 | 900 |
| 35 | 1,200 | 600 | 150 | 1,000 | 900 |
| 36 | 1,200 | 600 | 150 | 1,000 | 900 |

TABLE 2-2

| | No. | Initial adhesiveness (N/m) 0 h | Adhesiveness after 150° C. treatment (N/m) 120 h | 240 h |
|---|---|---|---|---|
| Examples | 11 | 1,000 | 900 | 800 |
| | 12 | 1,100 | 950 | 850 |
| | 13 | 1,100 | 950 | 850 |
| | 14 | 1,100 | 1,000 | 1,000 |
| | 15 | 900 | 500 | 400 |
| | 16 | 900 | 500 | 400 |
| | 17 | 900 | 500 | 400 |
| | 18 | 950 | 800 | 500 |
| | 19 | 950 | 800 | 700 |
| | 20 | 1100 | 900 | 800 |
| Comparative Examples | 19 | 300 | 250 | 150 |
| | 20 | 600 | 400 | 250 |
| | 21 | 1,650 | 250 | 150 |
| | 22 | 1,100 | 950 | 800 |
| | 23 | 200 | 50 | 20 |
| | 24 | 250 | 50 | 20 |
| | 25 | 300 | 50 | 20 |
| | 26 | 300 | 50 | 20 |
| | 27 | 250 | 50 | 20 |
| | 28 | 250 | 50 | 20 |
| | 29 | 1,200 | 800 | 700 |
| | 30 | 1,300 | 850 | 700 |
| | 31 | 1,300 | 750 | 650 |
| | 32 | 250 | 50 | 20 |
| | 33 | 1,200 | 700 | 250 |
| | 34 | 1,200 | 700 | 250 |
| | 35 | 1,200 | 700 | 250 |
| | 36 | 1,200 | 700 | 250 |

TABLE 2-3

| | No. | Initial adhesiveness (N/m) 0 h | Adhesiveness after 150° C. treatment (N/m) 120 h | 240 h | Adhesiveness after PCT treatment (N/m) 48 h | 96 h |
|---|---|---|---|---|---|---|
| Examples | 11 | 950 | 500 | 100 | 850 | 750 |
| | 12 | 1,000 | 600 | 100 | 850 | 750 |
| | 13 | 1,000 | 700 | 200 | 900 | 750 |
| | 14 | 1,000 | 800 | 500 | 900 | 750 |
| | 15 | 800 | 200 | 150 | 750 | 700 |
| | 16 | 800 | 200 | 150 | 750 | 700 |
| | 17 | 800 | 200 | 150 | 750 | 700 |
| | 18 | 900 | 500 | 150 | 850 | 800 |
| | 19 | 900 | 600 | 200 | 850 | 800 |
| | 20 | 1000 | 800 | 600 | 950 | 850 |
| Comparative Examples | 19 | 250 | 100 | 50 | 150 | 50 |
| | 20 | 500 | 200 | 100 | 300 | 100 |
| | 21 | 1,750 | 150 | 100 | 1300 | 900 |
| | 22 | 1,200 | 700 | 400 | 950 | 700 |
| | 23 | 200 | 50 | 20 | 50 | 20 |
| | 24 | 250 | 50 | 20 | 100 | 50 |
| | 25 | 300 | 50 | 20 | 100 | 50 |
| | 26 | 300 | 50 | 20 | 100 | 50 |
| | 27 | 250 | 50 | 20 | 100 | 50 |
| | 28 | 250 | 50 | 20 | 100 | 50 |
| | 29 | 1,250 | 700 | 350 | 1,000 | 750 |
| | 30 | 1,250 | 750 | 400 | 1,100 | 800 |
| | 31 | 1,250 | 750 | 450 | 1,100 | 800 |
| | 32 | 250 | 50 | 20 | 100 | 50 |
| | 33 | 1,400 | 200 | 100 | 1,200 | 950 |
| | 34 | 1,400 | 200 | 100 | 1,200 | 950 |
| | 35 | 1,400 | 200 | 100 | 1,200 | 950 |
| | 36 | 1,400 | 200 | 100 | 1,200 | 950 |

TABLE 2-4

| | No. | Initial adhesiveness (N/m) 0 h | Adhesiveness after 150° C. treatment (N/m) 120 h | 240 h | Adhesiveness after PCT treatment (N/m) 48 h | 96 h |
|---|---|---|---|---|---|---|
| Examples | 11 | 1,200 | 700 | 400 | 150 | 50 |
| | 12 | 1,200 | 750 | 450 | 200 | 100 |
| | 13 | 1,200 | 750 | 450 | 250 | 100 |
| | 14 | 1,200 | 850 | 600 | 250 | 100 |
| | 15 | 1,150 | 850 | 650 | 850 | 700 |
| | 16 | 1,150 | 850 | 650 | 850 | 700 |
| | 17 | 1,150 | 850 | 650 | 850 | 700 |
| | 18 | 1,200 | 900 | 700 | 850 | 700 |
| | 19 | 1,200 | 900 | 700 | 850 | 700 |
| | 20 | 1,300 | 1000 | 850 | 900 | 800 |
| Comparative Examples | 19 | 300 | 100 | 50 | 100 | 20 |
| | 20 | 600 | 400 | 200 | 200 | 50 |
| | 21 | 1,350 | 200 | 100 | 200 | 50 |
| | 22 | 1,100 | 800 | 400 | 850 | 650 |
| | 23 | 200 | 50 | 20 | 50 | 20 |
| | 24 | 250 | 50 | 20 | 50 | 20 |
| | 25 | 300 | 50 | 20 | 50 | 20 |
| | 26 | 300 | 50 | 20 | 50 | 20 |
| | 27 | 250 | 50 | 20 | 50 | 20 |
| | 28 | 250 | 50 | 20 | 50 | 20 |
| | 29 | 1,100 | 900 | 600 | 900 | 600 |
| | 30 | 1,200 | 950 | 650 | 950 | 650 |
| | 31 | 1,200 | 950 | 650 | 950 | 650 |
| | 32 | 250 | 50 | 20 | 50 | 20 |
| | 33 | 1,200 | 50 | 20 | 50 | 20 |
| | 34 | 1,200 | 50 | 20 | 50 | 20 |
| | 35 | 1,200 | 50 | 20 | 50 | 20 |
| | 36 | 1,200 | 50 | 20 | 50 | 20 |

TABLE 3-1

| | No. | Detected substances Cations | | | | | |
|---|---|---|---|---|---|---|---|
| | | $Li^+$ | $Na^+$ | $NH_4^+$ | $K^+$ | $Mg^{2+}$ | $Ca^{2+}$ |
| Examples | 11 | − | − | − | − | − | − |
| | 12 | − | − | − | − | − | − |
| | 13 | − | − | − | − | − | − |
| | 14 | − | − | − | − | − | − |
| | 15 | − | − | − | − | − | − |
| | 16 | − | − | − | − | − | − |
| | 17 | − | − | − | − | − | − |

TABLE 3-1-continued

| | No. | Li$^+$ | Na$^+$ | NH$_4^+$ | K$^+$ | Mg$^{2+}$ | Ca$^{2+}$ |
|---|---|---|---|---|---|---|---|
| | 18 | − | − | − | − | − | − |
| | 19 | − | − | − | − | − | − |
| | 20 | − | − | − | − | − | − |
| Comparative Examples | 19 | − | − | − | − | − | − |
| | 20 | − | ++ | ++ | ++ | ++ | ++ |
| | 21 | − | ++ | ++ | ++ | ++ | ++ |
| | 22 | − | ++ | ++ | ++ | ++ | ++ |
| | 23 | − | − | − | − | − | − |
| | 24 | − | − | − | − | − | − |
| | 25 | − | − | − | − | − | − |
| | 26 | − | − | − | − | − | − |
| | 27 | − | − | − | − | − | − |
| | 28 | − | − | − | − | − | − |
| | 29 | − | ++ | ++ | ++ | ++ | ++ |
| | 30 | − | ++ | ++ | ++ | ++ | ++ |
| | 31 | − | ++ | ++ | ++ | ++ | ++ |
| | 32 | − | − | − | − | − | − |
| | 33 | − | − | − | − | − | − |
| | 34 | − | − | − | − | − | − |
| | 35 | − | − | − | − | − | − |
| | 36 | − | − | − | − | − | − |

TABLE 3-2

| | No. | Cl$^-$ | Br$^-$ | NO$_2^-$ | NO$_3^-$ | PO$_4^{3-}$ | SO$_4^{2-}$ |
|---|---|---|---|---|---|---|---|
| Examples | 11 | − | − | − | − | − | − |
| | 12 | − | − | − | − | − | − |
| | 13 | − | − | − | − | − | − |
| | 14 | − | − | − | − | − | − |
| | 15 | − | − | − | − | − | − |
| | 16 | − | − | − | − | − | − |
| | 17 | − | − | − | − | − | − |
| | 18 | − | − | − | − | − | − |
| | 19 | − | − | − | − | − | − |
| | 20 | − | − | − | − | − | − |
| Comparative Examples | 19 | − | − | − | − | − | − |
| | 20 | +++ | − | ++ | ++ | ++ | +++ |
| | 21 | +++ | − | ++ | ++ | ++ | +++ |
| | 22 | +++ | − | ++ | ++ | ++ | +++ |
| | 23 | − | − | − | − | − | − |
| | 24 | − | − | − | − | − | − |
| | 25 | − | − | − | − | − | − |
| | 26 | − | − | − | − | − | − |
| | 27 | − | − | − | − | − | − |
| | 28 | − | − | − | − | − | − |
| | 29 | +++ | − | ++ | ++ | ++ | +++ |
| | 30 | +++ | − | ++ | ++ | ++ | +++ |
| | 31 | +++ | − | ++ | ++ | ++ | +++ |
| | 32 | − | − | − | − | − | − |
| | 33 | − | − | − | − | − | − |
| | 34 | − | − | − | − | − | − |
| | 35 | − | − | − | − | − | − |
| | 36 | − | − | − | − | − | − |

TABLE 3-3

| | No. | Detected substances Metal ions Fe |
|---|---|---|
| Examples | 11 | — |
| | 12 | — |
| | 13 | — |
| | 14 | — |
| | 15 | — |
| | 16 | — |
| | 17 | — |
| | 18 | — |
| | 19 | — |
| | 20 | — |
| Comparative Examples | 19 | — |
| | 20 | ++ |
| | 21 | ++ |
| | 22 | ++ |
| | 23 | — |
| | 24 | — |
| | 25 | — |
| | 26 | — |
| | 27 | — |
| | 28 | — |
| | 29 | ++ |
| | 30 | ++ |
| | 31 | ++ |
| | 32 | — |
| | 33 | — |
| | 34 | — |
| | 35 | — |
| | 36 | — |

TABLE 4

| | No. | Smoothness | Copper surface shape | Copper surface glossiness |
|---|---|---|---|---|
| Examples | 11 | 40 nm | P | P |
| | 12 | 40 nm | P | P |
| | 13 | 40 nm | P | P |
| | 14 | 40 nm | P | P |
| | 15 | 40 nm | P | P |
| | 16 | 40 nm | P | P |
| | 17 | 40 nm | P | P |
| | 18 | 40 nm | P | P |
| | 19 | 40 nm | P | P |
| | 20 | 40 nm | P | P |
| Comparative Examples | 19 | 40 nm | F | P |
| | 20 | 400 nm | F | F |
| | 21 | 700 nm | F | P |
| | 22 | 1,500 nm | F | P |
| | 23 | 20 nm | — | F |
| | 24 | 20 nm | F | P |
| | 25 | 20 nm | F | P |
| | 26 | 20 nm | F | P |
| | 27 | 20 nm | — | F |
| | 28 | 20 nm | — | F |
| | 29 | 1,500 nm | F | P |
| | 30 | 1,500 nm | F | P |
| | 31 | 1,500 nm | F | P |
| | 32 | 20 nm | F | P |
| | 33 | 40 nm | F | P |
| | 34 | 40 nm | F | P |
| | 35 | 40 nm | F | P |
| | 36 | 40 nm | F | P |

TABLE 5

| | No. | 0 h | 24 h | 48 h | 96 h | 200 h | 500 h | 1000 h |
|---|---|---|---|---|---|---|---|---|
| Examples | 21 | P | P | P | P | P | P | P |
| | 22 | P | P | P | P | P | P | P |
| | 23 | P | P | P | P | P | P | P |
| | 24 | P | P | P | P | P | P | P |
| | 25 | P | P | P | P | P | P | P |
| | 26 | P | P | P | P | P | P | P |
| | 27 | P | P | P | P | P | P | P |

Insulation resistance (Ω) between comb-shaped pieces (L/S = 5/5)

TABLE 5-continued

Insulation resistance (Ω) between comb-shaped pieces (L/S = 5/5)

| | No. | 0 h | 24 h | 48 h | 96 h | 200 h | 500 h | 1000 h |
|---|---|---|---|---|---|---|---|---|
| | 28 | P | P | P | P | P | P | P |
| | 29 | P | P | P | P | P | P | P |
| | 30 | P | P | P | P | P | P | P |
| Comparative Examples | 37 | P | P | P | F | F | F | F |
| | 38 | P | P | P | F | F | F | F |
| | 39 | P | P | P | P | P | P | P |
| | 40 | — | — | — | — | — | — | — |
| | 41 | P | P | F | F | F | F | F |
| | 42 | P | P | F | F | F | F | F |
| | 43 | P | P | F | F | F | F | F |
| | 44 | P | P | F | F | F | F | F |
| | 45 | P | P | F | F | F | F | F |
| | 46 | P | P | F | F | F | F | F |
| | 47 | — | — | — | — | — | — | — |
| | 48 | — | — | — | — | — | — | — |
| | 49 | — | — | — | — | — | — | — |
| | 50 | P | P | F | F | F | F | F |
| | 51 | P | P | P | P | P | P | P |
| | 52 | P | P | P | P | P | P | P |
| | 53 | P | P | P | P | P | P | P |
| | 54 | P | P | P | P | P | P | P |

TABLE 6

Insulation resistance (Ω) between comb-shaped pieces (L/S = 10/10)

| | No. | 0 h | 24 h | 48 h | 96 h | 200 h | 500 h | 1000 h |
|---|---|---|---|---|---|---|---|---|
| Examples | 21 | P | P | P | P | P | P | P |
| | 22 | P | P | P | P | P | P | P |
| | 23 | P | P | P | P | P | P | P |
| | 24 | P | P | P | P | P | P | P |
| | 25 | P | P | P | P | P | P | P |
| | 26 | P | P | P | P | P | P | P |
| | 27 | P | P | P | P | P | P | P |
| | 28 | P | P | P | P | P | P | P |
| | 29 | P | P | P | P | P | P | P |
| | 30 | P | P | P | P | P | P | P |
| Comparative Examples | 37 | P | P | P | P | F | F | F |
| | 38 | P | P | P | P | F | F | F |
| | 39 | P | P | P | P | P | P | P |
| | 40 | — | — | — | — | — | — | — |
| | 41 | P | P | P | P | F | F | F |
| | 42 | P | P | P | P | F | F | F |
| | 43 | P | P | P | P | F | F | F |
| | 44 | P | P | P | P | F | F | F |
| | 45 | P | P | P | P | F | F | F |
| | 46 | P | P | P | P | F | F | F |
| | 47 | — | — | — | — | — | — | — |
| | 48 | — | — | — | — | — | — | — |
| | 49 | — | — | — | — | — | — | — |
| | 50 | P | P | P | P | F | F | F |
| | 51 | P | P | P | P | P | P | P |
| | 52 | P | P | P | P | P | P | P |
| | 53 | P | P | P | P | P | P | P |
| | 54 | P | P | P | P | P | P | P |

TABLE 7

| | No. | The number of satisfactorily resist-pattern-formed samples 5/5(μm) | 10/10(μm) | The number of satisfactorily wiring-formed samples 5/5(μm) | 10/10(μm) |
|---|---|---|---|---|---|
| Examples | 31 | 32/32 | 32/32 | 32/32 | 32/32 |
| | 32 | 32/32 | 32/32 | 32/32 | 32/32 |
| | 33 | 32/32 | 32/32 | 32/32 | 32/32 |
| | 34 | 32/32 | 32/32 | 32/32 | 32/32 |
| | 35 | 32/32 | 32/32 | 32/32 | 32/32 |
| | 36 | 32/32 | 32/32 | 32/32 | 32/32 |
| | 37 | 32/32 | 32/32 | 32/32 | 32/32 |
| | 38 | 32/32 | 32/32 | 32/32 | 32/32 |
| | 39 | 32/32 | 32/32 | 32/32 | 32/32 |
| | 40 | 32/32 | 32/32 | 32/32 | 32/32 |
| Comparative Examples | 55 | 18/32 | 29/32 | 14/32 | 27/32 |
| | 56 | — | — | — | — |
| | 57 | 27/32 | 30/32 | 19/32 | 24/32 |
| | 58 | — | — | — | — |
| | 59 | 16/32 | 29/32 | 13/32 | 26/32 |
| | 60 | 16/32 | 29/32 | 13/32 | 26/32 |
| | 61 | 16/32 | 29/32 | 13/32 | 26/32 |
| | 62 | 16/32 | 29/32 | 13/32 | 26/32 |
| | 63 | 16/32 | 29/32 | 13/32 | 26/32 |
| | 64 | 16/32 | 29/32 | 13/32 | 26/32 |
| | 65 | — | — | — | — |
| | 66 | — | — | — | — |
| | 67 | — | — | — | — |
| | 68 | 16/32 | 29/32 | 13/32 | 26/32 |
| | 69 | 32/32 | 32/32 | 32/32 | 32/32 |
| | 70 | 32/32 | 32/32 | 32/32 | 32/32 |
| | 71 | 32/32 | 32/32 | 32/32 | 32/32 |
| | 72 | 32/32 | 32/32 | 32/32 | 32/32 |

TABLE 8

The number of samples having good PCT resistance

| | No. | Between wiring 106 and build-up layer 104 | Between insulating layer 104 and build-up layer 104 | Between wiring 106 and solder resist 109 | Between insulating layer 104 and solder resist 109 |
|---|---|---|---|---|---|
| Examples | 21 | 32/32 | 32/32 | 0/32 | 32/32 |
| | 22 | 32/32 | 32/32 | 0/32 | 32/32 |
| | 23 | 32/32 | 32/32 | 0/32 | 32/32 |
| | 24 | 32/32 | 32/32 | 0/32 | 32/32 |
| | 25 | 32/32 | 32/32 | 32/32 | 32/32 |
| | 26 | 32/32 | 32/32 | 32/32 | 32/32 |
| | 27 | 32/32 | 32/32 | 32/32 | 32/32 |
| | 28 | 32/32 | 32/32 | 32/32 | 32/32 |
| | 29 | 32/32 | 32/32 | 32/32 | 32/32 |
| | 30 | 32/32 | 32/32 | 32/32 | 32/32 |

TABLE 8-continued

| | | The number of samples having good PCT resistance | | | |
|---|---|---|---|---|---|
| | No. | Between wiring 106 and build-up layer 104 | Between insulating layer 104 and build-up layer 104 | Between wiring 106 and solder resist 109 | Between insulating layer 104 and solder resist 109 |
| Comparative Examples | 37 | 0/32 | 29/32 | 0/32 | 29/32 |
| | 38 | 6/32 | 32/32 | 0/32 | 32/32 |
| | 39 | 32/32 | 8/32 | 0/32 | 11/32 |
| | 40 | — | — | — | — |
| | 41 | 0/32 | 29/32 | 0/32 | 29/32 |
| | 42 | 0/32 | 29/32 | 0/32 | 29/32 |
| | 43 | 0/32 | 28/32 | 0/32 | 29/32 |
| | 44 | 0/32 | 29/32 | 0/32 | 29/32 |
| | 45 | 0/32 | 29/32 | 0/32 | 29/32 |
| | 46 | 0/32 | 29/32 | 0/32 | 29/32 |
| | 47 | — | — | — | — |
| | 48 | — | — | — | — |
| | 49 | — | — | — | — |
| | 50 | 0/32 | 29/32 | 0/32 | 29/32 |
| | 51 | 32/32 | 32/32 | 0/32 | 32/32 |
| | 52 | 32/32 | 32/32 | 0/32 | 32/32 |
| | 53 | 32/32 | 32/32 | 0/32 | 32/32 |
| | 54 | 32/32 | 32/32 | 0/32 | 32/32 |

TABLE 9

| | | The number of generated pink rings | | | |
|---|---|---|---|---|---|
| | No. | Room temperature for 2 h | Room temperature for 76 h | Room temperature for 168 h | 150° C. for 1 h |
| Examples | 41 | 0/20 | 2/20 | 4/20 | 20/20 |
| | 42 | 0/20 | 0/20 | 0/20 | 0/20 |
| | 43 | 0/20 | 0/20 | 0/20 | 0/20 |
| | 44 | 0/20 | 0/20 | 0/20 | 0/20 |
| | 45 | 0/20 | 0/20 | 0/20 | 0/20 |
| | 46 | 0/20 | 0/20 | 0/20 | 0/20 |
| | 47 | 0/20 | 0/20 | 0/20 | 0/20 |
| | 48 | 0/20 | 0/20 | 0/20 | 0/20 |
| | 49 | 0/20 | 0/20 | 0/20 | 0/20 |
| | 50 | 0/20 | 0/20 | 0/20 | 0/20 |
| Comparative Examples | 73 | — | — | — | — |
| | 74 | 0/20 | 2/20 | 4/20 | 20/20 |
| | 75 | 0/20 | 2/20 | 4/20 | 20/20 |
| | 76 | 0/20 | 0/20 | 0/20 | 10 |
| | 77 | — | — | — | — |
| | 78 | — | — | — | — |
| | 79 | — | — | — | — |
| | 80 | — | — | — | — |
| | 81 | — | — | — | — |
| | 82 | — | — | — | — |
| | 83 | 0/20 | 0/20 | 0/20 | 0/20 |
| | 84 | 0/20 | 0/20 | 0/20 | 0/20 |
| | 85 | 0/20 | 0/20 | 0/20 | 0/20 |
| | 86 | — | — | — | — |
| | 87 | 0/20 | 2/20 | 4/20 | 20/20 |
| | 88 | 0/20 | 0/20 | 0/20 | 0/20 |
| | 89 | 0/20 | 0/20 | 0/20 | 0/20 |
| | 90 | 0/20 | 0/20 | 0/20 | 0/20 |

As illustrated in Table 1, the reliability of the semiconductor packages produced in Examples 1 to 10 in the invention was very good.

As illustrated in Table 4, the electrolytic copper foil pieces formed in Examples 11 to 20 each had, in the front surface thereof, fine, dense and even non-needle irregularities having Rz of 100 nm or less, so that glossiness was restrained on the copper surface. Furthermore, as shown in Table 2, after the boards were each allowed to stand still at 150° C. for 240 hours, the bonding strength (peel strength) onto the build-up layer was improved by the coupling treatment and the azole treatment, and was further improved by the pyrazole treatment so as to be good. Moreover, even when the boards were each subjected to the electroless tin plating treatment, the strength was further improved by the heating treatment so as to be good.

After the boards were each allowed to stand still at 150° C. for 240 hours and stand still under the PCT conditions, respectively, the bonding strength (peel strength) onto the solder resist was further improved by the electroless tin plating treatment so as to be good.

As shown in Tables 3-1 to 3-3, from the surface-treatment-applied surfaces of the electrolytic copper foil pieces formed in Examples 11 to 20, the various ions were not detected. Thus, the cleanliness of the surfaces was good.

As shown in Tables 5 and 6, the insulating reliability between the wiring pieces in each of the evaluation boards produced in Examples 21 to 30 was very good about each of the case where the L/S was 5 μm/5 μm and the case where the L/S was 10 μm/10 μm. As shown in Table 6, the resist pattern formation success ratio of each of the evaluation boards produced in Examples 31 to 40 was very good about each of the case where the L/S was 5 μm/5 μm and the case where the L/S was 10 μm/10 μm. As shown in Table 7, the wiring formation success ratio of each of the evaluation boards produced in Examples 31 to 40 was very good about each of the case where the L/S was 5 μm/5 μm and the case where the L/S was 10 μm/10 μm. As shown in Table 8, the PCT resistance of the evaluation boards of each of Examples 21 to 30 was very good by conducting the electroless thin plating treatment between one of the build-up layers and the wirings, between the other build-up layer and the insulating layer, between the solder resist and the wirings, and between the solder resist and the insulating layer. As shown in Table 9, in Examples 41 to 50, no pink ring was generated with regard to the evaluation boards wherein the coupling treatment, the azole treatment and the metal-formation treatment were conducted after the irregularity-formation treatment, so that the boards were very good.

By contrast, as shown in Comparative Example 19 to 36, in the case of using the conventional surface treatment methods, the surfaces having Rz of 100 nm or less became poorer in the bonding strengths (peel strengths) onto the insulating resins (the build-up resin and the solder resist) after the surfaces were allowed to stand still at 150° C. for 240 hours and stand still under the PCT conditions than the invention. As shown in Comparative Examples 1 to 90, the surfaces thereof were unable to satisfy all properties related to the smoothness, the adhesiveness, the copper surface shape, the copper surface glossiness, the copper surface cleanliness, the insulation reliability between their wiring pieces, the resist pattern formation, the wiring formation and the PCT resistance.

Therefore, according to the copper surface treatment method of the invention, dense, even and fine irregularities which are not in any needle form can be formed in a copper surface; thus, the bonding strength between the copper surface and an insulating layer can be improved. As a result thereof, the following can be produced: wiring boards and semiconductor chip mounting boards excellent in insulation reliability between wiring pieces and fine wiring forming performance, and further semiconductor packages excellent in reflow resistance and temperature cycle property.

In light of the above description, it is evident that broad and different embodiments can be carried out without disobeying the spirit and the scope of the invention. Except for the matter that the invention is restricted by the claims, the invention is never limited to any specified embodiment thereof.

The invention claimed is:

1. A copper surface treatment method, comprising:
a first step of forming, on a copper surface, a nobler metal than the copper discretely,
a second step, subsequent to the first step, of forming copper oxide on the copper surface by oxidation with an alkaline solution containing an oxidizing agent,
a next third step of dissolving the copper oxide so as to be removed, thereby forming irregularities on the copper surface, and
a fourth step of subjecting the copper surface to a treatment for improving the bonding strength thereof after the third step, wherein the fourth step includes at least one treatment selected from the group consisting of a treatment for forming a baser metal than copper onto the copper surface and a treatment with a solution containing an azole compound.

2. The surface treatment method according to claim 1, wherein the fourth step further includes a treatment with a coupling agent.

3. The surface treatment method according to claim 1, wherein the fourth step includes both of the treatment for forming the baser metal than copper onto the copper surface, and the treatment with the solution containing the azole compound.

4. The surface treatment method according to claim 1, wherein the fourth step includes a heating treatment for performing heating to a temperature of 90° C. or higher after the treatment for forming the baser metal than copper onto the copper surface.

5. The surface treatment method according to claim 1, wherein the oxidizing agent is one or more selected from the group consisting of chlorates, chlorites, hypochlorites, perchlorates, peroxodisulfates and permanganates.

6. The surface treatment method according to claim 1, wherein the nobler metal than copper is a metal selected from the group consisting of gold, silver, platinum, palladium, rhodium, rhenium, ruthenium, osmium and iridium, and alloys each containing one or more of these metals.

7. The surface treatment method according to claim 1, wherein the formation amount of the nobler metal than copper is 0.001 $\mu mol/dm^2$ or more, and 5 $\mu mol/dm^2$ or less.

8. The surface treatment method according to claim 1, wherein the dissolution of the copper oxide in the third step is attained by use of an acidic solution containing one or more selected from the group consisting of inorganic acids and organic acids.

9. The surface treatment method according to claim 1, wherein the roughness Rz of the copper surface after the third step is 1 nm or more and 1000 nm or less.

10. A copper having a surface treated with a surface treatment method according to claim 1.

11. A wiring board having a copper wiring, wherein a surface of the copper wiring is treated with a surface treatment method according to claim 1.

12. A copper having a surface treated with a surface treatment method according to claim 2.

13. A copper having a surface treated with a surface treatment method according to claim 3.

14. A copper having a surface treated with a surface treatment method according to claim 4.

15. A wiring board having a copper wiring, wherein a surface of the copper wiring is treated with a surface treatment method according to claim 2.

16. A wiring board having a copper wiring, wherein a surface of the copper wiring is treated with a surface treatment method according to claim 3.

17. A wiring board having a copper wiring, wherein a surface of the copper wiring is treated with a surface treatment method according to claim 4.

18. The surface treatment method according to claim 1, wherein the third step of dissolving the copper oxide so as to be removed forms irregularities not in the form of needles on the copper surface.

19. A copper having a surface treated with a surface treatment method according to claim 18.

20. A wiring board having a copper wiring, wherein a surface of the copper wiring is treated with a surface treatment method according to claim 18.

* * * * *